US012573439B2

(12) United States Patent
Okamoto et al.

(10) Patent No.: US 12,573,439 B2
(45) Date of Patent: Mar. 10, 2026

(54) SEMICONDUCTOR DEVICE AND OPERATION METHOD THEREOF WITH NON-POLARIZING READING OPERATION

(71) Applicant: Semiconductor Energy Laboratory Co., Ltd., Kanagawa-ken (JP)

(72) Inventors: Yuki Okamoto, Ebina (JP); Tatsuya Onuki, Atsugi (JP); Kazuma Furutani, Atsugi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 258 days.

(21) Appl. No.: 18/032,410

(22) PCT Filed: Oct. 8, 2021

(86) PCT No.: PCT/IB2021/059225
§ 371 (c)(1),
(2) Date: Apr. 18, 2023

(87) PCT Pub. No.: WO2022/084785
PCT Pub. Date: Apr. 28, 2022

(65) Prior Publication Data
US 2024/0029774 A1 Jan. 25, 2024

(30) Foreign Application Priority Data
Oct. 20, 2020 (JP) ................................. 2020-176315

(51) Int. Cl.
*G11C 11/22* (2006.01)
*H10B 53/30* (2023.01)

(52) U.S. Cl.
CPC ........ *G11C 11/2273* (2013.01); *G11C 11/221* (2013.01); *H10B 53/30* (2023.02)

(58) Field of Classification Search
CPC ... G11C 11/2273; G11C 11/221; H10B 53/30; H10D 1/682; H10D 30/6734; H10D 30/6755; H10D 30/6757
See application file for complete search history.

(56) References Cited

U.S. PATENT DOCUMENTS 5,835,400 A   11/1998  Jeon et al.
6,901,002 B2   5/2005  Matsushita
(Continued)

FOREIGN PATENT DOCUMENTS

JP      07-093968 A    4/1995
JP      10-125078 A    5/1998
(Continued)

OTHER PUBLICATIONS

Toriumi, A. "Ferroelectricity of HfO2 thin film," Oyobuturi , Sep. 10, 2019, vol. 88, No. 9, pp. 586-596, JSAP (The Japan Society of Applied Physics), English translation, pp. 1-43.
(Continued)

*Primary Examiner* — Jerome Leboeuf
(74) *Attorney, Agent, or Firm* — Husch Blackwell LLP

(57) ABSTRACT

In a memory cell including a ferroelectric capacitor, data is read without data destruction. When the reading operation is performed in the memory cell including the ferroelectric capacitor, voltage applied to the counter electrode of the ferroelectric capacitor is gradually increased so as not to cause polarization destruction in the ferroelectric capacitor. A first reading operation from the memory cell is performed by applying a first voltage that does not cause polarization inversion of the ferroelectric layer to the capacitor, a second reading operation from the memory cell is performed by applying a second voltage that does not cause polarization inversion of the ferroelectric layer to the capacitor, and the second voltage is higher than the first voltage.

11 Claims, 28 Drawing Sheets

(56)                     References Cited

U.S. PATENT DOCUMENTS

| | | | | |
|---|---|---|---|---|
| 2002/0034092 A1* | 3/2002 | Choi | .................... | G11C 5/147 |
| | | | | 365/145 |
| 2018/0061469 A1* | 3/2018 | Derner | .................. | H10B 53/20 |
| 2019/0326296 A1* | 10/2019 | Wang | .................... | H10B 12/50 |
| 2023/0012093 A1* | 1/2023 | Kakushima | ......... | G11C 11/2259 |

FOREIGN PATENT DOCUMENTS

| | | |
|---|---|---|
| JP | 2004-241483 A | 8/2004 |
| JP | 2006-032526 A | 2/2006 |
| KR | 10-0206713 | 7/1999 |

OTHER PUBLICATIONS

International Search Report (Application No. PCT/IB2021/059225) Dated Dec. 21, 2021.

Written Opinion (Application No. PCT/IB2021/059225) Dated Dec. 21, 2021.

Toriumi, A. "Ferroelectricity of HfO2 thin film," Oyobuturi , Sep. 10, 2019, vol. 88, No. 9, pp. 586-596, JSAP (The Japan Society of Applied Physics).

Okuno, J. et al., "SoC compatible 1T1C FeRAM memory array based on ferroelectric Hf0.5Zr0.502," 2020 Symposium On VLSI Technology: Digest of Technical Papers, Jun. 16, 2020, p. 2pages.

Fan, Z. et al., "Ferroelectric HfO2-based materials for next-generation ferroelectric memories," Journal of Advanced Dielectrics, May 3, 2016, vol. 6, No. 2, pp. 1630003-1-1630003-11.

Boscke, T. et al., "Ferroelectricity in hafnium oxide thin films," Appl. Phys. Lett. (Applied Physics Letters), Sep. 8, 2011, vol. 99, No. 10, pp. 102903-1-102903-3.

* cited by examiner

FIG. 10

FIG. 21A
Intermediate state
New crystalline phase
| Amorphous | Crystalline | Crystal |
|---|---|---|
| ·completely amorphous | ·CAAC<br>·nc<br>·CAC<br><br>excluding single crystal and poly crystal | ·single crystal<br>·poly crystal |
FIG. 21B
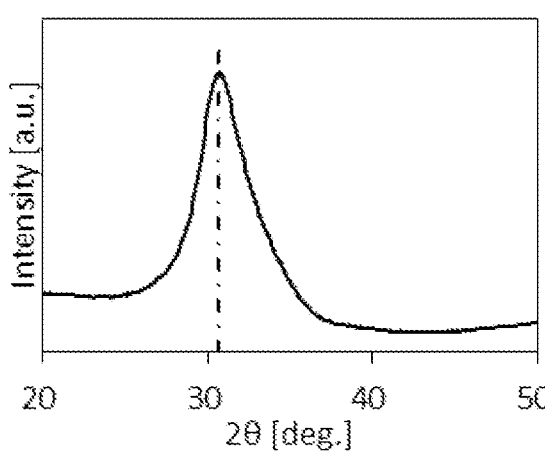
FIG. 21C
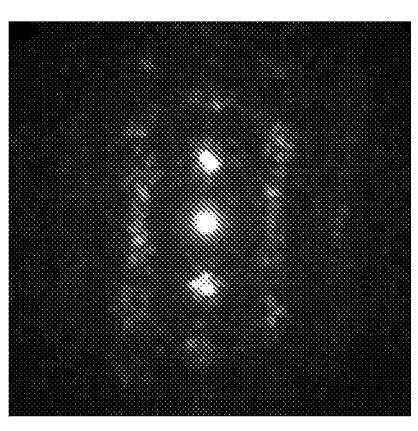
5nm⁻¹

FIG. 22A
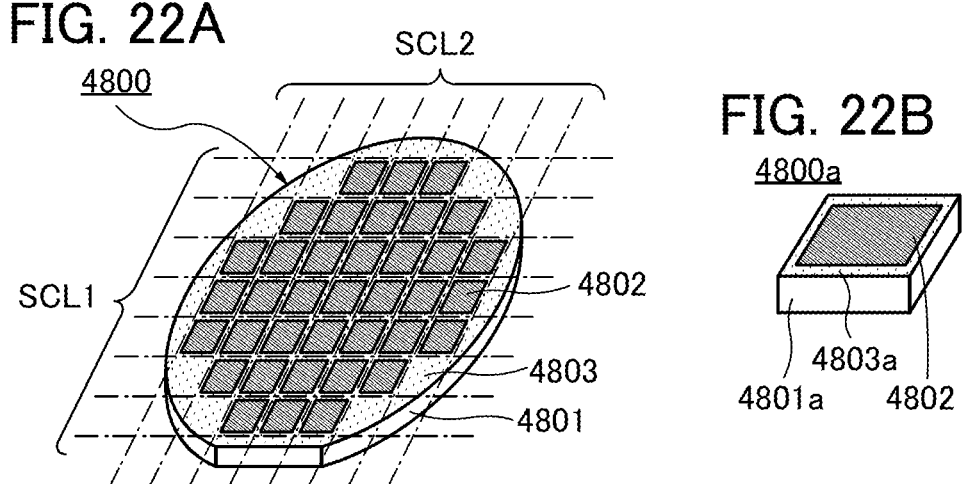
FIG. 22B
FIG. 22C
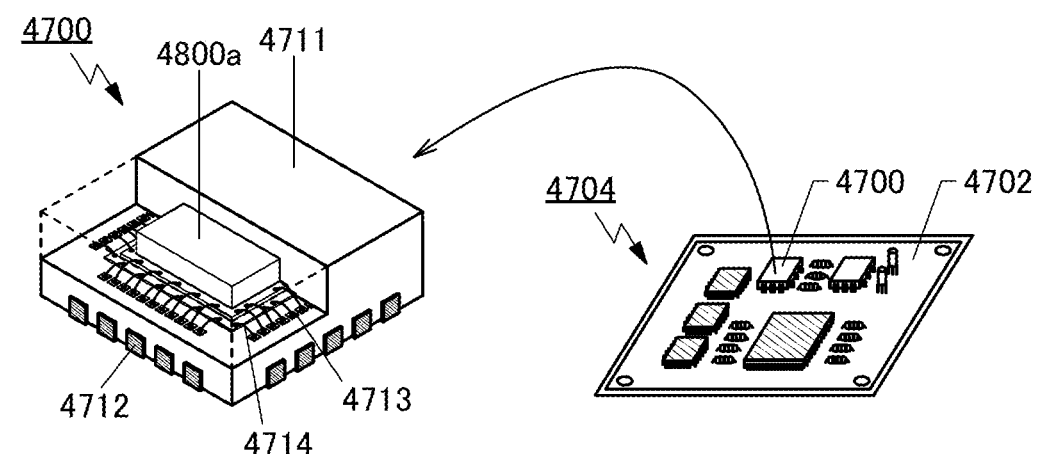
FIG. 22D
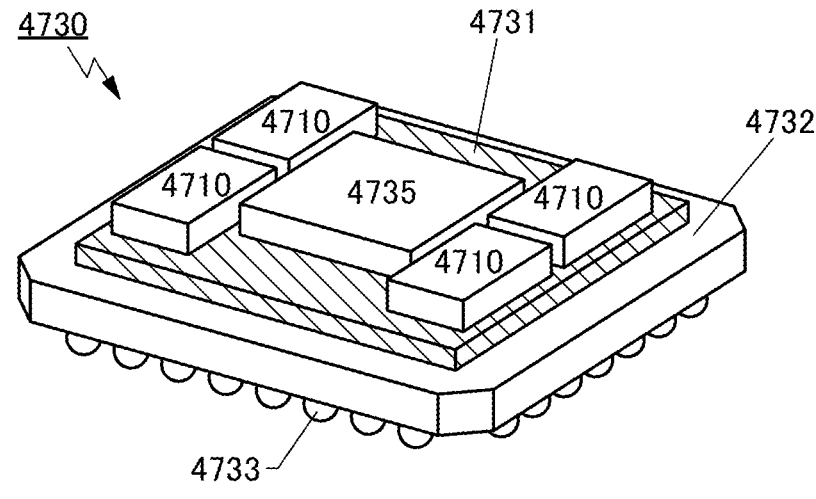

SEMICONDUCTOR DEVICE AND OPERATION METHOD THEREOF WITH NON-POLARIZING READING OPERATION

This application is a 371 of international application PCT/IB2021/059225 filed on Oct. 8, 2021, which is incorporated herein by reference.

TECHNICAL FIELD

One embodiment of the present invention relates to a driving method of a semiconductor device, a semiconductor device, and the like.

Note that one embodiment of the present invention is not limited to the above technical field. Examples of the technical field of one embodiment of the present invention disclosed in this specification and the like include a semiconductor device, an imaging device, a display device, a light-emitting device, a power storage device, a memory device, a display system, an electronic device, a lighting device, an input device, an input/output device, a driving method thereof, and a manufacturing method thereof. Note that a semiconductor device means any device that utilizes semiconductor characteristics, and a memory device means a semiconductor device.

BACKGROUND ART

In recent years, semiconductor devices have been developed, and LSIs, CPUs, memories, and the like are mainly used as the semiconductor devices. A CPU is an assembly of semiconductor elements; the CPU includes a semiconductor integrated circuit (including at least a transistor and a memory) formed into a chip by processing a semiconductor wafer, and is provided with an electrode that is a connection terminal.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is used in a wide range of electronic devices such as an integrated circuit (IC) and an image display device (also simply referred to as a display device). As semiconductor thin films which can be used for transistors, a silicon-based semiconductor material, an oxide semiconductor, and the like are known.

As described in Non-Patent Document 1, a memory cell using a ferroelectric is actively researched and developed. For the next-generation ferroelectric memories, researches on hafnium oxide such as a research on ferroelectric $HfO_2$-based materials (Non-Patent Document 2), a research on ferroelectricity of a hafnium oxide thin film (Non-Patent Document 3), and a research on ferroelectricity of a $HfO_2$ thin film (Non-Patent Document 4) have been actively carried out.

REFERENCES

Non-Patent Documents

[Non-Patent Document 1] T. S. Boescke et al., "Ferro-electricity in hafnium oxide thin films", APL99, 2011.

[Non-Patent Document 2] Zhen Fan et al., "Ferroelectric HfO2-based materials for next-generation ferroelectric memories", *Journal of Advanced Dielectrics*, Vol. 6, No. 2, 2016.

[Non-Patent Document 3] Jun Okuno et al., "SoC compatible 1T1C FeRAM memory array based on ferro-electric Hf0.5Zr0.5O2", VLSI 2020.

[Non-Patent Document 4] Akira Toriumi, "Ferroelectric properties of thin HfO2 films", *The Japan Society of Applied Physics*, VOl. 88, No. 9, 2019.

SUMMARY OF THE INVENTION

Problems to be Solved by the Invention

In a memory cell including a ferroelectric, a data reading operation is performed depending on whether polarization inversion of the ferroelectric occurs or not. In this case, data held in the memory cell is inverted when the data reading operation is performed. That is, the memory cell including the ferroelectric performs destructive reading. In a memory cell including a ferroelectric, which performs destructive reading, a data write-back operation is needed every time data is read. A high voltage needs to be applied to the ferroelectric in the data write-back operation, which might cause an increase in power consumption or the like.

An object of one embodiment of the present invention is to provide a semiconductor device capable of reading data without destructing the data and a driving method thereof. Another object of one embodiment of the present invention is to provide a semiconductor device with low power consumption and a driving method thereof. Another object of one embodiment of the present invention is to provide a highly reliable semiconductor device and a driving method thereof. Another object of one embodiment of the present invention is to provide a novel semiconductor device and a driving method thereof.

Note that the objects of one embodiment of the present invention are not limited to the objects listed above. The objects listed above do not preclude the existence of other objects. Note that the other objects are objects that are not described in this section and will be described below. The objects that are not described in this section are derived from the description of the specification, the drawings, and the like and can be extracted as appropriate from the description by those skilled in the art. Note that one embodiment of the present invention is to solve at least one of the objects listed above and/or the other objects.

Means for Solving the Problems

One embodiment of the present invention is a driving method of a semiconductor device including a memory cell including a capacitor including a ferroelectric layer between a first electrode and a second electrode, in which a first reading operation of data from the memory cell is performed by applying a first voltage that does not cause polarization inversion of the ferroelectric layer to the capacitor, a second reading operation of data from the memory cell is performed by applying a second voltage that does not cause polarization inversion of the ferroelectric layer to the capacitor, and the second voltage is higher than the first voltage.

Another embodiment of the present invention is a driving method of a semiconductor device including a memory cell including a capacitor including a ferroelectric layer between a first electrode and a second electrode, in which a first reading operation of data from the memory cell is performed by applying a first voltage that does not cause polarization inversion of the ferroelectric layer to the capacitor, a second reading operation of data from the memory cell is performed by applying a second voltage that does not cause polarization inversion of the ferroelectric layer to the capacitor, the second voltage is higher than the first voltage, and the first voltage is higher than a voltage that sets polarization of the ferroelectric layer to 0.

The driving method of the semiconductor device of one embodiment of the present invention is preferably as follows: the memory cell includes a transistor; a first read voltage which is read to a bit line through the transistor in the first reading operation is compared with a first reference voltage; a second read voltage which is read to the bit line through the transistor in the second reading operation is compared with a second reference voltage; and the second reference voltage is higher than the first reference voltage.

The driving method of the semiconductor device of one embodiment of the present invention is preferably as follows: a reference memory cell is included; and a first read voltage which is read to a bit line in the first reading operation and a second read voltage which is read to the bit line in the second reading operation are compared with a read voltage which is read from the reference memory cell.

In the driving method of the semiconductor device of one embodiment of the present invention, the transistor preferably includes an oxide semiconductor in its channel.

In the driving method of the semiconductor device of one embodiment of the present invention, the ferroelectric layer preferably includes hafnium zirconium oxide or any of metal nitrides belonging to Group 13 to Group 15.

Note that other embodiments of the present invention are shown in the description of the following embodiments and the drawings.

Effect of the Invention

According to one embodiment of the present invention, a semiconductor device capable of reading data without data destruction and a driving method thereof can be provided. Alternatively, according to one embodiment of the present invention, a semiconductor device with low power consumption and a driving method thereof can be provided. Alternatively, according to one embodiment of the present invention, a highly reliable semiconductor device and a driving method thereof can be provided. Alternatively, according to one embodiment of the present invention, a novel semiconductor device and a driving method thereof can be provided.

Note that the effects of one embodiment of the present invention are not limited to the effects listed above. The effects listed above do not preclude the existence of other effects. Note that the other effects are effects that are not described in this section and will be described below. The effects that are not described in this section are derived from the description of the specification, the drawings, and the like and can be extracted as appropriate from the description by those skilled in the art. Note that one embodiment of the present invention has at least one of the effects listed above and/or the other effects. Accordingly, depending on the case, one embodiment of the present invention does not have the effects listed above in some cases.

BRIEF DESCRIPTION OF THE DRAWINGS

FIG. 10 is a diagram showing a configuration example of a semiconductor device.

FIG. 21A is a diagram showing classifications of crystal structures of IGZO, FIG. 21B is a diagram showing an XRD spectrum of crystalline IGZO, and FIG. 21C is a diagram showing a nanobeam electron diffraction pattern of the crystalline IGZO.

FIG. 22A is a perspective view illustrating an example of a semiconductor wafer. FIG. 22B is a perspective view illustrating an example of a chip. FIG. 22C and FIG. 22D are perspective views each illustrating an example of an electronic component.

FIG. 28 is a graph showing a configuration example of a semiconductor device.

MODE FOR CARRYING OUT THE INVENTION

Figure 1A:
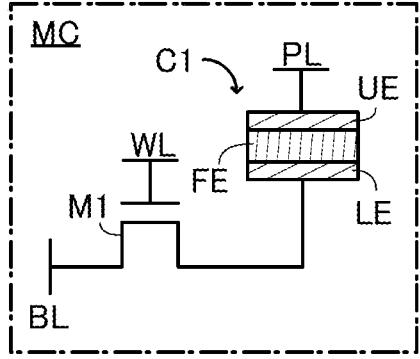
FIG. 1A and FIG. 1B are diagrams each showing a configuration example of a semiconductor device.

Hereinafter, embodiments are described with reference to the drawings. Note that the embodiments can be implemented with many different modes, and it is readily understood by those skilled in the art that modes and details thereof can be changed in various ways without departing from the spirit and scope thereof. Thus, the present invention should not be construed as being limited to the following description of the embodiments.

In addition, ordinal numbers such as "first", "second", and "third" in this specification and the like are used to avoid confusion among components. Thus, the ordinal numbers do not limit the number of components. Furthermore, the ordinal numbers do not limit the order of components. Furthermore, in this specification and the like, for example, a "first" component in one embodiment can be referred to as a "second" component in other embodiments or claims. For another example, a "first" component in one embodiment in this specification and the like can be omitted in other embodiments or the claims.

Note that in the drawings, the same elements, elements having similar functions, elements formed of the same material, elements formed at the same time, or the like are sometimes denoted by the same reference numerals, and repeated description thereof is omitted in some cases.

In this specification and the like, a metal oxide is an oxide of a metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an OS FET or an OS transistor is mentioned, it can also be referred to as a transistor including a metal oxide or an oxide semiconductor.

Embodiment 1

In this embodiment, a semiconductor device of one embodiment of the present invention and a driving method thereof will be described.

One embodiment of the present invention relates to a semiconductor device including a memory cell. A semiconductor device including a memory cell can be referred to as a memory device. The memory cell has a function of retaining data. Specifically, the memory cell includes a capacitor. The capacitor includes a ferroelectric layer between a first electrode and a second electrode. The capacitor including the ferroelectric layer is sometimes referred to as a ferroelectric capacitor.

In the ferroelectric capacitor, when a voltage (electric field) is applied between the electrodes, the polarization direction and the polarization amount of the ferroelectric layer change in accordance with the direction and the amount of the applied voltage. In the memory cell including the ferroelectric capacitor, a signal (data) is stored (written) by utilizing the change in the polarization state of the ferroelectric layer. Even when the voltage between the electrodes is made zero, polarization remains (remnant polarization) in the ferroelectric layer of the ferroelectric capacitor. A voltage for inverting the polarization (polarization inversion) is applied to rewrite the polarization (such a voltage is also referred to as polarization inversion voltage).

When a voltage that exceeds the polarization inversion voltage is applied to the ferroelectric capacitor in data reading from the memory cell, the polarization state of the ferroelectric layer (the polarization direction of the remnant polarization) changes, which requires an operation for returning the polarization state to the original state. That is, data refresh is required when data is read from the ferroelectric capacitor by applying a voltage that exceeds the polarization inversion voltage to the ferroelectric capacitor. In other words, a data reading operation from the memory cell is performed by destructive reading in the case where data is read by applying a voltage that exceeds the polarization inversion voltage to the ferroelectric capacitor.

One embodiment of the present invention is a driving method of a semiconductor device in which data can be read from a memory cell including a ferroelectric capacitor without performing destructive reading.

Specifically, when the reading operation is performed in the memory cell including the ferroelectric capacitor, a voltage applied to the counter electrode of the ferroelectric capacitor is gradually increased so as not to cause polarization destruction in the ferroelectric capacitor. A data reading operation from the memory cell is performed by applying a voltage that does not cause polarization inversion of the ferroelectric layer to the ferroelectric capacitor. In a subsequent data reading operation from the memory cell of this driving method, a voltage higher than that applied in the previous reading operation is applied to the ferroelectric capacitor as a voltage that does not cause polarization inversion of the ferroelectric layer.

In one embodiment of the present invention, a voltage that does not exceed the polarization inversion voltage is applied to the ferroelectric capacitor in the data reading operation, so that the polarization direction of the remnant polarization in the ferroelectric layer can be maintained before and after the data reading. Thus, the semiconductor device of one embodiment of the present invention can retain data for a long time. Accordingly, the frequency of refresh (data rewriting to the memory cell) can be reduced, leading to a reduction in power consumption of the semiconductor device of one embodiment of the present invention. A ferroelectric capacitor in which a ferroelectric layer is provided between electrodes can retain data for a long time without a structure for increasing capacity, e.g., a trench structure. Accordingly, a semiconductor device which is easily fabricated can be obtained.

FIG. 1A is a circuit diagram of a memory cell MC including a ferroelectric capacitor. Note that the memory cell MC is also referred to as a cell. The memory cell MC includes a transistor M1 and a ferroelectric capacitor C1.

The ferroelectric capacitor C1 is schematically illustrated as a capacitor including a ferroelectric layer FE between an electrode UE and an electrode LE. The reading operation of the memory cell MC is performed, for example, as follows: a wiring BL (also referred to as a bit line) connected to the transistor M1 is set to a predetermined potential to be brought into an electrically floating state; the transistor M1 is brought into a conduction (on) state by the control of a wiring WL (also referred to as a word line); and a voltage of a wiring PL (also referred to as a plate line) on the electrode UE side is changed. Then, capacitive coupling of the ferroelectric capacitor changes the potential of the wiring BL. This change in the potential of the wiring BL depends on the polarization state of the ferroelectric layer of the ferroelectric capacitor; thus, a potential corresponding to written data can be read out to the wiring BL.

Figure 1B:
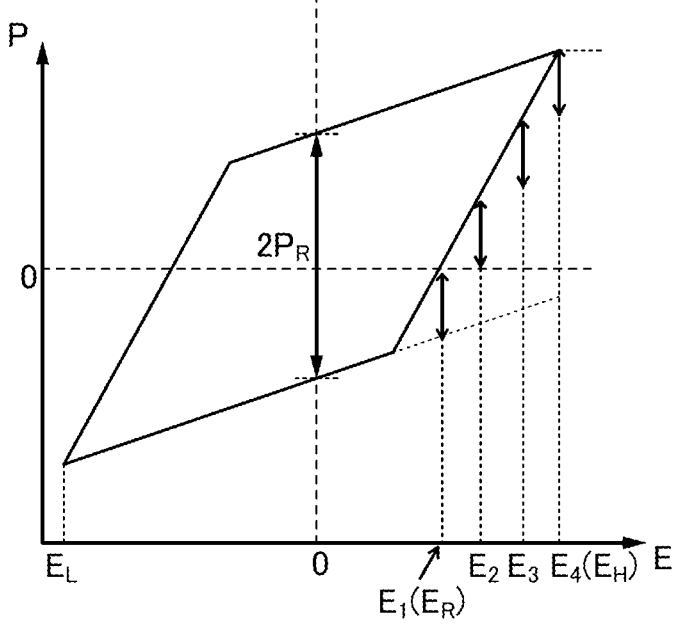

FIG. 1B is a graph showing a polarization magnitude (polarization amount) corresponding to electric fields applied to the ferroelectric layer FE. Note that, for easy understanding, change in polarization corresponding to the electric field of the ferroelectric layer FE is indicated by a straight line in FIG. 1B, however, measurement data should be represented by a curve. The horizontal axis in FIG. 1B represents an electric field E applied to the ferroelectric layer. The vertical axis represents polarization P of the ferroelectric layer. A difference between the positive polarization and the negative polarization at an electric field of 0 is indicated by $2P_R$.

The polarization in the ferroelectric layer increases as the electric field applied to the ferroelectric layer FE increased. When the electric field applied to the ferroelectric layer is decreased after an electric field $E_H$ is applied to the ferroelectric layer, positive electric charges are pulled to one electrode side of the capacitor and negative electric charges are pulled to the other electrode side of the capacitor; thus, positive polarization remains when the electric field becomes 0. The polarization in the ferroelectric layer decreases as the electric field applied to the ferroelectric layer FE decreases. When the electric field applied to the ferroelectric layer is increased after an electric field $E_L$ is applied to the ferroelectric layer, positive electric charges are pulled to the other electrode side of the capacitor C1 and negative electric charges are pulled to the one electrode side of the capacitor; thus, negative polarization remains when the electric field becomes 0. Voltages for applying the electric field $E_H$ and the electric field $E_L$ to the ferroelectric layer FE can be referred to as polarization inversion voltage. When the polarization inversion voltage is applied to the ferroelectric capacitor C1, data can be written to the memory cell MC.

When a voltage that exceeds the polarization inversion voltage is applied to the capacitor C1 in data reading form the memory cell MC, the polarization state of the ferroelectric layer FE (the polarization direction of the remnant polarization) changes, which requires an operation for returning the polarization state to the original state. That is, data refresh is required when data is read from the memory cell MC by applying a voltage that exceeds the polarization inversion voltage to the capacitor C1.

In one embodiment of the present invention, a voltage that does not exceed the polarization inversion voltage is applied to the ferroelectric capacitor C1 when data is read from the memory cell MC, so that the polarization direction of the remnant polarization in the ferroelectric layer FE can be maintained. Specifically, when data is read from the memory cell MC, the electric field is gradually increased such that the polarization direction of the remnant polarization in the ferroelectric layer FE is maintained. More specifically, electric fields $E_1$ to $E_4$ that do not exceed the electric field $E_H$ indicated in FIG. 1B as an example are applied in order at each reading operation. A voltage for applying the electric fields $E_1$ to $E_4$ to the ferroelectric layer FE can be referred to as a voltage that does not cause polarization inversion. In one embodiment of the present invention, data can be read from the memory cell MC without performing so called destructive reading.

Note that in the case where the polarization direction of the remnant polarization in the ferroelectric layer FE is inverted by repeated reading operation from the ferroelectric capacitor, it is preferable to perform data refresh, an operation for rewriting data.

Figure 2A:
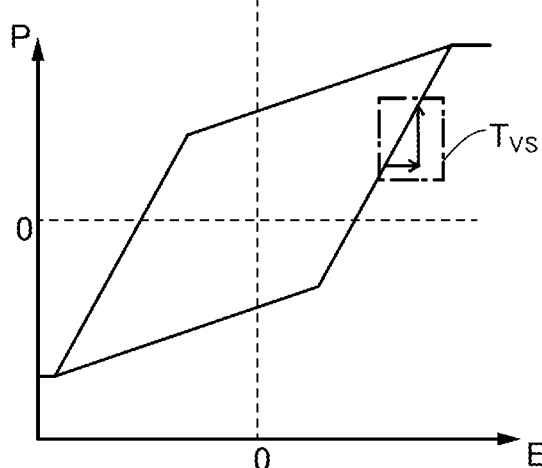
FIG. 2A, FIG. 2B, and FIG. 2C are diagrams each showing a configuration example of a semiconductor device.

In the above-described reading operation of one embodiment of the present invention, when different electric fields are applied, polarization magnitude of each electric field preferably differs in a graph shown in FIG. 1B indicating the polarization magnitude (polarization amount) corresponding to the electric fields applied to the ferroelectric layer FE. Furthermore, in the reading operation of one embodiment of the present invention, when different electric fields are applied, the amount of change in each polarization preferably allows data reading in the graph shown in FIG. 1B indicating the polarization magnitude (polarization amount) corresponding to the electric fields applied to the ferroelectric layer FE. For example, as shown in FIG. 2A, $T_{VS}$ (slope), a degree of change in polarization with respect to change in electric field, preferably has a positive slope in the shape of the graph indicating the polarization magnitude (polarization amount) corresponding to the electric fields applied to the ferroelectric layer FE. In order that the degree of change in polarization with respect to change in electric field can have a positive slope, a voltage for reading data from the memory cell MC in the reading operation is preferably higher than a voltage that sets the polarization in the ferroelectric layer FE to 0.

In addition, it is preferable that the amount of change in polarization not be greater than that in electric field. This structure enables small degree of change in remnant polarization at each reading operation in the case of performing the operation not for completely inverting the polarization direction of the remnant polarization in the ferroelectric layer FE but for partially inverting the polarization direction.

Figure 2B:
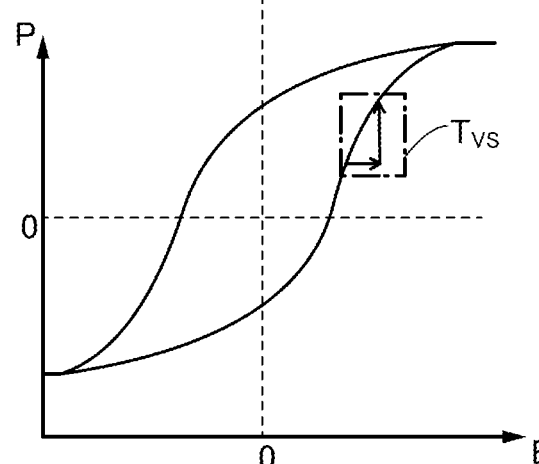
Figure 2C:
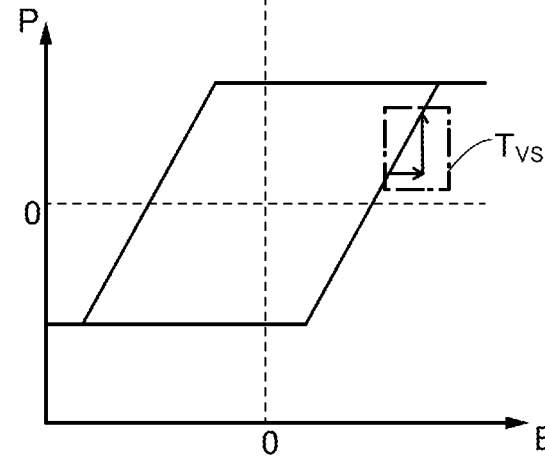

Note that an actual graph on the electric fields and polarization in the ferroelectric layer changes in a curved shape as shown in FIG. 2B. In this case, the slope of the tangent can be regarded as the above-described slope, $T_{VS}$. Note that, this also applies to the shape of a graph shown in FIG. 2C.

Figure 3A:
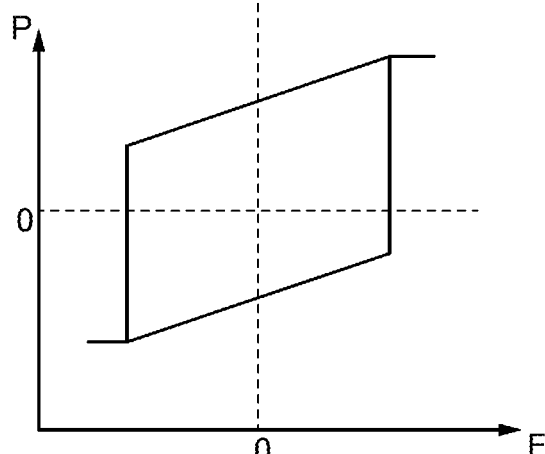
FIG. 3A and FIG. 3B are diagrams each showing a configuration example of a semiconductor device.
Figure 3B:
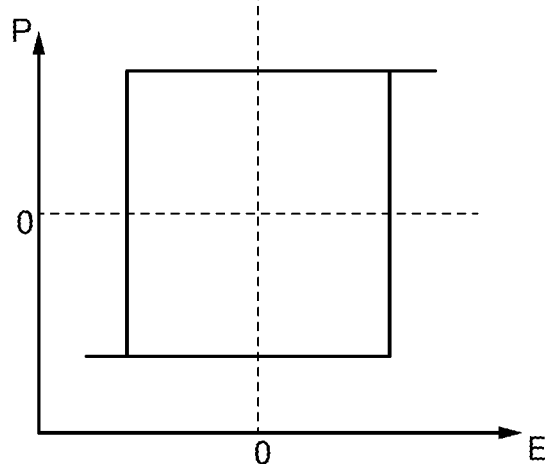

On the other hand, in the reading operation of one embodiment of the present invention, the shape of a graph shown in FIG. 3A indicating a polarization magnitude corresponding to electric fields is not preferable because a degree of change (slope) in polarization with respect to change in electric field has a positive slope and the amount of change in polarization is greater than that in electric field, leading to a steep slope. In these cases, the degree of change in polarization with respect to change in electric field is great, so that it becomes difficult to perform an operation for partially inverting the polarization direction of the remnant polarization in the ferroelectric layer FE. The description of FIG. 3A can apply to the shape of a graph shown in FIG. 3B.

Examples of a material that can have ferroelectricity and can be used for the ferroelectric layer FE include hafnium oxide, zirconium oxide, and cerium oxide. Examples of a material that can have ferroelectricity include a material obtained by adding an element J1 (the element J1 here is zirconium (Zr), silicon (Si), aluminum (Al), gadolinium (Gd), yttrium (Y), lanthanum (La), or strontium (Sr), for example) to hafnium oxide, and a material obtained by adding an element J2 (the element J2 here is hafnium (Hf), silicon (Si), aluminum (Al), gadolinium (Gd), yttrium (Y), lanthanum (La), or strontium (Sr), for example) to zirconium oxide. For example, hafnium zirconium oxide obtained by adding zirconium to hafnium oxide ($HfZrO_X$: X is a real number larger than 0) is preferable.

As the material that can have ferroelectricity, a piezoelectric ceramic having a perovskite structure such as lead titanate, barium strontium titanate (BST), strontium titanate, lead zirconate titanate (PZT), strontium bismuth tantalate (SBT), bismuth ferrite (BFO), or barium titanate may be used. The material that can have ferroelectricity can be, for example, a plurality of materials selected from the above-listed materials or a stacked-layer structure of a plurality of materials selected from the above-listed materials. Since the crystal structures (characteristics) of hafnium oxide, zirconium oxide, $HfZrO_X$, the material obtained by adding the element J1 to hafnium oxide, and the like can be changed depending on a variety of processes as well as the deposition conditions, a material that exhibits ferroelectricity is referred to not only as a ferroelectric but also as a material that can have ferroelectricity or a material that has ferroelectricity in this specification and the like.

Examples of the material that can have ferroelectricity include aluminum scandium nitride ($Al_{1-a}Sc_aN_b$ (a is a real number greater than 0 and less than 0.5, and b is 1 or an approximate value thereof)), an Al—Ga—Sc nitride, and a Ga—Sc nitride. Examples of the material that can have ferroelectricity also include a metal nitride containing an element M1, an element M2, and nitrogen. Here, the element M1 is one or more selected from aluminum (Al), gallium (Ga), indium (In), and the like. The element M2 is one or more selected from boron (B), scandium (Sc), yttrium (Y), lanthanum (La), cerium (Ce), neodymium (Nd), europium (Eu), titanium (Ti), zirconium (Zr), hafnium (Hf), vanadium (V), niobium (Nb), tantalum (Ta), chromium (Cr), and the like. Note that the atomic ratio of the element M1 to the element M2 can be set as appropriate. A metal oxide containing the element M1 and nitrogen has ferroelectricity in some cases even though not containing the element M2. Examples of the material that can have ferroelectricity also include a material obtained by adding an element M3 to the above-described metal nitride. Note that the element M3 is one or more selected from magnesium (Mg), calcium (Ca), strontium (Sr), zinc (Zn), cadmium (Cd), and the like. Here, the atomic ratio of the element M1 to the element M2 and the element M3 can be set as appropriate. Since the above-described metal nitride contains at least a Group 13 element and nitrogen that is a Group 15 element, the metal nitride is referred to as a ferroelectric of Group 13 to Group 15, a ferroelectric of a Group 13 nitride, or the like in some cases.

Among the materials used for the ferroelectric layer, $HfZrO_X$ is preferable because the material can have ferroelectricity even when processed into a thin film of several nanometers. Here, the thickness of the ferroelectric layer can be less than or equal to 100 nm, preferably less than or equal to 50 nm, further preferably less than or equal to 20 nm, still further preferably less than or equal to 10 nm (typically greater than or equal to 2 nm and less than or equal to 9 nm). With the ferroelectric layer that can be made to be a thin film, the semiconductor device combined with a miniaturized transistor can be obtained.

In the case where $HfZrO_X$ is used as the material that can have ferroelectricity, deposition is preferably performed by an atomic layer deposition (ALD) method, particularly a thermal ALD method. In the case where the material that can have ferroelectricity is deposited by a thermal ALD method, a material not containing hydrocarbon (also referred to as Hydro Carbon or HC) is suitably used as a precursor. In the case where the material that can have ferroelectricity contains one or both of hydrogen and carbon, crystallization of the material that can have ferroelectricity is hindered in some cases. Thus, the concentration of one or both of hydrogen and carbon in the material that can have ferroelectricity is preferably reduced by using a precursor not containing hydrocarbon, as described above. Examples of the precursor not containing hydrocarbon include chlorine-based materials. In the case where a material containing hafnium oxide and zirconium oxide ($HfZrO_X$) is used as the material that can have ferroelectricity, $HfCl_4$ and/or $ZrCl_4$ can be used as a precursor.

Note that in the case where a film formed using the material that can have ferroelectricity is deposited, an impurity in the film, which is at least one or more of hydrogen, hydrocarbon, and carbon here, is thoroughly removed, so that a highly purified intrinsic film having ferroelectricity can be formed. Note that the highly purified intrinsic film having ferroelectricity and a highly purified intrinsic oxide semiconductor described in a later embodiment are highly compatible with each other in the manufacturing process. Thus, a manufacturing method of a semiconductor device with high productivity can be provided.

Furthermore, in the case where $HfZrO_X$ is used as the material that can have ferroelectricity, hafnium oxide and zirconium oxide are preferably deposited alternately by a thermal ALD method to have a composition of 1:1.

In the case where the material that can have ferroelectricity is deposited by a thermal ALD method, $H_2O$ or $O_3$ can be used as an oxidizer. However, the oxidizer in the thermal ALD method is not limited thereto. For example, the oxidizer in the thermal ALD method may contain any one or more selected from $O_2$, $O_3$, $N_2O$, $NO_2$, $H_2O$, and $H_2O_2$.

In addition, there is no particular limitation on the crystal structure of the material that can have ferroelectricity. For example, the material that can have ferroelectricity has one or more crystal structures selected from cubic, tetragonal, orthorhombic, and monoclinic crystal structures. It is particularly preferable that the material that can have ferroelectricity have an orthorhombic crystal structure, in which case ferroelectricity is exhibited. Alternatively, the material that can have ferroelectricity may have a composite structure including an amorphous structure and a crystal structure.

Configuration Example of Semiconductor Device

Figure 4:
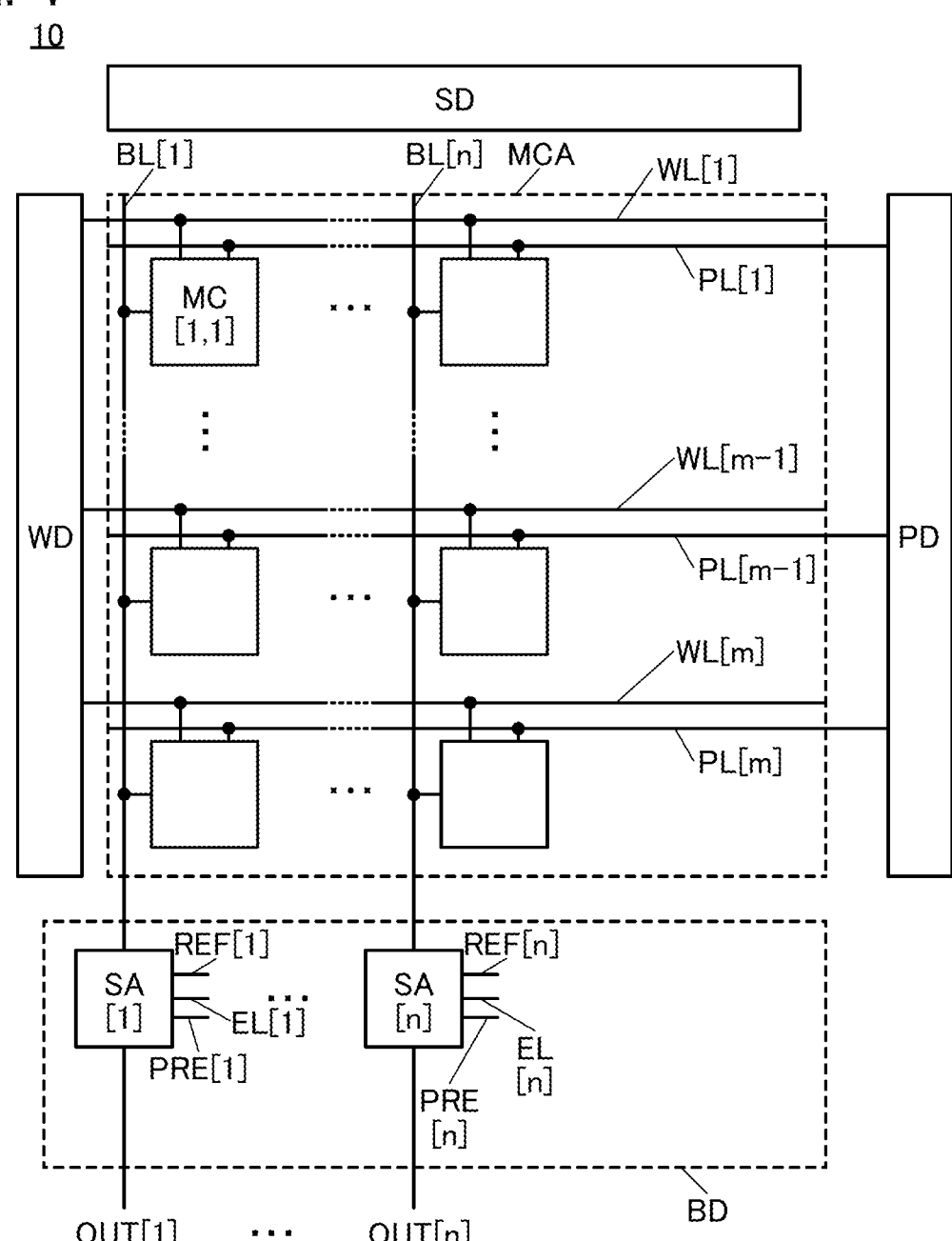
FIG. 4 is a diagram showing a configuration example of a semiconductor device.

FIG. 4 is a block diagram illustrating a configuration example of a semiconductor device that is the semiconductor device of one embodiment of the present invention. The semiconductor device 10 can be a memory device, for example.

The semiconductor device 10 is provided with a memory cell array MCA in which memory cells MC are arranged in a matrix of m rows and n columns (m and n are each an integer greater than or equal to 1). The semiconductor device 10 includes a word line driver circuit WD, a plate line driver circuit PD, a potential generation circuit SD, and a bit line driver circuit BD.

The word line driver circuit WD is electrically connected to the memory cells MC through the wirings WL and electrically connected to the memory cells MC through wirings RWL. The plate line driver circuit PD is electrically connected to the memory cells MC through the wirings PL. The bit line driver circuit BD is electrically connected to the memory cells MC through the wirings BL.

Here, the memory cells MC in the same row can be electrically connected to the word line driver circuit WD through the same wiring WL and electrically connected to the plate line driver circuit PD through the same wiring PL. In addition, the memory cells MC in the same column can be electrically connected to the bit line driver circuit BD through the same wiring BL.

In this specification and the like, for example, a memory cell MC in the first row and the first column is denoted as a memory cell MC[1, 1] and a memory cell MC in the m-th row and the n-th column is denoted as a memory cell MC[m, n]. Furthermore, for example, a wiring WL and a wiring PL electrically connected to memory cells MC in the first row are denoted as a wiring WL[1] and a wiring PL[1], respectively, and a wiring WL and a wiring PL electrically connected to memory cells MC in the m-th row are denoted as a wiring WL[m] and a wiring PL[m], respectively. Moreover, for example, a wiring BL electrically connected to memory cells MC in the first column is denoted as a wiring BL[1], and a wiring BL electrically connected to memory cells MC in the n-th column is denoted as a wiring BL[n]. Note that the same applies to other components in some cases.

The word line driver circuit WD has a function of controlling the potential of the wiring WL. Specifically, the word line driver circuit WD has a function of selecting the memory cell MC to which data is written by controlling the potential of the wiring WL.

The plate line driver circuit PD has a function of controlling the potential of the wiring PL.

The bit line driver circuit BD has a function of generating data to be written to the memory cells MC and supplying the data to the memory cells MC in a predetermined column. In addition, the bit line driver circuit BD has a function of reading data written to the memory cells MC and outputting the data.

Details of the bit line driver circuit BD are described. The bit line driver circuit BD includes a sense amplifier circuit SA[1] to a sense amplifier circuit SA[n]. The sense amplifier circuit SA is electrically connected to the wiring BL, a wiring REF, a wiring EL, and a wiring PRE. Furthermore, the sense amplifier circuit SA[1] to the sense amplifier circuit SA[n] are electrically connected to a wiring OUT[1] to a wiring OUT[n].

The sense amplifier circuit SA has a function of amplifying a difference between the potential of the wiring BL and the potential of the wiring REF. For example, when the potential of the wiring BL is higher than that of the wiring REF, the sense amplifier circuit SA can output a high potential. On the other hand, when the potential of the wiring BL is lower than that of the wiring REF, the sense amplifier circuit SA can output a low potential. Thus, the bit line driver circuit BD can write binary data, specifically, binary digital data, to the memory cells MC and read the binary data written to the memory cells MC. For example, when the potential of the wiring BL is higher than that of the wiring REF, data "0" can be written to or read from the memory cells MC. On the other hand, when the potential of the wiring BL is lower than that of the wiring REF, data "1" can be written to or read from the memory cells MC.

The wiring EL can be supplied with an enable signal for controlling whether to activate the sense amplifier circuit SA. The enable signal can be, for example, a binary digital signal. When the potential of the wiring EL is a high potential, for example, the sense amplifier circuit SA can be in an activation state; the difference between the potential of the wiring BL and the potential of the wiring REF is amplified. On the other hand, when the potential of the wiring EL is a low potential, the sense amplifier circuit SA can be in a deactivation state; the amplification described above is not performed.

The wiring PRE can be supplied with a precharge signal for controlling whether to precharge the potentials of the wiring BL and the wiring REF. The precharge signal can be, for example, a binary digital signal. When the potential of the wiring PRE is a high potential, for example, the wiring BL can be precharged to a high potential. Furthermore, the potential of the wiring REF can be set to a potential between the potential of the wiring BL in the case where data "0" is read from the memory cells MC and the potential of the wiring BL in the case where data "1" is read from the memory cells MC.

Note that the same potential may be supplied to the wiring EL[1] to the wiring EL[n]. In this case, the wiring EL[1] to the wiring EL[n] can be electrically connected to each other. Furthermore, the same potential may be supplied to the wiring PRE[1] to the wiring PRE[n]. In this case, the wiring PRE[1] to the wiring PRE[n] can be electrically connected to each other.

Data output from the sense amplifier circuit SA is output from the wiring OUT. Data of the sense amplifier circuit SA[1] can be output from the wiring OUT[1]. Moreover, data of the sense amplifier circuit SA[n] can be output from the wiring OUT [n].

Configuration Example 1 of Memory Cell

Figure 5A:
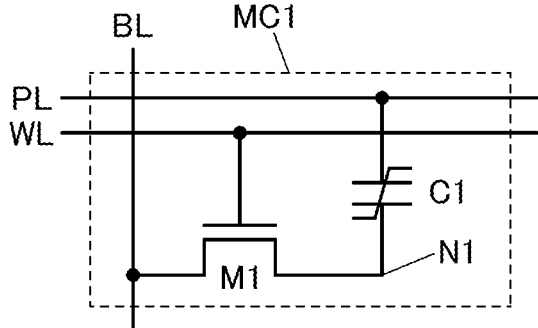
FIG. 5A and FIG. 5B are diagrams each showing a configuration example of a semiconductor device.

FIG. 5A is a circuit diagram of a memory cell that can be used for the memory cell MC1 in FIG. 4. The memory cell MC1 includes the transistor M1 and the ferroelectric capacitor C1. In the memory cell MC1, as shown in FIG. 5A, each element of the transistor M1 and the ferroelectric capacitor C1 is connected to the wiring BL, the wiring PL, and/or the wiring WL. In FIG. 5A, a wiring that electrically connects the transistor M1 and the ferroelectric capacitor C1 is shown as a node N1.

Figure 5B:
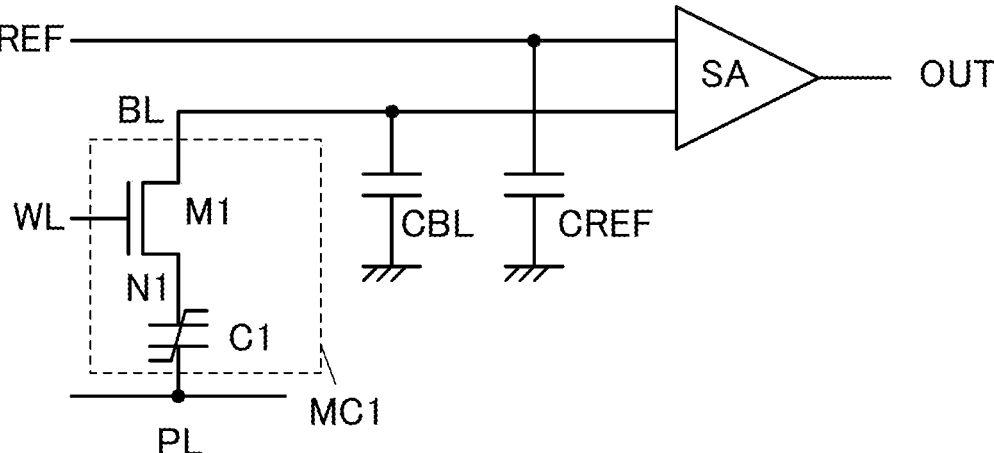

FIG. 5B shows an electrical connection between a sense amplifier circuit SA and each of the transistor M1, the ferroelectric capacitor C1, and the like included in the memory cell MC1. The wiring BL, the wiring REF, and the wiring OUT are connected to the sense amplifier circuit SA as shown in FIG. 5B. The sense amplifier circuit SA amplifies a difference between the potential of the wiring BL and the potential of the wiring REF. The potential and the voltage of the wiring REF can be referred to as a reference potential and a reference voltage, respectively. A load CBL and a load CREF, each of which is parasitic capacitance, are added to the wiring BL and the wiring REF, respectively. The loads CBL and CREF are provided as equivalent to each other. The description of the configuration shown in FIG. 5B is similar to that shown in FIG. 5A.

Data writing to the memory cell MC1 is performed by applying voltage to the ferroelectric capacitor C1. When a signal supplied to the wiring WL and the wiring BL is controlled to supply an H-level potential and an L-level potential to the node N1 and the wiring PL, respectively, ferroelectric in the ferroelectric capacitor C1 is polarized to a state "1". When an L-level potential and an H-level potential are supplied to the node N1 and the wiring PL, respectively, the ferroelectric in the ferroelectric capacitor C1 is polarized to a state "0". As for the voltage applied to the node N1 and the wiring PL, L level can be 0 V, and H level can be 2.5 V or 3.3 V.

Figure 6:
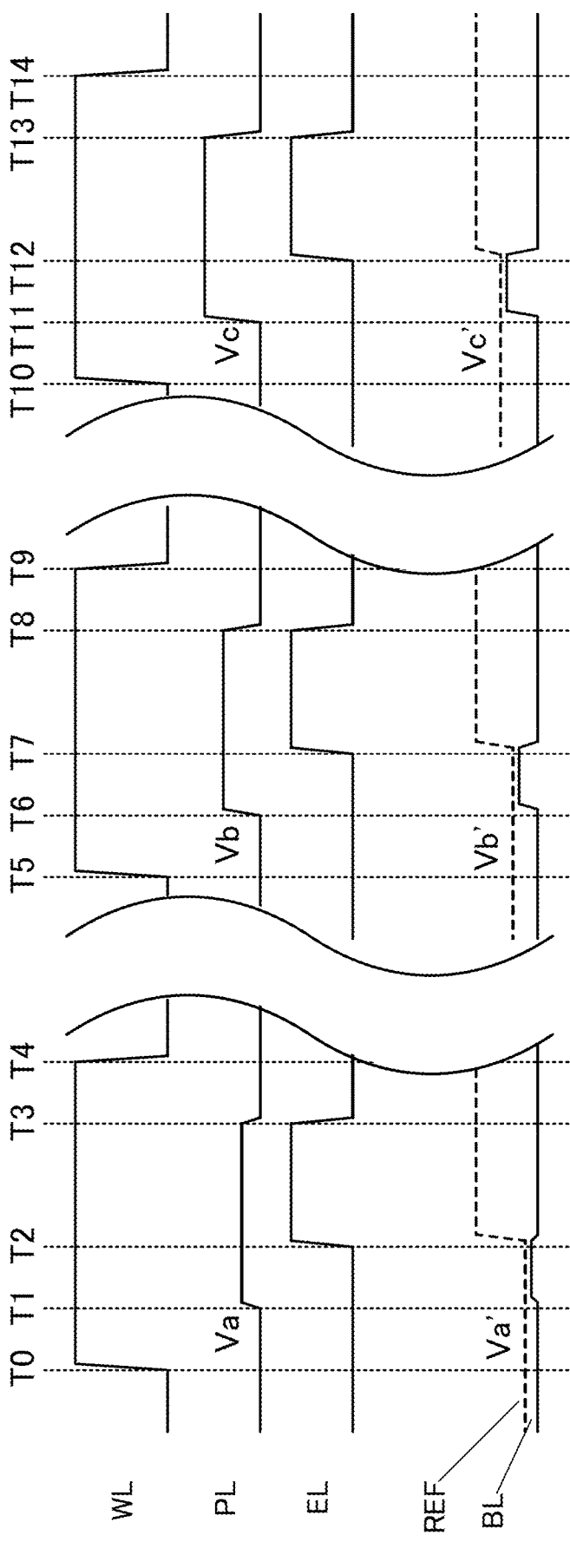
FIG. 6 is a diagram showing a configuration example of a semiconductor device.
Figure 7:
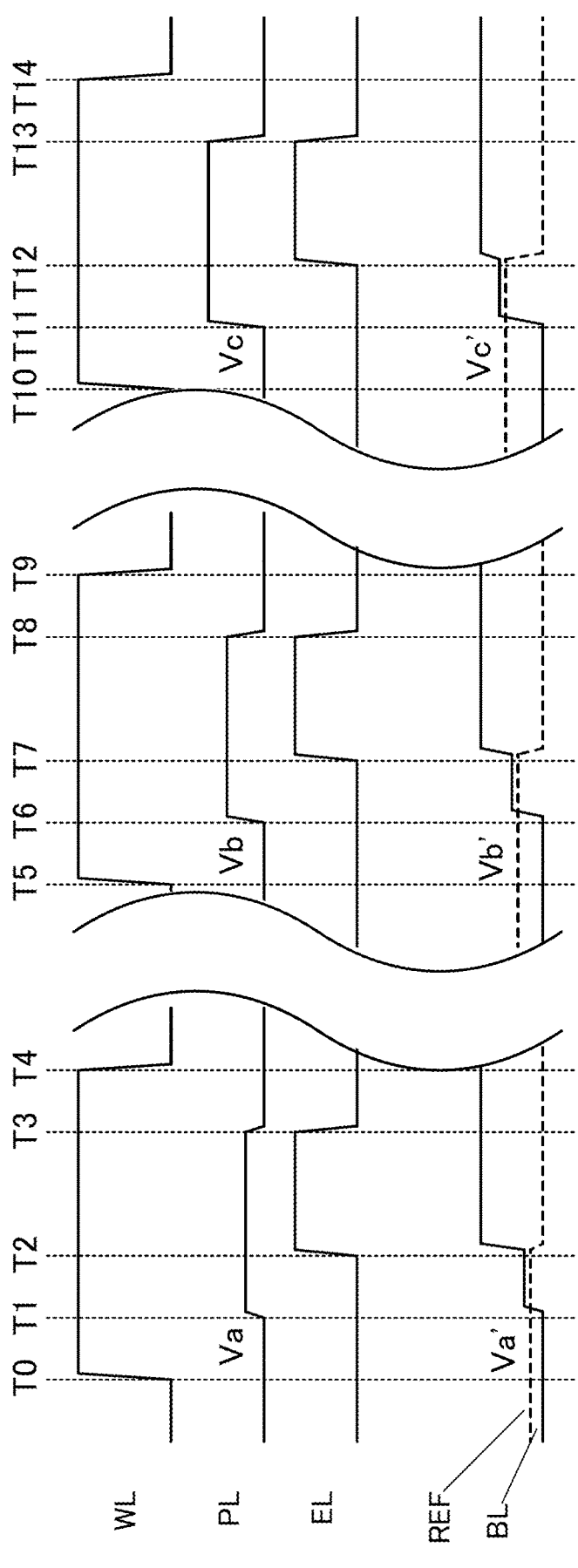
FIG. 7 is a diagram showing a configuration example of a semiconductor device.

FIG. 6 and FIG. 7 each show a timing chart in the case of applying a reading operation of one embodiment of the present invention to the memory cell MC1 shown in FIG. 5A and FIG. FIG. 6 and FIG. 7 each show a timing chart of the data reading operation in the case where the ferroelectric in the ferroelectric capacitor C1 is polarized to the state "0" and in the case where the ferroelectric in the ferroelectric capacitor C1 is polarized to the state "1", respectively.

In FIG. 6 and FIG. 7, the wiring WL is set to H level at Time T0 to turn on the transistor M1. A voltage Va is applied to the wiring PL at Time T1, so that the voltage of the wiring BL is boosted by capacitive coupling through the ferroelectric capacitor C1. At this time, a reference voltage of the wiring REF is set to a voltage Va' corresponding to the voltage Va. Here, the ferroelectric capacitor C1 is polarized to the state "0" in FIG. 6; therefore, the voltage of the wiring BL after being boosted is lower than that of the wiring REF. On the other hand, the ferroelectric capacitor C1 is polarized to the state "1" in FIG. 7; therefore, the voltage of the wiring BL after being boosted is higher than that of the wiring REF.

At Time T2, the wiring EL is set to H level. The enable signal of the sense amplifier circuit SA is supplied to the wiring EL and set to H level, so that the sense amplifier circuit SA is activated. When the wiring EL is set to H level, the sense amplifier circuit SA amplifies the potential difference between the wiring REF and the wiring BL. A signal corresponding to the potential difference is output to the wiring OUT.

Unlike the case where data is read from the ferroelectric capacitor C1 by destructive reading, the voltage for reading data does not exceed the polarization inversion voltage in the configuration of one embodiment of the present invention. The polarization direction of the ferroelectric layer, therefore, is maintained before and after the reading operation. Thus, it can be unnecessary to apply a high voltage for writing back of data.

The wiring PL and the wiring EL are set to L level at Time 3. The sense amplifier circuit SA is inactivated. The wiring WL is set to L level at Time T4, whereby the transistor M1 is turned off and the reading operation is completed.

Subsequently, the second reading operation is performed after Time T5.

The wiring WL is set to H level to turn on the transistor M1 at Time T5. A voltage Vb (>the voltage Va) is applied to the wiring PL at Time T6, so that the voltage of the wiring BL is boosted by capacitive coupling through the ferroelectric capacitor C1. At this time, a reference voltage of the wiring REF is set to a voltage Vb' (>the voltage Va') corresponding to the voltage Vb. Here, the ferroelectric capacitor C1 is polarized to the state "0" in FIG. 7; therefore, the voltage of the wiring BL after being boosted is lower than that of the wiring REF. On the other hand, the ferroelectric capacitor C1 is polarized to the state "1" in FIG. 7; therefore, the voltage of the wiring BL after being boosted is higher than that of the wiring REF.

The wiring EL is set to H level at Time T7, so that the sense amplifier circuit SA is activated. When the wiring EL is set to H level, the sense amplifier circuit SA amplifies the potential difference between the wiring REF and the wiring BL. A signal corresponding to the potential difference is output to the wiring OUT.

The wiring PL and the wiring EL are set to L level at Time T8, and the sense amplifier circuit SA is inactivated. The wiring WL is set to L level at Time T9, whereby the transistor M1 is turned off and the reading operation is completed.

Subsequently, the third reading operation is performed after Time T10.

The wiring WL is set to H level to turn on the transistor M1 at Time T10. A voltage Vc (>the voltage Vb) is applied to the wiring PL at Time T11, so that the voltage of the wiring BL is boosted by capacitive coupling through the ferroelectric capacitor C1. At this time, a reference voltage of the wiring REF is set to a voltage Vc' (>the voltage Vb') corresponding to the voltage Vc. Here, the ferroelectric capacitor C1 is polarized to the state "0" in FIG. 7; therefore, the voltage of the wiring BL after being boosted is lower than that of the wiring REF. On the other hand, the ferroelectric capacitor C1 is polarized to the state "1" in FIG. 7; therefore, the voltage of the wiring BL after being boosted is higher than that of the wiring REF.

The wiring EL is set to H level at Time T12, so that the sense amplifier circuit SA is activated. When the wiring EL is set to H level, the sense amplifier circuit SA amplifies the potential difference between the wiring REF and the wiring BL. A signal corresponding to the potential difference is output to the wiring OUT.

The wiring PL and the wiring EL are set to L level at Time T13, and the sense amplifier circuit SA is inactivated. The wiring WL is set to L level at Time T14, whereby the transistor M1 is turned off and the reading operation is completed.

In the above manner, by gradually increasing a drive voltage of the wiring PL and the reference voltage of the wiring REF every time the reading operation is performed, the reading operation can be performed a plurality of times without performing data write-back operation to the ferroelectric capacitor C1.

Note that in the case where the voltage of the wiring PL is higher than or equal to a certain voltage (e.g., 3.3 V), a data refresh operation is preferably performed. In this case, the data refresh operation is performed by applying a high voltage to the ferroelectric capacitor C1.

It is effective to use a transistor including an oxide semiconductor in its channel formation region (an OS transistor) as the transistor M1 in each of FIG. 5A and FIG. 5B. Since the OS transistor has a high withstand voltage, miniaturization of each element included in the memory cell can be achieved by using the OS transistor in combination with a ferroelectric capacitor which has a high drive voltage. The OS transistor also has a feature of extremely low off-state current; therefore, the voltage of the node N1 can be retained for a long time. Note that the voltage of the node N1 might be decreased due to leakage current through the ferroelectric capacitor C1; however, leakage current can be reduced in the case where the electric field applied to the ferroelectric capacitor C1 is low.

When an OS transistor is used as the transistor M1 in FIG. 1A, a data reading operation that utilizes electric charge held in the node N1 can be performed. Specifically, data can be read by distributing electric charge held in the node N1 to the wiring BL and amplifying the potential change by the sense amplifier. In the case where electric charge held in the node N1 is lost, electric charge may be supplied to the node N1 through the ferroelectric capacitor C1 by setting the voltage of the wiring PL to 3.0 V or more.

Configuration Example 2 of Memory Cell

Figure 8:
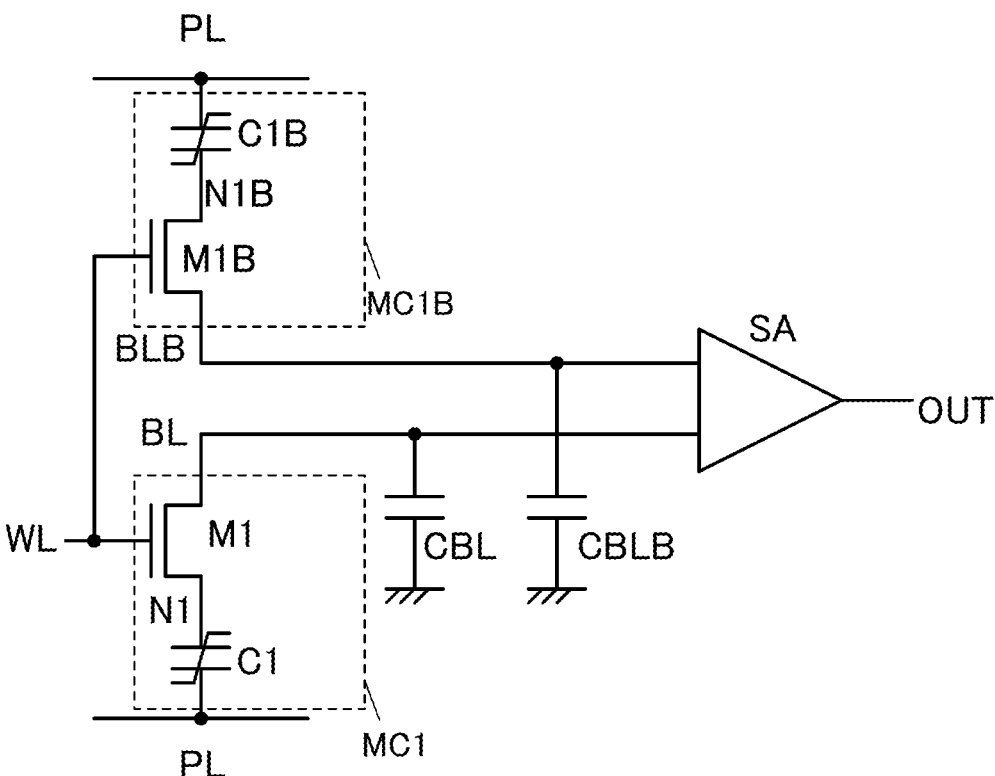
FIG. 8 is a diagram showing a configuration example of a semiconductor device.

FIG. 8 is a configuration example different from that in FIG. 5B. FIG. 8 shows an electrical connection between the sense amplifier circuit SA and each of the memory cell MC1 and a memory cell MC1B that stores inversion data of data written to the memory cell MC1. FIG. 8 shows a transistor M1B, a ferroelectric capacitor C1B, and a node N1B each included in the memory cell MC1B which makes a pair with the memory cell MC1. Note that the memory cell MC1B is also referred to as a reference memory cell. Hereinafter, a method for reading data from a memory cell that stores a pair of data sets is referred to as a twin cell type. FIG. 6 shows a wiring BLB to which the memory cell MC1B is connected. The sense amplifier circuit SA amplifies the potential difference between the wiring BL and the wiring BLB. The loads CBL and CBLB, each of which is parasitic capacitance, are added to the wiring BL and the wiring BLB. The loads CBL and CBLB are provided as equivalent to each other.

Figure 9:
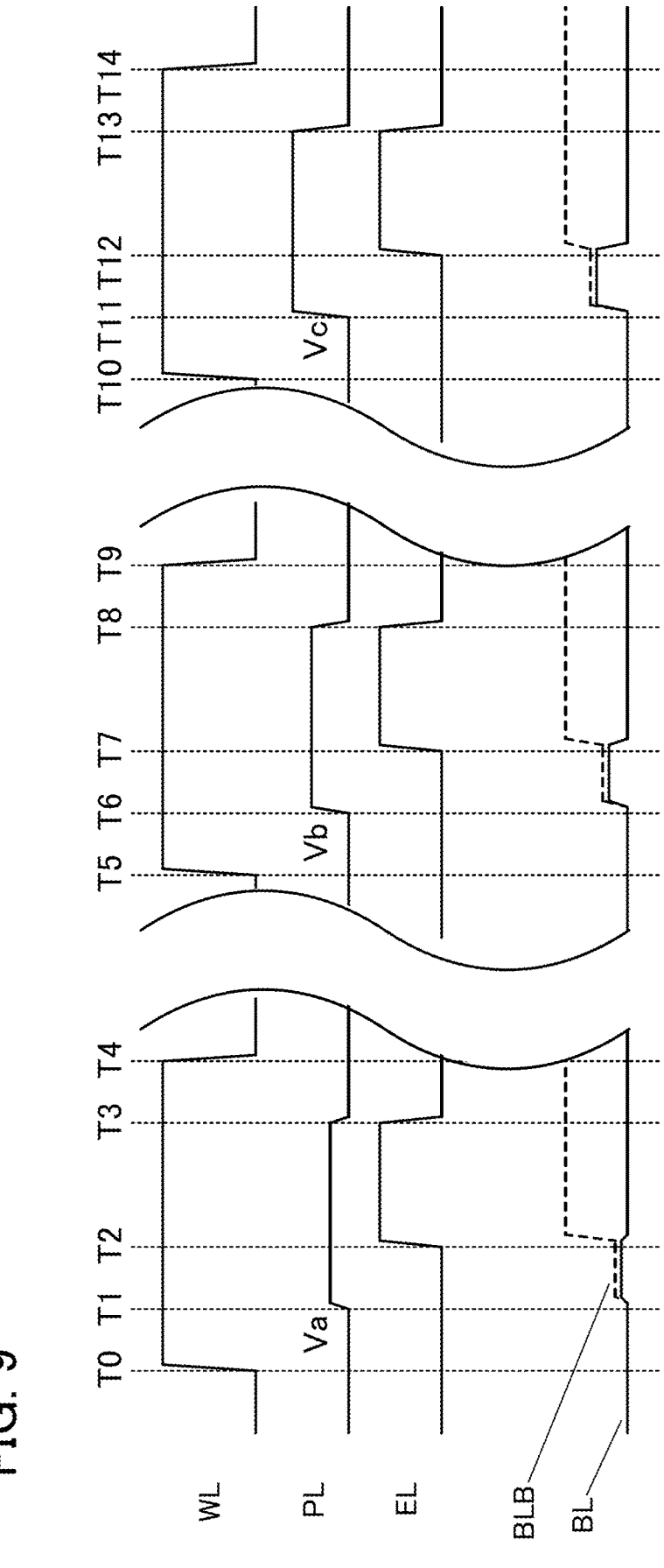
FIG. 9 is a diagram showing a configuration example of a semiconductor device.
Figure 10:
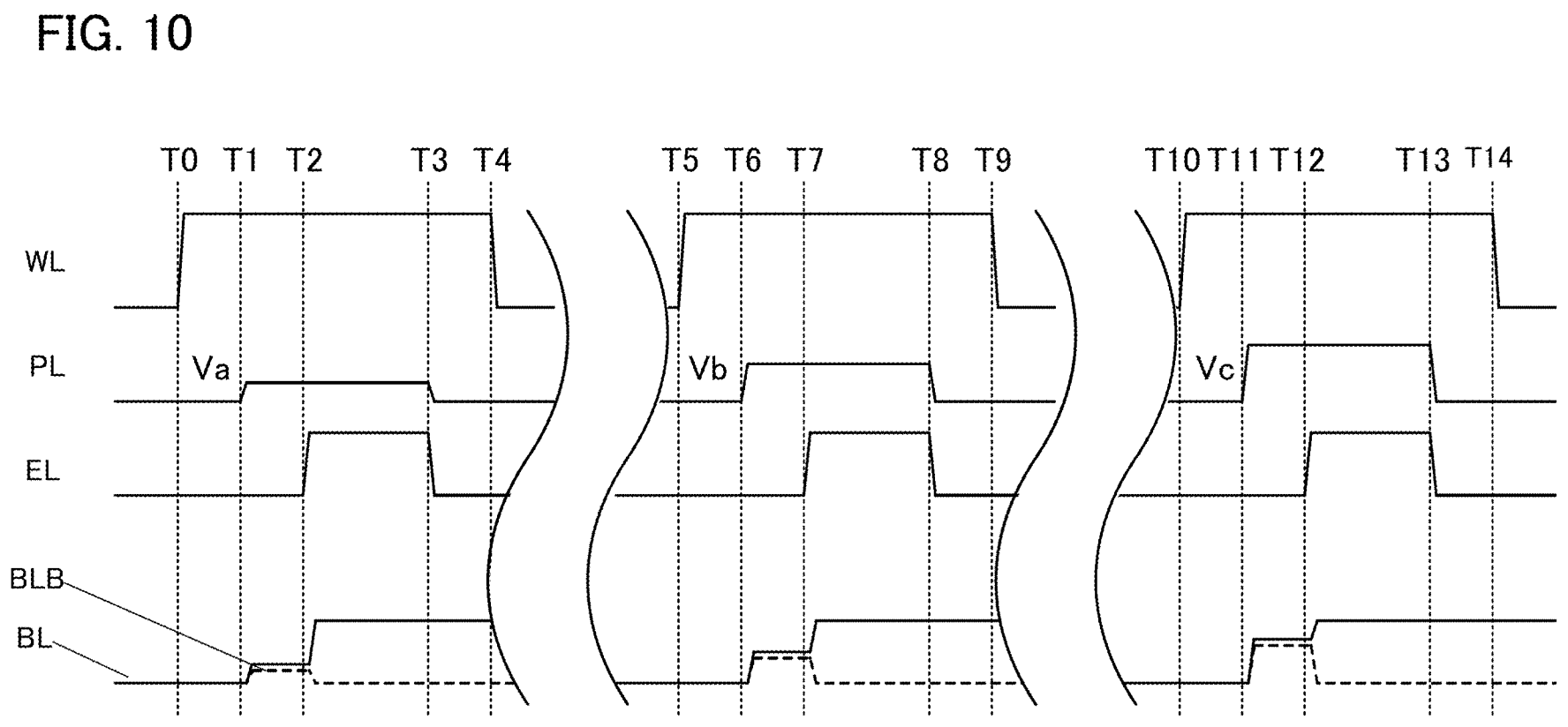

FIG. 9 and FIG. 10 each show a timing chart in the case of applying the reading operation of one embodiment of the present invention to the memory cells MC1 and MC1B shown in FIG. 8. FIG. 9 and FIG. 10 show timing charts of the data reading operation in the case where the ferroelectric in the ferroelectric capacitor C1 is polarized to the state "0" and in the case where the ferroelectric in the ferroelectric capacitor C1 is polarized to the state "1", respectively. Note that the ferroelectric in the ferroelectric capacitor C1B is polarized to the state different from that in the ferroelectric capacitor C1.

The circuit configuration in FIG. 8 is the twin cell type; therefore, the wiring REF shown in FIG. 5B is not included. Thus, the reference voltage of the wiring REF does not need to be changed in accordance with the voltage of the wiring PL. In the data reading operation, the wiring BL and the wiring BLB may be set to, for example, an L-level potential for precharging. Since the circuit configuration in FIG. 8 is the twin cell type, inversion data is written to each of the memory cell MC1 and the memory cell MC1B.

In FIG. 9 and FIG. 10, the wiring WL is set to H level at Time TO to turn on the transistor M1 and the transistor M1B. The voltage Va is applied to the wiring PL at Time Ti, so that the voltages of the wiring BL and the wiring BLB are boosted by capacitive coupling through the ferroelectric capacitor C1 and the ferroelectric capacitor C1B. Here, the ferroelectric capacitor C1 is polarized to the state "0" in FIG. 9 (the ferroelectric capacitor C1B is polarized to the state "1"); therefore, the voltage of the wiring BL after being boosted is lower than that of the wiring BLB. On the other hand, the ferroelectric capacitor C1 is polarized to the state "1" in FIG. 10 (the ferroelectric capacitor C1B is polarized to the state "0"); therefore, the voltage of the wiring BL after being boosted is higher than that of the wiring BLB.

At Time T2, the wiring EL is set to H level. The enable signal of the sense amplifier circuit SA is supplied to the wiring EL and set to H level, so that the sense amplifier circuit SA is activated. When the wiring EL is set to H level, the potential difference between the wiring BLB and the wiring BL is amplified. A signal corresponding to the potential difference is output to the wiring OUT.

Unlike the case where data is read from the ferroelectric capacitor C1 by destructive reading, the voltage for reading data does not exceed the polarization inversion voltage in the configuration of one embodiment of the present invention. The polarization direction of the ferroelectric layer, therefore, is maintained before and after the reading operation. Thus, it can be unnecessary to apply a high voltage for writing back of data.

The wiring PL and the wiring EL are set to L level at Time T3, and the sense amplifier circuit SA is inactivated. The wiring WL is set to L level at Time T4, whereby the transistor M1 and the transistor M1B is turned off and the reading operation is completed.

Subsequently, the second reading operation is performed after Time T5.

The wiring WL is set to H level at Time T5 to turn on the transistor M1 and the transistor M1B. The voltage Vb (>the voltage Va) is applied to the wiring PL at Time T6, so that the voltages of the wiring BL and the wiring BLB are boosted by capacitive coupling through the ferroelectric capacitor C1 and the ferroelectric capacitor C1B. Here, the ferroelectric capacitor C1 is polarized to the state "0" in FIG. 9 (the ferroelectric capacitor C1B is polarized to the state "1"); therefore, the voltage of the wiring BL after being boosted is lower than that of the wiring BLB. On the other hand, the ferroelectric capacitor C1 is polarized to the state "1" in FIG. 10 (the ferroelectric capacitor C1B is polarized to the state "0"); therefore, the voltage of the wiring BL after being boosted is higher than that of the wiring BLB.

The wiring EL is set to H level at Time T7, so that the sense amplifier circuit SA is activated. When the wiring EL is set to H level, the sense amplifier circuit SA amplifies the potential difference between the wiring BLB and the wiring BL. A signal corresponding to the potential difference is output to the wiring OUT.

The wiring PL and the wiring EL are set to L level at Time T8, and the sense amplifier circuit SA is inactivated. The wiring WL is set to L level at Time T9, whereby the transistor M1 and the transistor M1B are turned off and the reading operation is completed.

Subsequently, the third reading operation is performed after Time T10.

The wiring WL is set to H level at Time 11 to turn on the transistor M1 and the transistor M1B. The voltage Vc (>the voltage Vb) is applied to the wiring PL at Time T12, so that the voltages of the wiring BL and the wiring BLB are boosted by capacitive coupling through the ferroelectric capacitor C1 and the ferroelectric capacitor C1B. Here, the ferroelectric capacitor C1 is polarized to the state "0" in FIG. 9 (the ferroelectric capacitor C1B is polarized to the state "1"); therefore, the voltage of the wiring BL after being boosted is lower than that of the wiring BLB. On the other hand, the ferroelectric capacitor C1 is polarized to the state "1" in FIG. 10 (the ferroelectric capacitor C1B is polarized to the state "0"); therefore, the voltage of the wiring BL after being boosted is higher than that of the wiring BLB.

The wiring EL is set to H level at Time T12, so that the sense amplifier circuit SA is activated. When the wiring EL is set to H level, the sense amplifier circuit SA amplifies the potential difference between the wiring BLB and the wiring BL. A signal corresponding to the potential difference is output to the wiring OUT.

The wiring PL and the wiring EL are set to L level at Time T13, and the sense amplifier circuit SA is inactivated. The wiring WL is set to L level at Time T14, whereby the transistor M1 and the transistor M1B are turned off and the reading operation is completed.

In the above manner, by gradually increasing a drive voltage of the wiring PL every time the reading operation is performed, the reading operation can be performed a plurality of times without performing data write-back operation to the ferroelectric capacitor C1.

Note that in the case where the voltage of the wiring PL is higher than or equal to a certain voltage (e.g., 3.3 V), the data refresh operation is preferably performed. In this case, the data refresh operation is performed by applying a high voltage to the ferroelectric capacitor C1 and the ferroelectric capacitor C1B.

It is effective to use a transistor including an oxide semiconductor in its channel formation region (an OS transistor) as each of the transistor M1 and the transistor M1B in FIG. 8, like the transistor M1 in each of FIG. 5A and FIG. 5B.

Configuration Example 3 of Memory Cell

Figure 11:
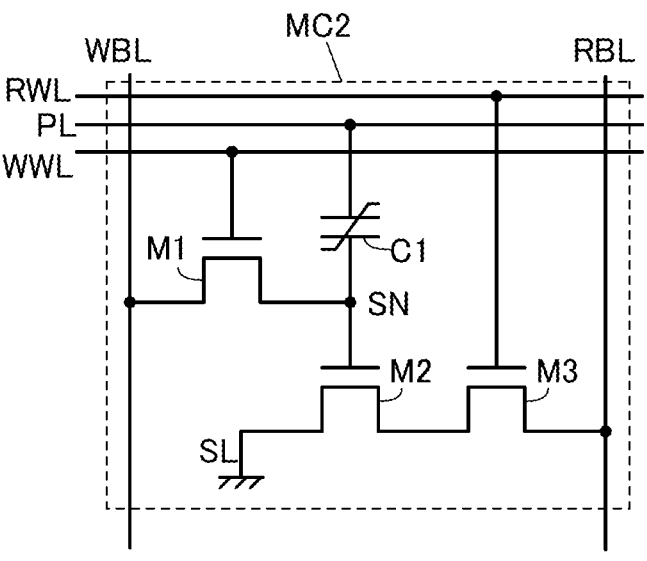
FIG. 11 is a diagram showing a configuration example of a semiconductor device.

FIG. 11 is a circuit diagram of a memory cell different from the above-described memory cell MC1. A memory cell MC2 in FIG. 11 includes the transistor M1, a transistor M2, a transistor M3, and the ferroelectric capacitor C1. In the memory cell MC2, each element of the transistors M1 to M3 and the ferroelectric capacitor C1 is connected to a wiring WBL (also referred to as a write bit line), a wiring RBL (also referred to as a read bit line), the wiring PL, a wiring SL (also referred to as a source line), a wiring WWL (also referred to as a write word line), and/or a wiring RWL (also referred to as a reading word line) as shown in FIG. 11. In FIG. 11, a wiring electrically connecting the transistor M1, the transistor M2, and the ferroelectric capacitor C1 is denoted as a node SN.

In the memory cell MC2 in FIG. 11, the voltage of the wiring PL is changed to change a potential of the node SN owing to the capacitive coupling of the ferroelectric capacitor C1. At this time, there arises a difference in the potential of the node SN in accordance with a difference in polarization of the ferroelectric layer included in the ferroelectric capacitor C1, and the difference can be amplified in the transistor M2 to be read.

A wiring functioning as a bit line is divided into the wiring WBL and the wiring RBL, whereby a high voltage (e.g., 3.3 V) can be applied to the wiring WBL and data can be read from the wiring RBL at a low voltage (e.g., 1.2 V or less).

In the case where the reading operation is performed a plurality of times, it is effective to gradually increase the voltage of the wiring PL also in the configuration in FIG. 11. When the voltage of the wiring PL is gradually increased, the voltage of the node SN is increased every time the reading operation is performed. Thus, a reading circuit connected to the wiring RBL has a function of adjusting the range of a read voltage in accordance with the number of times of reading.

Performing such driving can activate only the wiring RBL which is operable at a low voltage and inactivate the wiring WBL which requires a high voltage in normal reading operation, whereby power consumption can be reduced.

It is effective to use a transistor including an oxide semiconductor in its channel formation region (an OS transistor) as the transistors M1 and M3 in FIG. 11. Since the OS transistor has a feature of extremely low off-state current, the voltage of the node SN can be retained for a long time. Here, the voltage of the node SN might be decreased due to leakage current through the ferroelectric capacitor C1; however, leakage current can be reduced in the case where the electric field applied to the ferroelectric capacitor C1 is low.

When an OS transistor is used as the transistors M1 and M3 in FIG. 1A, a data reading operation that utilizes electric charge held in the node SN can be performed. Specifically, data can be read by utilizing the fact that the amount of current flowing through the transistor M2 is determined in accordance with the potential corresponding to electric charge held in the node SN. In the case where the electric charge held in the node SN is lost, electric charge may be supplied to the node SN through the ferroelectric capacitor C1 by setting the voltage of the wiring PL to 3.0 V or more.

Modification Example of Memory Cell

Figure 12A:
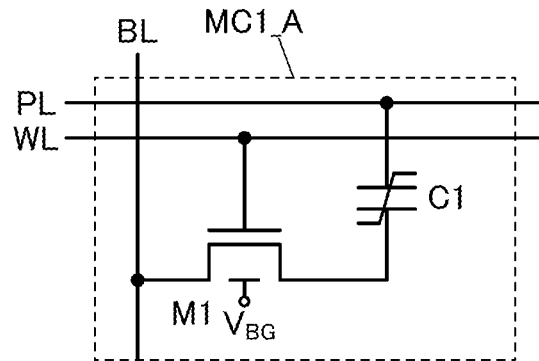
FIG. 12A and FIG. 12B are diagrams each showing a configuration example of a semiconductor device.

FIG. 12A is a circuit diagram showing a modification example of the above-described memory cell MC1. A memory cell MC1_A in FIG. 12A shows a structure in which the transistor M1 in the memory cell MC1 in FIG. 5A includes a back gate electrode to which a back gate voltage $V_{BG}$ is applied. With the configuration of FIG. 12A, the amount of current flowing through the transistors can be increased.

Figure 12B:
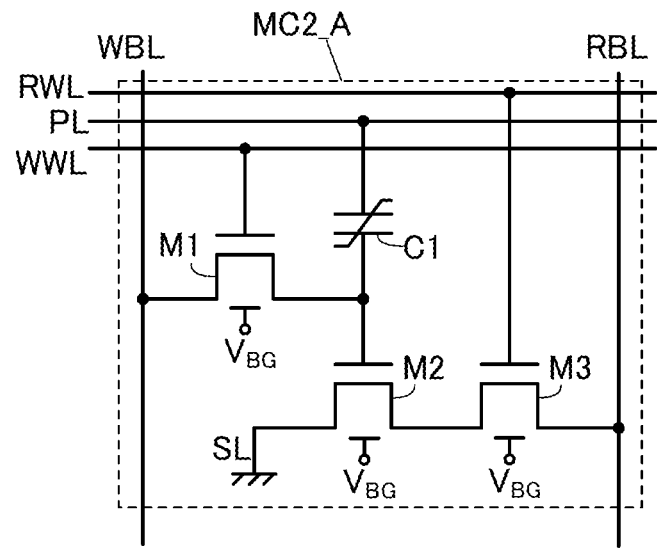

FIG. 12B is a circuit diagram showing a modification example of the above-described memory cell MC2. A memory cell MC2_A in FIG. 12B shows a structure in which each of the transistors M1 to M3 in the memory cell MC2 in FIG. 11 includes a back gate electrode to which the back gate voltage $V_{BG}$ is applied. With the configuration of FIG. 12B, the amount of current flowing through the transistors can be increased. Note that the back gate voltages applied to the back gates of the transistors may be the same or different from each other.

Figure 13A:
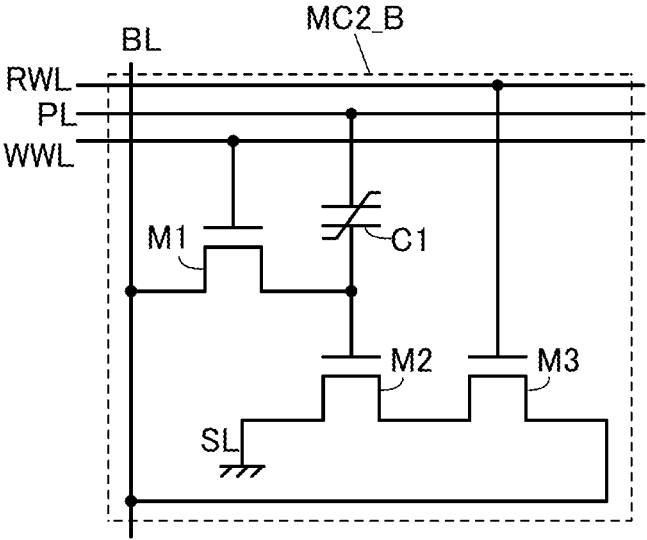
FIG. 13A and FIG. 13B are diagrams each showing a configuration example of a semiconductor device.

FIG. 13A is a circuit diagram showing a modification example of the above-described memory cell MC2. In a memory cell MC2_B shown in FIG. 13A, the wiring WBL and the wiring RBL in the memory cell MC2 in FIG. 11 are combined into the wiring BL. With the configuration of FIG. 13A, the number of wirings connected to the memory cell can be reduced.

Figure 13B:
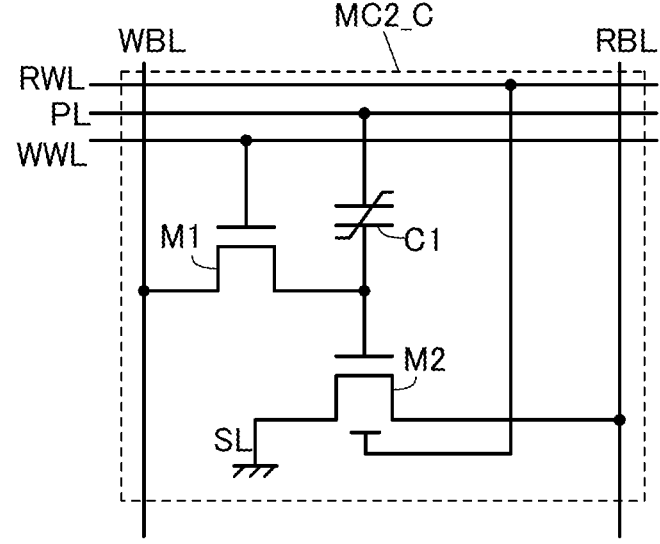

FIG. 13B is a circuit diagram showing a modification example of the above-described memory cell MC2. In a circuit diagram of a memory cell MC2_C shown in FIG. 13B, the transistor M3 in the memory cell MC2 in FIG. 11 is omitted, and the wiring RWL is connected to the back gate of the transistor M2. The selection signal supplied to the wiring RWL controls whether to flow current between the wiring RWL and the wiring SL by controlling the threshold voltage of the transistor M2. With the configuration of FIG. 13B, the number of transistors included in the memory cell can be reduced.

As described above, in one embodiment of the present invention, the polarization direction of the remnant polarization of the ferroelectric layer FE is not completely inverted but partially inverted in the operation for applying electric fields to read data. The balance of the polarization direction of the remnant polarization of the ferroelectric layer FE is collapsed as the reading operation is repeated; thus, in the reading operation, voltage applied to the counter electrode of the ferroelectric capacitor is gradually increased so as not to cause polarization destruction in the ferroelectric capacitor. This configuration enables data to be read even when the remnant polarization of the ferroelectric layer FE becomes small by repeated reading operation.

This embodiment can be combined with the other embodiments described in this specification and the like as appropriate.

Embodiment 2

This embodiment will describe structure examples of transistors that can be used in the semiconductor device described in the above embodiment. As an example, a structure in which transistors having different electrical characteristics are stacked is described. With the structure, the flexibility in design of the semiconductor device can be increased. Stacking transistors having different electrical characteristics can increase the degree of integration of the semiconductor device.

Structure Example of Semiconductor Device

Figure 14:
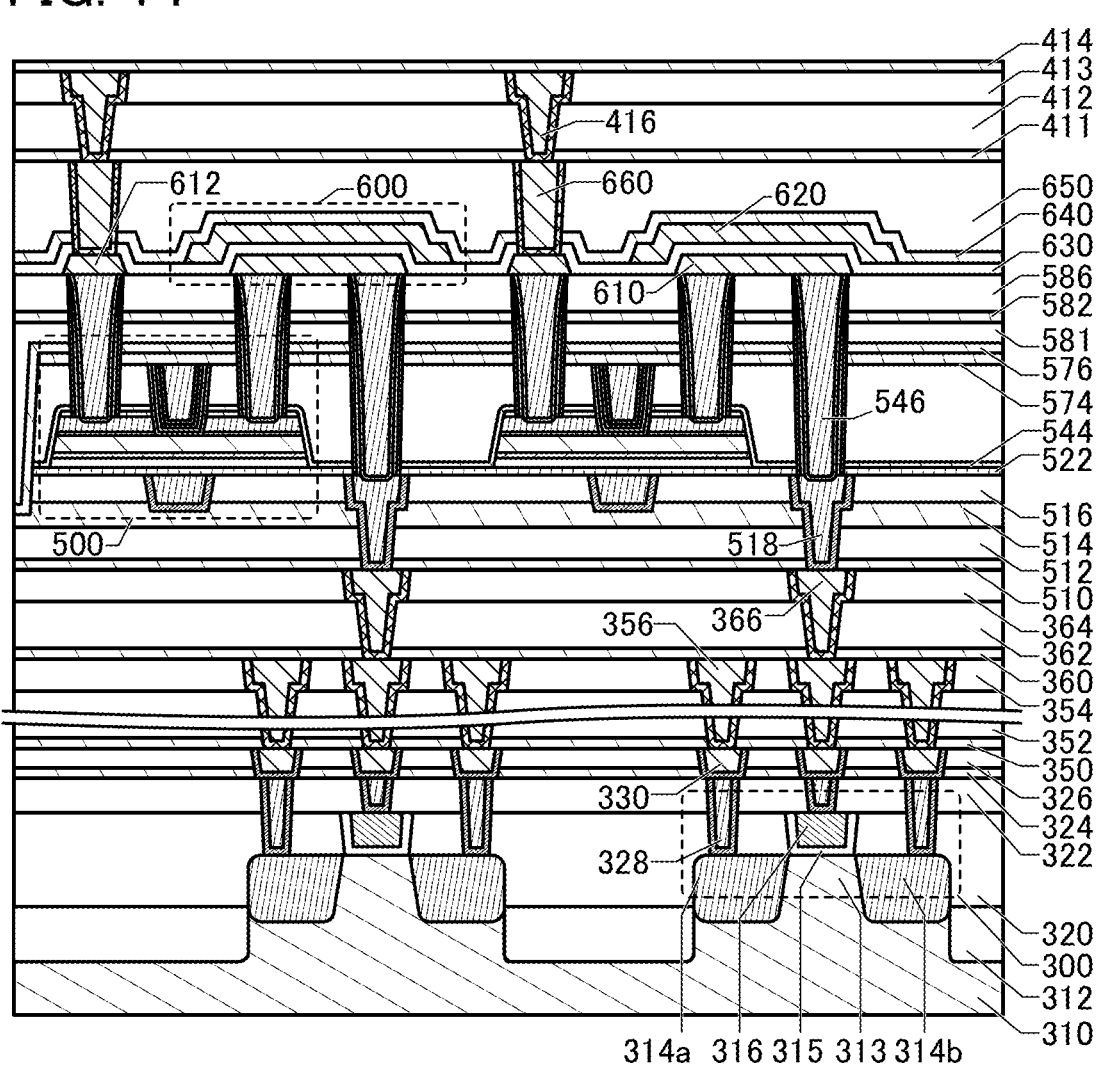
FIG. 14 is a schematic cross-sectional view illustrating a structure example of a semiconductor device.
Figure 15A:
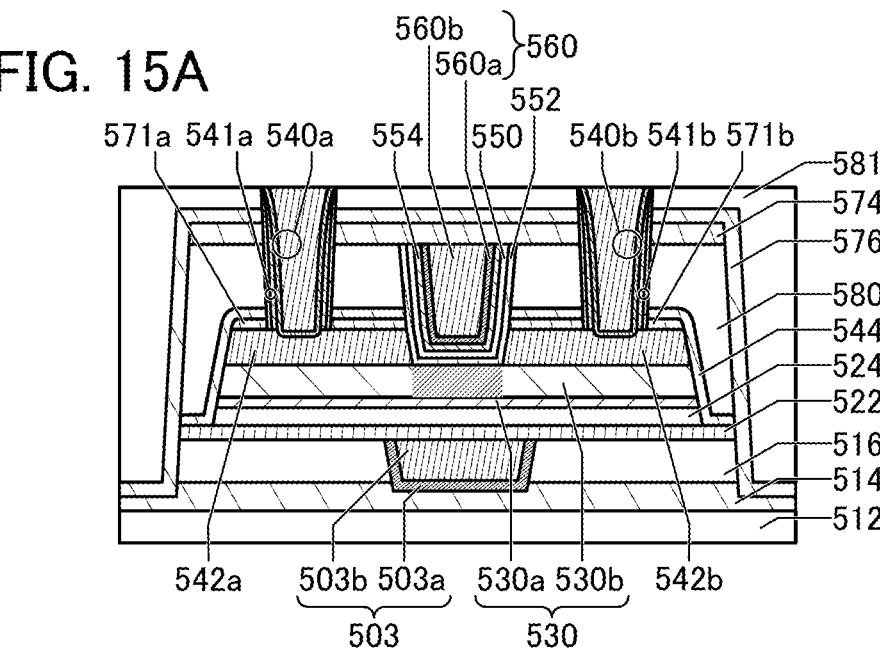
FIG. 15A to FIG. 15C are schematic cross-sectional views each illustrating a structure example of a transistor.

FIG. 14 illustrates the semiconductor device described in the above embodiment as an example, and the semiconductor device includes a transistor 300, a transistor 500, and a capacitor 600. FIG. 15A is a cross-sectional view of the transistor 500 in the channel length direction, FIG. is a cross-sectional view of the transistor 500 in the channel width direction, and FIG. 15C is a cross-sectional view of the transistor 300 in the channel width direction.

The transistor 500 is a transistor containing a metal oxide in a channel formation region (an OS transistor). The transistor 500 has features that the off-state current is low and that the field-effect mobility hardly changes even at high temperatures. The transistor 500 is used as a semiconductor device, for example, the OS transistor described in the above embodiment, whereby a semiconductor device whose operating performance hardly deteriorates even at high temperatures can be obtained.

The transistor 500 is provided above the transistor 300, for example, and the capacitor 600 is provided above the transistor 300 and the transistor 500, for example.

The transistor 300 is provided on a substrate 310 and includes an element isolation layer 312, a conductor 316, an insulator 315, a semiconductor region 313 that is part of the substrate 310, and a low-resistance region 314a and a low-resistance region 314b functioning as a source region and a drain region. Note that the transistor 300 can be used as, for example, the Si transistor described in the above embodiment. Note that FIG. 14 illustrates a structure in which a gate of the transistor 300 is electrically connected to one of a source and a drain of the transistor 500 through a pair of electrodes of the capacitor 600.

A semiconductor substrate (e.g., a single crystal substrate or a silicon substrate) is preferably used as the substrate 310.

In the transistor 300, a top surface and a side surface in the channel width direction of the semiconductor region 313 are covered with the conductor 316 with the insulator 315 therebetween, as illustrated in FIG. 15C. Such a Fin-type transistor 300 can have an increased effective channel width, and thus the transistor 300 can have improved on-state characteristics. In addition, since contribution of an electric field of a gate electrode can be increased, the off-state characteristics of the transistor 300 can be improved.

Note that the transistor 300 may be either a p-channel transistor or an n-channel transistor.

A region of the semiconductor region 313 where a channel is formed, a region in the vicinity thereof, the low-resistance region 314a and the low-resistance region 314b functioning as a source region and a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), GaN (gallium nitride), or the like. A structure using silicon whose effective mass is controlled by applying stress to the crystal lattice and changing the lattice spacing may be employed. Alternatively, the transistor 300 may be a HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used in the semiconductor region 313.

For the conductor 316 functioning as a gate electrode, a semiconductor material such as silicon containing an element that imparts n-type conductivity, such as arsenic or phosphorus, or an element that imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The element isolation layer 312 is provided to separate a plurality of transistors on the substrate 310 from each other. The element isolation layer can be formed by, for example, a LOCOS (LOCal Oxidation of Silicon) method, an STI (Shallow Trench Isolation) method, a mesa isolation method, or the like.

Figure 15C:
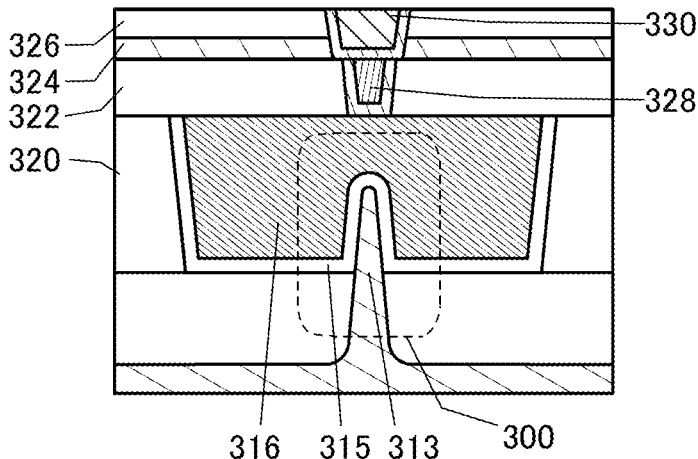
Figure 16:
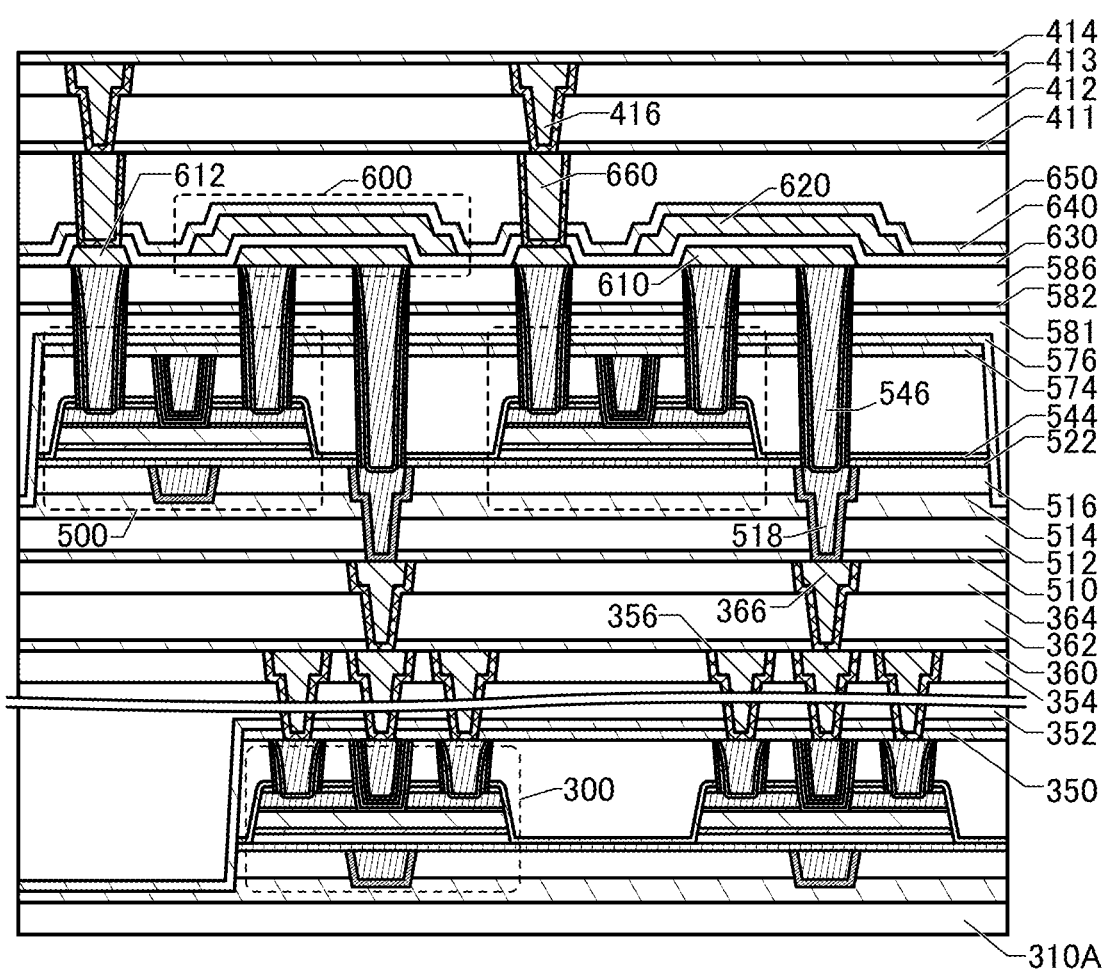
FIG. 16 is a schematic cross-sectional view illustrating a structure example of a semiconductor device.

Note that the transistor 300 illustrated in FIG. 14 is an example and the structure is not limited thereto; an appropriate transistor is used in accordance with a circuit configuration, a driving method, or the like. For example, the transistor 300 may have a planar structure instead of a FIN-type structure illustrated in FIG. 15C. For example, when a semiconductor device is a single-polarity circuit using only OS transistors, the transistor 300 has a structure similar to that of the transistor 500 using an oxide semiconductor, as illustrated in FIG. 16. Note that the details of the transistor 500 will be described later. In this specification and the like, a single-polarity circuit refers to a circuit including only either n-channel transistors or p-channel transistors.

Note that in FIG. 16, the transistor 300 is provided over a substrate 310A; in this case, a semiconductor substrate may be used as the substrate 310A, as in the case of the substrate 310 in the semiconductor device in FIG. 14. As the substrate 310A, for example, an SOI substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used. Examples of the glass substrate include barium borosilicate glass, aluminoborosilicate glass, and soda lime glass. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Other examples include polyamide, polyimide, aramid, an epoxy resin, an inorganic vapor deposition film, and paper.

In the transistor 300 illustrated in FIG. 14, an insulator 320, an insulator 322, an insulator 324, and an insulator 326 are stacked in this order from the substrate 310 side.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that contains oxygen at a higher proportion than nitrogen in its composition, and silicon nitride oxide refers to a material that contains nitrogen at a higher proportion than oxygen in its composition. Moreover, in this specification, aluminum oxynitride refers to a material that contains oxygen at a higher proportion than nitrogen in its composition, and aluminum nitride oxide refers to a material that contains nitrogen at a higher proportion than oxygen in its composition.

The insulator 322 may have a function of a planarization film for planarizing a level difference caused by the transistor 300 or the like covered with the insulator 320 and the insulator 322. For example, the top surface of the insulator 322 may be planarized by planarization treatment using a chemical mechanical polishing (CMP) method or the like to improve planarity.

As the insulator 324, it is preferable to use a film having a barrier property that prevents diffusion of hydrogen, impurities, or the like from the substrate 310, the transistor 300, or the like into a region where the transistor 500 is provided.

For the film having a barrier property against hydrogen, silicon nitride deposited by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be analyzed by thermal desorption spectroscopy (TDS), for example. The amount of hydrogen released from the insulator 324 that is converted into hydrogen atoms per area of the insulator 324 is less than or equal to $10\times10^{15}$ atoms/cm$^2$, preferably less than or equal to $5\times10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably times or less, further preferably 0.6 times or less the relative permittivity of the insulator 324. When a material with a low permittivity is used for the interlayer film, parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors having a function of plugs or wirings are collectively denoted by the same reference numeral in some cases. Moreover, in this specification and the like, a wiring and a plug connected to the wiring may be a single component. That is, part of a conductor functions as a wiring in some cases and part of a conductor functions as a plug in other cases.

As a material of each of plugs and wirings (e.g., the conductor 328 and the conductor 330), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 14, an insulator 350, an insulator 352, and an insulator 354 are provided to be stacked in this order above the insulator 326 and the conductor 330. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against impurities such as hydrogen and water. The insulator 352 and the insulator 354 are preferably formed using an insulator having a comparatively low relative permittivity to reduce parasitic capacitance generated between wirings, like the insulator 326. Furthermore, the conductor 356 preferably contains a conductor having a barrier property against impurities such as hydrogen and water. In particular, the conductor having a barrier property against hydrogen is formed in an opening portion included in the insulator 350 having a barrier property against hydrogen. With this structure, the transistor 300 and the transistor 500 can be separated by the barrier layer, so that diffusion of hydrogen from the transistor 300 into the transistor 500 can be inhibited.

For the conductor having a barrier property against hydrogen, tantalum nitride or the like is preferably used, for example. In addition, the use of a stack including tantalum nitride and tungsten that has high conductivity can inhibit diffusion of hydrogen from the transistor 300 while the conductivity of a wiring is kept. In that case, a tantalum nitride layer having a barrier property against hydrogen is preferably in contact with the insulator 350 having a barrier property against hydrogen.

An insulator 360, an insulator 362, and an insulator 364 are stacked in this order over the insulator 354 and the conductor 356.

Like the insulator 324 or the like, the insulator 360 is preferably formed using an insulator having a barrier property against impurities such as water and hydrogen. Thus, the insulator 360 can be formed using any of the materials usable for the insulator 324 or the like, for example.

The insulator 362 and the insulator 364 have functions of an interlayer insulating film and a planarization film. Like the insulator 324, the insulator 362 and the insulator 364 are preferably formed using an insulator having a barrier property against impurities such as water and hydrogen. Thus, the insulator 362 and/or the insulator 364 can be formed using any of the materials usable for the insulator 324.

An opening portion is provided in regions of the insulator 360, the insulator 362, and the insulator 364 that overlap with part of the conductor 356, and a conductor 366 is provided to fill the opening portion. The conductor 366 is also formed over the insulator 362. The conductor 366 has a function of a plug or a wiring connected to the transistor 300, for example. Note that the conductor 366 can be provided using a material similar to those for the conductor 328 and the conductor 330.

An insulator 510, an insulator 512, an insulator 514, and an insulator 516 are provided to be stacked in this order over the insulator 364 and the conductor 366. A substance with a barrier property against oxygen or hydrogen is preferably used for any of the insulator 510, the insulator 512, the insulator 514, and the insulator 516.

For example, as the insulator 510 and the insulator 514, it is preferable to use a film having a barrier property that prevents diffusion of hydrogen or impurities from the substrate 310, a region where the transistor 300 is provided, or the like into the region where the transistor 500 is provided. Thus, a material similar to that for the insulator 324 can be used.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen used as the insulator 510 and the insulator 514, a metal oxide such as aluminum oxide, hafnium oxide, or tantalum oxide is preferably used, for example.

In particular, aluminum oxide has an excellent blocking effect that prevents a passage of both oxygen and impurities such as hydrogen and moisture that would cause a change in the electrical characteristics of the transistor. Accordingly, aluminum oxide can prevent entry of impurities such as hydrogen and moisture into the transistor 500 in and after the manufacturing process of the transistor. In addition, release of oxygen from an oxide included in the transistor 500 can be inhibited. Therefore, aluminum oxide is suitably used for a protective film of the transistor 500.

For the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film, a silicon oxynitride film, or the like can be used for the insulator 512 and the insulator 516, for example.

A conductor 518, a conductor included in the transistor 500 (e.g., a conductor 503 illustrated in FIG. 15A and FIG. 15B), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330. In particular, a region of the conductor 518 that is in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; hence, diffusion of hydrogen from the transistor 300 into the transistor 500 can be inhibited.

The transistor 500 is provided above the insulator 516.

Figure 15B:
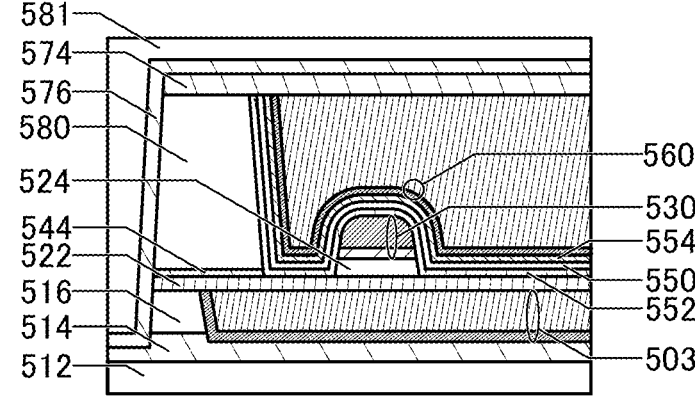

As illustrated in FIG. 15A and FIG. 15B, the transistor 500 includes the insulator 516 over the insulator 514, the conductor 503 (a conductor 503a and a conductor 503b) provided to be embedded in the insulator 514 or the insulator 516, an insulator 522 over the insulator 516 and the conductor 503, an insulator 524 over the insulator 522, an oxide 530a over the insulator 524, an oxide 530b over the oxide 530a, a conductor 542a over the oxide 530b, an insulator 571a over the conductor 542a, a conductor 542b over the oxide 530b, an insulator 571b over the conductor 542b, an insulator 552 over the oxide 530b, an insulator 550 over the insulator 552, an insulator 554 over the insulator 550, a conductor 560 (a conductor 560a and a conductor 560b) that is over the insulator 554 and overlaps with part of the oxide 530b, and an insulator 544 provided over the insulator 522, the insulator 524, the oxide 530a, the oxide 530b, the conductor 542a, the conductor 542b, the insulator 571a, and the insulator 571b. Note that in this specification and the like, the conductor 542a and the conductor 542b are collectively referred to as a conductor 542, and the insulator 571a and the insulator 571b are collectively referred to as an insulator 571. Here, as illustrated in FIG. 15A and FIG. 15B, the insulator 552 is in contact with a top surface of the insulator 522, a side surface of the insulator 524, a side surface of the oxide 530a, a side surface and a top surface of the oxide 530b, a side surface of the conductor 542, a side surface of the insulator 571, a side surface of the insulator 544, a side surface of an insulator 580, and a bottom surface of the insulator 550. A top surface of the conductor 560 is placed to be substantially level with the upper portion of the insulator 554, the upper portion of the insulator 550, the upper portion of the insulator 552, and a top surface of the insulator 580. An insulator 574 is in contact with part of at least one of the top surface of the conductor 560, the upper portion of the insulator 552, the upper portion of the insulator 550, the upper portion of the insulator 554, and the top surface of the insulator 580.

An opening reaching the oxide 530b is provided in the insulator 580 and the insulator 544. The insulator 552, the insulator 550, the insulator 554, and the conductor 560 are placed in the opening. The conductor 560, the insulator 552, the insulator 550, and the insulator 554 are provided between the conductor 542a and the conductor 542b and between the insulator 571a and the insulator 571b in the channel length direction of the transistor 500. The insulator 554 includes a region in contact with a side surface of the conductor 560 and a region in contact with a bottom surface of the conductor 560.

The oxide 530 preferably includes the oxide 530a placed over the insulator 524 and the oxide 530b placed over the oxide 530a. Including the oxide 530a under the oxide 530b makes it possible to inhibit diffusion of impurities into the oxide 530b from a component formed below the oxide 530a.

Although a structure in which two layers, the oxide 530a and the oxide 530b, are stacked as the oxide 530 in the transistor 500 is described, the present invention is not limited thereto. For example, the transistor 500 can include a single-layer structure of the oxide 530b or a stacked-layer structure of three or more layers. Alternatively, the oxide 530a and the oxide 530b can each have a stacked-layer structure.

The conductor 560 functions as a first gate (also referred to as a top gate) electrode, and the conductor 503 functions as a second gate (also referred to as a back gate) electrode. The insulator 552, the insulator 550, and the insulator 554 function as a first gate insulator, and the insulator 522 and the insulator 524 function as a second gate insulator. Note that the gate insulator is also referred to as a gate insulating layer or a gate insulating film in some cases. The conductor 542a functions as one of a source and a drain, and the conductor 542b functions as the other of the source and the drain. At least part of a region of the oxide 530 that overlaps with the conductor 560 functions as a channel formation region.

Figure 17A:
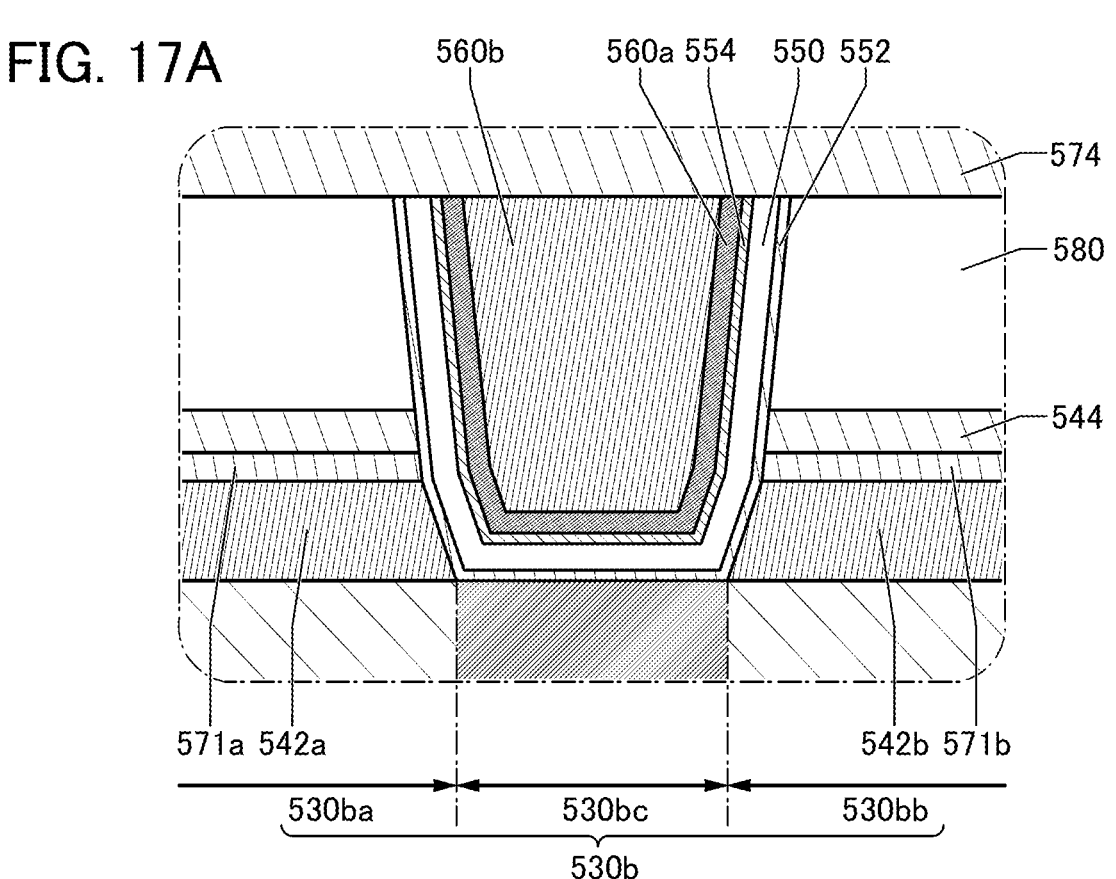
FIG. 17A and FIG. 17B are schematic cross-sectional views each illustrating a structure example of a transistor.

Here, FIG. 17A is an enlarged view of the vicinity of the channel formation region in FIG. 15A. Supply of oxygen to the oxide 530b forms the channel formation region in a region between the conductor 542a and the conductor 542b. As illustrated in FIG. 17A, the oxide 530b includes a region 530bc functioning as the channel formation region of the transistor 500 and a region 530ba and a region 530bb that are provided to sandwich the region 530bc and function as a source region and a drain region. At least part of the region 530bc overlaps with the conductor 560. In other words, the region 530bc is provided in the region between the conductor 542a and the conductor 542b. The region 530ba is provided to overlap with the conductor 542a, and the region 530bb is provided to overlap with the conductor 542b.

The region 530bc functioning as the channel formation region has a smaller amount of oxygen vacancies (an oxygen vacancy in a metal oxide is sometimes referred to as $V_O$ in this specification and the like) or a lower impurity concentration than the region 530*ba* and the region 530*bb*, and thus is a high-resistance region having a low carrier concentration. Accordingly, the region 530*bc* can be regarded as being i-type (intrinsic) or substantially i-type.

A transistor using a metal oxide is likely to change its electrical characteristics when impurities or oxygen vacancies ($V_O$) exist in a region of the metal oxide where a channel is formed, which might degrade the reliability. In some cases, hydrogen in the vicinity of an oxygen vacancy ($V_O$) forms a defect that is an oxygen vacancy ($V_O$) into which hydrogen enters (hereinafter, sometimes referred to as $V_OH$), which generates an electron serving as a carrier. Therefore, when the region of the oxide semiconductor where a channel is formed includes oxygen vacancies, the transistor tends to have normally-on characteristics (even when no voltage is applied to the gate electrode, the channel exists and a current flows through the transistor). Thus, impurities, oxygen vacancies, and $V_OH$ are preferably reduced as much as possible in the region of the oxide semiconductor where a channel is formed.

The region 530*ba* and the region 530*bb* functioning as the source region and the drain region are each a low-resistance region with an increased carrier concentration because they include a large amount of oxygen vacancies ($V_O$) or have a high concentration of an impurity such as hydrogen, nitrogen, or a metal element. In other words, the region 530*ba* and the region 530*bb* are each an n-type region having a higher carrier concentration and a lower resistance than the region 530*bc*.

The carrier concentration in the region 530*bc* functioning as the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. Note that the lower limit of the carrier concentration in the region 530*bc* functioning as the channel formation region is not particularly limited and can be, for example, $1\times10^{-9}$ cm$^{-3}$.

Between the region 530*bc* and the region 530*ba* or the region 530*bb*, a region having a carrier concentration that is lower than or substantially equal to the carrier concentrations in the region 530*ba* and the region 530*bb* and higher than or substantially equal to the carrier concentration in the region 530*bc* may be formed. That is, the region functions as a junction region between the region 530*bc* and the region 530*ba* or the region 530*bb*. The hydrogen concentration in the junction region is lower than or substantially equal to the hydrogen concentrations in the region 530*ba* and the region 530*bb* and higher than or substantially equal to the hydrogen concentration in the region 530*bc* in some cases. The amount of oxygen vacancies in the junction region is smaller than or substantially equal to the amounts of oxygen vacancies in the region 530*ba* and the region 530*bb* and larger than or substantially equal to the amount of oxygen vacancies in the region 530*bc* in some cases.

Although FIG. 17A illustrates an example in which the region 530*ba*, the region 530*bb*, and the region 530*bc* are formed in the oxide 530*b*, the present invention is not limited thereto. For example, the above regions may be formed not only in the oxide 530*b* but also in the oxide 530*a*.

In the oxide 530, it is sometimes difficult to clearly detect the boundaries between the regions. The concentration of a metal element and an impurity element such as hydrogen and nitrogen, which is detected in each region, may be not only gradually changed between the regions but also continuously changed in each region. That is, the region closer to the channel formation region preferably has a lower concentration of a metal element and an impurity element such as hydrogen and nitrogen.

In the transistor 500, a metal oxide functioning as a semiconductor (such a metal oxide is hereinafter also referred to as an oxide semiconductor) is preferably used for the oxide 530 (the oxide 530*a* and the oxide 530*b*) including the channel formation region.

The metal oxide functioning as a semiconductor preferably has a band gap of 2 eV or more, further preferably 2.5 eV or more. With the use of a metal oxide having such a wide band gap, the off-state current of the transistor can be reduced.

As the oxide 530, it is preferable to use, for example, a metal oxide such as an In-M-Zn oxide containing indium, the element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like). Alternatively, an In—Ga oxide, an In—Zn oxide, or an indium oxide may be used as the oxide 530.

Here, the atomic ratio of In to the element M in the metal oxide used as the oxide 530*b* is preferably greater than the atomic ratio of In to the element M in the metal oxide used as the oxide 530*a*.

As described above, placing the oxide 530*a* under the oxide 530*b* makes it possible to inhibit diffusion of impurities and oxygen into the oxide 530*b* from components formed below the oxide 530*a*.

When the oxide 530*a* and the oxide 530*b* contain a common element (as the main component) besides oxygen, the density of defect states at an interface between the oxide 530*a* and the oxide 530*b* can be made low. Since the density of defect states at the interface between the oxide 530*a* and the oxide 530*b* can be made low, the influence of interface scattering on carrier conduction is small, and a high on-state current can be obtained.

The oxide 530*b* preferably has crystallinity. It is particularly preferable to use a CAAC-OS (c-axis aligned crystalline oxide semiconductor) as the oxide 530*b*.

The CAAC-OS is a metal oxide having a dense structure with high crystallinity and small amounts of impurities and defects (e.g., oxygen vacancies ($V_O$)). In particular, after the formation of a metal oxide, heat treatment is performed at a temperature at which the metal oxide does not become a polycrystal (e.g., 400° C. to 600° C., inclusive), whereby a CAAC-OS having a dense structure and higher crystallinity can be obtained. When the density of the CAAC-OS is increased in such a manner, diffusion of impurities or oxygen in the CAAC-OS can be further reduced.

On the other hand, it is difficult to observe a clear crystal grain boundary in the CAAC-OS; thus, it can be said that a reduction in electron mobility due to the crystal grain boundary is less likely to occur. Thus, a metal oxide including a CAAC-OS is physically stable. Therefore, the metal oxide including a CAAC-OS is resistant to heat and highly reliable.

If impurities and oxygen vacancies exist in a region of an oxide semiconductor where a channel is formed, a transistor including the oxide semiconductor might have variable electrical characteristics and poor reliability. In some cases, hydrogen in the vicinity of an oxygen vacancy forms a defect that is the oxygen vacancy into which hydrogen enters (hereinafter, sometimes referred to as VOH), which generates an electron serving as a carrier. Therefore, when the region of the oxide semiconductor where a channel is formed includes oxygen vacancies, the transistor tends to have normally-on characteristics (even when no voltage is applied to the gate electrode, the channel exists and a current flows through the transistor). Thus, impurities, oxygen vacancies, and VOH are preferably reduced as much as possible in the region of the oxide semiconductor where a channel is formed. In other words, it is preferable that the region of the oxide semiconductor where a channel is formed have a reduced carrier concentration and be of an i-type (intrinsic) or substantially i-type.

As a countermeasure to the above, an insulator containing oxygen that is released by heating (hereinafter, sometimes referred to as excess oxygen) is provided in the vicinity of the oxide semiconductor and heat treatment is performed, so that oxygen can be supplied from the insulator to the oxide semiconductor to reduce oxygen vacancies and VOH. However, supply of an excess amount of oxygen to the source region or the drain region might cause a decrease in the on-state current or field-effect mobility of the transistor 500. Furthermore, a variation in the amount of oxygen supplied to the source region or the drain region in the substrate plane leads to a variation in characteristics of the semiconductor device including the transistor.

Therefore, the region 530bc functioning as the channel formation region in the oxide semiconductor is preferably an i-type or substantially i-type region with a reduced carrier concentration, whereas the region 530ba and the region 530bb functioning as the source region and the drain region are preferably n-type regions with high carrier concentrations. That is, it is preferable that oxygen vacancies and VOH in the region 530bc of the oxide semiconductor be reduced and the region 530ba and the region 530bb not be supplied with an excess amount of oxygen.

Thus, in this embodiment, microwave treatment is performed in an oxygen-containing atmosphere in a state where the conductor 542a and the conductor 542b are provided over the oxide 530b so that oxygen vacancies and VOH in the region 530bc can be reduced. Here, the microwave treatment refers to, for example, treatment using an apparatus equipped with a power source that generates high-density plasma with the use of a microwave.

The microwave treatment in an oxygen-containing atmosphere converts an oxygen gas into plasma using a high-frequency wave such as a microwave or RF and activates the oxygen plasma. At this time, the region 530bc can be irradiated with the high-frequency wave such as a microwave or RF. By the effect of the plasma, a microwave, or the like, VOH in the region 530bc can be cut; thus, hydrogen H can be removed from the region 530bc and an oxygen vacancy $V_O$ can be filled with oxygen. That is, the reaction "$V_OH \rightarrow H + V_O$" occurs in the region 530bc, so that the hydrogen concentration in the region 530bc can be reduced. As a result, oxygen vacancies and $V_OH$ in the region 530bc can be reduced to lower the carrier concentration.

In the microwave treatment in an oxygen-containing atmosphere, the high-frequency wave such as the microwave or RF, the oxygen plasma, or the like is blocked by the conductor 542a and the conductor 542b and does not affect the region 530ba nor the region 530bb. In addition, the effect of the oxygen plasma can be reduced by the insulator 571 and the insulator 580 that are provided to cover the oxide 530b and the conductor 542. Hence, a reduction in $V_OH$ and supply of an excess amount of oxygen do not occur in the region 530ba and the region 530bb in the microwave treatment, preventing a decrease in carrier concentration.

Microwave treatment is preferably performed in an oxygen-containing atmosphere after formation of an insulating film to be the insulator 552 or after formation of an insulating film to be the insulator 550. By performing the microwave treatment in an oxygen-containing atmosphere through the insulator 552 or the insulator 550 in such a manner, oxygen can be efficiently supplied into the region 530bc. In addition, the insulator 552 is placed to be in contact with the side surface of the conductor 542 and the surface of the region 530bc, thereby inhibiting oxygen more than necessary from being supplied to the region 530bc and inhibiting the side surface of the conductor 542 from being oxidized. Furthermore, the side surface of the conductor 542 can be inhibited from being oxidized when the insulating film to be the insulator 550 is formed.

The oxygen supplied into the region 530bc has any of a variety of forms such as an oxygen atom, an oxygen molecule, and an oxygen radical (also referred to as an O radical, an atom or a molecule having an unpaired electron, or an ion). Note that the oxygen supplied into the region 530bc preferably has any one or more of the above forms, and is particularly preferably an oxygen radical. Furthermore, the film quality of the insulator 552 and the insulator 550 can be improved, leading to higher reliability of the transistor 500.

In the above manner, oxygen vacancies and $V_OH$ can be selectively removed from the region 530bc in the oxide semiconductor, whereby the region 530bc can be an i-type or substantially i-type region. Furthermore, supply of an excess amount of oxygen to the region 530ba and the region 530bb functioning as the source region and the drain region can be inhibited and the conductivity can be maintained. As a result, a change in the electrical characteristics of the transistor 500 can be inhibited, and thus a variation in the electrical characteristics of the transistors 500 in the substrate plane can be reduced.

With the above structure, a semiconductor device with a small variation in transistor characteristics can be provided. A semiconductor device with favorable reliability can also be provided. A semiconductor device having favorable electrical characteristics can be provided.

As illustrated in FIG. 15B, a curved surface may be provided between the side surface of the oxide 530b and the top surface of the oxide 530b in a cross-sectional view of the transistor 500 in the channel width direction. In other words, an end portion of the side surface and an end portion of the top surface may be curved (hereinafter, also referred to as rounded).

The radius of curvature of the curved surface is preferably greater than 0 nm and less than the thickness of the oxide 530b in a region overlapping with the conductor 542, or less than half of the length of a region that does not have the curved surface. Specifically, the radius of curvature of the curved surface is greater than 0 nm and less than or equal to 20 nm, preferably greater than or equal to 1 nm and less than or equal to 15 nm, further preferably greater than or equal to 2 nm and less than or equal to 10 nm. Such a shape can improve the coverage of the oxide 530b with the insulator 552, the insulator 550, the insulator 554, and the conductor 560.

The oxide 530 preferably has a stacked-layer structure of a plurality of oxide layers with different chemical compositions. Specifically, the atomic ratio of the element M to a metal element that is a main component of the metal oxide used as the oxide 530a is preferably greater than the atomic ratio of the element M to a metal element that is a main component of the metal oxide used as the oxide 530b. Moreover, the atomic ratio of the element M to In in the metal oxide used as the oxide 530a is preferably greater than the atomic ratio of the element M to In in the metal oxide used as the oxide 530b. Furthermore, the atomic ratio of In to the element M in the metal oxide used as the oxide 530b is preferably greater than the atomic ratio of In to the element M in the metal oxide used as the oxide 530a.

The oxide 530b is preferably an oxide having crystallinity, such as a CAAC-OS. An oxide having crystallinity, such as a CAAC-OS, has a dense structure with small amounts of impurities and defects (e.g., oxygen vacancies) and high crystallinity. This can inhibit oxygen extraction from the oxide 530b by the source electrode or the drain electrode. This can reduce oxygen extraction from the oxide 530b even when heat treatment is performed; thus, the transistor 500 is stable with respect to high temperatures in a manufacturing process (what is called thermal budget).

Here, the conduction band minimum gradually changes at a junction portion of the oxide 530a and the oxide 530b. In other words, the conduction band minimum at the junction portion of the oxide 530a and the oxide 530b continuously changes or is continuously connected. To achieve this, the density of defect states in a mixed layer formed at the interface between the oxide 530a and the oxide 530b is preferably made low.

Specifically, when the oxide 530a and the oxide 530b contain a common element as a main component besides oxygen, a mixed layer with a low density of defect states can be formed. For example, in the case where the oxide 530b is an In-M-Zn oxide, an In-M-Zn oxide, an M-Zn oxide, an oxide of the element M, an In—Zn oxide, an indium oxide, or the like may be used as the oxide 530a.

Specifically, as the oxide 530a, a metal oxide with a composition of In:M:Zn=1:3:4 [atomic ratio] or in the neighborhood thereof, or a composition of In:M:Zn=1:1:0.5 [atomic ratio] or in the neighborhood thereof may be used. As the oxide 530b, a metal oxide with a composition of In:M:Zn=1:1:1 [atomic ratio] or in the neighborhood thereof, or a composition of In:M:Zn=4:2:3 [atomic ratio] or in the neighborhood thereof may be used. Note that a composition in the neighborhood includes the range of ±30% of an intended atomic ratio. Gallium is preferably used as the element M.

When the metal oxide is deposited by a sputtering method, the above atomic ratio is not limited to the atomic ratio of the deposited metal oxide and may be the atomic ratio of a sputtering target used for depositing the metal oxide.

As illustrated in FIG. 15A or the like, the insulator 552 formed using aluminum oxide or the like is provided in contact with the top surface and the side surface of the oxide 530, whereby indium contained in the oxide 530 is unevenly distributed, in some cases, at the interface between the oxide 530 and the insulator 552 and in its vicinity. Accordingly, the vicinity of the surface of the oxide 530 comes to have an atomic ratio close to that of an indium oxide or that of an In—Zn oxide. Such an increase in the atomic ratio of indium in the vicinity of the surface of the oxide 530, especially the vicinity of the surface of the oxide 530b, can increase the field-effect mobility of the transistor 500.

When the oxide 530a and the oxide 530b have the above structure, the density of defect states at the interface between the oxide 530a and the oxide 530b can be made low. Thus, the influence of interface scattering on carrier conduction is small, and the transistor 500 can have a high on-state current and excellent frequency characteristics.

At least one of the insulator 512, the insulator 514, the insulator 544, the insulator 571, the insulator 574, an insulator 576, and an insulator 581 preferably functions as a barrier insulating film, which inhibits diffusion of impurities such as water and hydrogen from the substrate side or above the transistor 500 into the transistor 500. Thus, for at least one of the insulator 512, the insulator 514, the insulator 544, the insulator 571, the insulator 574, the insulator 576, and the insulator 581, it is preferable to use an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), and copper atoms (an insulating material through which the impurities are less likely to pass). Alternatively, it is preferable to use an insulating material having a function of inhibiting oxygen (e.g., at least one of oxygen atoms, oxygen molecules, and the like) from diffusing (an insulating material through which the oxygen is less likely to pass).

Note that in this specification, a barrier insulating film refers to an insulating film having a barrier property. A barrier property in this specification means a function of inhibiting diffusion of a targeted substance (also referred to as having low permeability). In addition, a barrier property in this specification means a function of capturing and fixing (also referred to as gettering) a targeted substance.

An insulator having a function of inhibiting diffusion of oxygen and impurities such as water and hydrogen is preferably used for each of the insulator 512, the insulator 514, the insulator 544, the insulator 571, the insulator 574, the insulator 576, and the insulator 581; for example, aluminum oxide, magnesium oxide, hafnium oxide, gallium oxide, indium gallium zinc oxide, silicon nitride, silicon nitride oxide, or the like can be used. For example, silicon nitride, which has a higher hydrogen barrier property, is preferably used for the insulator 512, the insulator 544, and the insulator 576. For example, aluminum oxide or magnesium oxide, which has a function of capturing or fixing hydrogen well, is preferably used for the insulator 514, the insulator 571, the insulator 574, and the insulator 581. In this case, impurities such as water and hydrogen can be inhibited from diffusing into the transistor 500 side from the substrate side through the insulator 512 and the insulator 514. Alternatively, impurities such as water and hydrogen can be inhibited from diffusing into the transistor 500 side from an interlayer insulating film and the like which are placed outside the insulator 581. Alternatively, oxygen contained in the insulator 524 and the like can be inhibited from diffusing into the substrate side through the insulator 512 and the insulator 514. Alternatively, oxygen contained in the insulator 580 and the like can be inhibited from diffusing into the components above the transistor 500 through the insulator 574 and the like. In this manner, it is preferable that the transistor 500 be surrounded by the insulator 512, the insulator 514, the insulator 571, the insulator 544, the insulator 574, the insulator 576, and the insulator 581, which have a function of inhibiting diffusion of oxygen and impurities such as water and hydrogen.

Here, an oxide having an amorphous structure is preferably used for the insulator 512, the insulator 514, the insulator 544, the insulator 571, the insulator 574, the insulator 576, and the insulator 581. For example, a metal oxide such as $AO_x$ (x is a given number greater than 0) or $MgO_y$ (y is a given number greater than 0) is preferably used. In such a metal oxide having an amorphous structure, an oxygen atom has a dangling bond and sometimes has a property of capturing or fixing hydrogen with the dangling bond. When such a metal oxide having an amorphous structure is used as the component of the transistor 500 or provided around the transistor 500, hydrogen contained in the transistor 500 or hydrogen present around the transistor 500 can be captured or fixed. In particular, hydrogen contained in the channel formation region of the transistor 500 is preferably captured or fixed. The metal oxide having an amorphous structure is used as the component of the transistor 500 or provided around the transistor 500, whereby the transistor 500 and a semiconductor device, which have favorable characteristics and high reliability, can be manufactured.

Although the insulator 512, the insulator 514, the insulator 544, the insulator 571, the insulator 574, the insulator 576, and the insulator 581 each preferably have an amorphous structure, a region having a polycrystalline structure may be partly formed. Alternatively, the insulator 512, the insulator 514, the insulator 544, the insulator 571, the insulator 574, the insulator 576, and the insulator 581 may each have a multilayer structure in which a layer having an amorphous structure and a layer having a polycrystalline structure are stacked. For example, a stacked-layer structure in which a layer having a polycrystalline structure is formed over a layer having an amorphous structure may be employed.

The insulator 512, the insulator 514, the insulator 544, the insulator 571, the insulator 574, the insulator 576, and the insulator 581 are deposited by a sputtering method, for example. Since a sputtering method does not need to use a molecule containing hydrogen as a deposition gas, the hydrogen concentrations in the insulator 512, the insulator 514, the insulator 544, the insulator 571, the insulator 574, the insulator 576, and the insulator 581 can be reduced. Note that the deposition method is not limited to a sputtering method, and a chemical vapor deposition (CVD) method, a molecular beam epitaxy (MBE) method, a pulsed laser deposition (PLD) method, an atomic layer deposition (ALD) method, or the like may be used as appropriate.

The resistivities of the insulator 512, the insulator 544, and the insulator 576 are preferably low in some cases. For example, by setting each of the resistivities of the insulator 512, the insulator 544, and the insulator 576 to approximately $1 \times 10^{13}$ $\Omega$km, the insulator 512, the insulator 544, and the insulator 576 can sometimes reduce charge up of the conductor 503, the conductor 542, the conductor 560, or the like in treatment using plasma or the like in the manufacturing process of a semiconductor device. The resistivities of the insulator 512, the insulator 544, and the insulator 576 are preferably higher than or equal to $1 \times 10^{10}$ $\Omega$cm and lower than or equal to $1 \times 10^{15}$ $\Omega$cm.

The insulator 516, the insulator 574, the insulator 580, and the insulator 581 each preferably have a lower permittivity than the insulator 514. When a material with a low permittivity is used for an interlayer film, parasitic capacitance generated between wirings can be reduced. For the insulator 516, the insulator 580, and the insulator 581, silicon oxide, silicon oxynitride, silicon oxide to which fluorine is added, silicon oxide to which carbon is added, silicon oxide to which carbon and nitrogen are added, porous silicon oxide, or the like is used as appropriate, for example.

The insulator 581 is preferably an insulator functioning as an interlayer film, a planarization film, or the like, for example.

The conductor 503 is placed to overlap with the oxide 530 and the conductor 560. Here, the conductor 503 is preferably provided to be embedded in an opening formed in the insulator 516. Part of the conductor 503 is embedded in the insulator 514 in some cases.

The conductor 503 includes the conductor 503a and the conductor 503b. The conductor 503a is provided in contact with a bottom surface and a sidewall of the opening. The conductor 503b is provided to be embedded in a recessed portion formed in the conductor 503a. Here, the upper portion of the conductor 503b is substantially level with the upper portion of the conductor 503a and the upper portion of the insulator 516.

Here, for the conductor 503a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, $NO$, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 503a is formed using a conductive material having a function of inhibiting diffusion of hydrogen, impurities such as hydrogen contained in the conductor 503b can be prevented from diffusing into the oxide 530 through the insulator 524 and the like. When the conductor 503a is formed using a conductive material having a function of inhibiting diffusion of oxygen, the conductivity of the conductor 503b can be inhibited from being lowered due to oxidation. As the conductive material having a function of inhibiting diffusion of oxygen, for example, titanium, titanium nitride, tantalum, tantalum nitride, ruthenium, or ruthenium oxide is preferably used. Thus, a single layer or stacked layers of the above conductive material may be used for the conductor 503a. For example, titanium nitride is used for the conductor 503a.

Moreover, a conductive material containing tungsten, copper, or aluminum as its main component is preferably used for the conductor 503b. For example, tungsten is used for the conductor 503b.

The conductor 503 sometimes functions as a second gate electrode. In that case, the threshold voltage (Vth) of the transistor 500 can be controlled by changing a potential applied to the conductor 503 not in conjunction with but independently of a potential applied to the conductor 560. In particular, Vth of the transistor 500 can be further increased and the off-state current of the transistor 500 can be reduced by applying a negative potential to the conductor 503. Thus, the drain current at the time when a potential applied to the conductor 560 is 0 V can be decreased in the case where a negative potential is applied to the conductor 503 than in the case where the negative potential is not applied to the conductor 503.

Note that in the case where the oxide 530 is a highly purified intrinsic oxide and as many impurities as possible are eliminated from the oxide 530, the transistor 500 can be expected to become normally-off (the threshold voltage of the transistor 500 can be higher than 0 V) in some cases with no application of a potential to the conductor 503 and/or the conductor 560. In that case, the conductor 560 and the conductor 503 are suitably connected to each other to be supplied with the same potential.

The electrical resistivity of the conductor 503 is designed in consideration of the potential applied to the conductor 503, and the thickness of the conductor 503 is determined in accordance with the electrical resistivity. The thickness of the insulator 516 is substantially equal to that of the conductor 503. The conductor 503 and the insulator 516 are preferably as thin as possible in the allowable range of the design of the conductor 503. When the thickness of the insulator 516 is reduced, the absolute amount of impurities such as hydrogen contained in the insulator 516 can be reduced, thereby reducing the amount of the impurities to be diffused into the oxide 530.

When seen from above, the conductor 503 is preferably provided to be larger than a region of the oxide 530 that overlaps with neither the conductor 542a nor the conductor 542b. As illustrated in FIG. 15B, it is particularly preferable that the conductor 503 extend to a region outside end portions of the oxide 530a and the oxide 530b in the channel width direction. That is, the conductor 503 and the conductor 560 preferably overlap with each other with the insulator therebetween on the outer side of the side surface of the oxide 530 in the channel width direction. With this structure, the channel formation region of the oxide 530 can be electrically surrounded by the electric field of the conductor 560 functioning as a first gate electrode and the electric field of the conductor 503 functioning as the second gate electrode. In this specification, a transistor structure in which a channel formation region is electrically surrounded by electric fields of a first gate and a second gate is referred to as a surrounded channel (S-channel) structure.

In this specification and the like, a transistor having the S-channel structure refers to a transistor having a structure in which a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

When the transistor 500 becomes normally-off and has the above-described S-Channel structure, the channel formation region can be electrically surrounded. Accordingly, the transistor 500 can be regarded as having a GAA (Gate All Around) structure or an LGAA (Lateral Gate All Around) structure. When the transistor 500 has the S-Channel structure, the GAA structure, or the LGAA structure, the channel formation region that is formed at an interface between the oxide 530 and the gate insulating film or in the vicinity of the interface can be the entire bulk of the oxide 530. In other words, the transistor 500 having the S-Channel structure, the GAA structure, or the LGAA structure can be what is called a Bulk-Flow type, in which a carrier path is used as the entire bulk. A transistor structure with a Bulk-Flow type can improve the density of current flowing through the transistor and thus can be expected to improve the on-state current of the transistor or increase the field-effect mobility of the transistor.

Furthermore, as illustrated in FIG. 15B, the conductor 503 is extended to function as a wiring as well. However, without limitation to this structure, a structure in which a conductor functioning as a wiring is provided below the conductor 503 may be employed. In addition, the conductor 503 is not necessarily provided in each transistor. For example, the conductor 503 may be shared by a plurality of transistors.

Although the transistor 500 having a structure in which the conductor 503 is a stack of the conductor 503a and the conductor 503b is illustrated, the present invention is not limited thereto. For example, the conductor 503 may be provided to have a single-layer structure or a stacked-layer structure of three or more layers.

The insulator 522 and the insulator 524 each function as a gate insulator.

It is preferable that the insulator 522 have a function of inhibiting diffusion of hydrogen (e.g., at least one of a hydrogen atom, a hydrogen molecule, and the like). In addition, it is preferable that the insulator 522 have a function of inhibiting diffusion of oxygen (e.g., at least one of an oxygen atom, an oxygen molecule, and the like). For example, the insulator 522 preferably has a function of inhibiting diffusion of one or both of hydrogen and oxygen as compared to the insulator 524.

As the insulator 522, an insulator containing an oxide of one or both of aluminum and hafnium that is an insulating material, is preferably used. For the insulator, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 to the substrate side and diffusion of impurities such as hydrogen from the periphery of the transistor 500 into the oxide 530. Thus, providing the insulator 522 can inhibit diffusion of impurities such as hydrogen into the transistor 500 and inhibit generation of oxygen vacancies in the oxide 530. Moreover, the conductor 503 can be inhibited from reacting with oxygen contained in the insulator 524 or the oxide 530.

Alternatively, the above insulator may be added with aluminum oxide, bismuth oxide, germanium oxide, niobium oxide, silicon oxide, titanium oxide, tungsten oxide, yttrium oxide, or zirconium oxide, for example. Alternatively, these insulators may be subjected to nitriding treatment. A stack of silicon oxide, silicon oxynitride, or silicon nitride over these insulators may be used for the insulator 522.

For example, a single layer or stacked layers of an insulator containing what is called a high-k material such as aluminum oxide, hafnium oxide, tantalum oxide, or zirconium oxide may be used for the insulator 522. As miniaturization and high integration of transistors progress, a problem such as leakage current may arise because of a thinner gate insulator. When a high-k material is used for an insulator functioning as the gate insulator, a gate potential at the time when the transistor operates can be reduced while the physical thickness of the gate insulator is maintained. Furthermore, a substance with a high permittivity such as lead zirconate titanate (PZT), strontium titanate ($SrTiO_3$), or $(Ba,Sr)TiO_3$ (BST) can be used for the insulator 522 in some cases.

Silicon oxide or silicon oxynitride, for example, is used as appropriate for the insulator 524 that is in contact with the oxide 530.

In a manufacturing process of the transistor 500, heat treatment is preferably performed with the surface of the oxide 530 exposed. For example, the heat treatment is performed preferably at a temperature higher than or equal to 100° C. and lower than or equal to 600° C., further preferably higher than or equal to 350° C. and lower than or equal to 550° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 530 to reduce oxygen vacancies ($V_O$). The heat treatment may be performed under reduced pressure. Alternatively, the heat treatment may be performed in an atmosphere containing an oxidizing gas at 10 ppm or more, 1% or more, or 10% or more in order to compensate for released oxygen, after heat treatment in a nitrogen gas or inert gas atmosphere. Alternatively, the heat treatment may be performed in a nitrogen gas or inert gas atmosphere successively after heat treatment is performed in an atmosphere containing an oxidizing gas at 10 ppm or more, 1% or more, or 10% or more.

Note that oxygen adding treatment performed on the oxide 530 can promote a reaction in which oxygen vacancies in the oxide 530 are repaired with supplied oxygen, i.e., a reaction of "$V_O + O \rightarrow$ null". Furthermore, hydrogen remaining in the oxide 530 reacts with supplied oxygen, so that the hydrogen can be removed in a form of $H_2O$ (dehydration). This can inhibit recombination of hydrogen remaining in the oxide 530 with oxygen vacancies and formation of $V_OH$.

Note that the insulator 522 and the insulator 524 may each have a stacked-layer structure of two or more layers. In that case, without limitation to a stacked-layer structure formed of the same material, a stacked-layer structure formed of different materials may be employed. The insulator 524 may be formed into an island shape so as to overlap with the oxide 530a. In this case, the insulator 544 is in contact with the side surface of the insulator 524 and the top surface of the insulator 522.

The conductor 542a and the conductor 542b are provided in contact with the top surface of the oxide 530b. The conductor 542a and the conductor 542b each function as a source electrode or a drain electrode of the transistor 500.

For the conductor 542 (the conductor 542a and the conductor 542b), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. For another example, ruthenium oxide, ruthenium nitride, an oxide containing strontium and ruthenium, or an oxide containing lanthanum and nickel may be used. These materials are preferable because they are each a conductive material that is not easily oxidized or a material that maintains the conductivity even after absorbing oxygen.

Note that hydrogen contained in the oxide 530b or the like diffuses into the conductor 542a or the conductor 542b in some cases. In particular, when a nitride containing tantalum is used for the conductor 542a and the conductor 542b, hydrogen contained in the oxide 530b or the like is likely to diffuse into the conductor 542a or the conductor 542b, and the diffused hydrogen is bonded to nitrogen contained in the conductor 542a or the conductor 542b in some cases. That is, hydrogen contained in the oxide 530b or the like is absorbed by the conductor 542a or the conductor 542b in some cases.

No curved surface is preferably formed between the side surface of the conductor 542 and a top surface of the conductor 542. The conductor 542 without curved surface can have a large cross-sectional area in the channel width direction. Accordingly, the conductivity of the conductor 542 is increased, so that the on-state current of the transistor 500 can be increased.

The insulator 571a is provided in contact with the top surface of the conductor 542a, and the insulator 571b is provided in contact with the top surface of the conductor 542b. The insulator 571 preferably functions as at least a barrier insulating film against oxygen. Thus, the insulator 571 preferably has a function of inhibiting oxygen diffusion. For example, the insulator 571 preferably has a function of further inhibiting diffusion of oxygen as compared to the insulator 580. For example, a nitride containing silicon, such as silicon nitride may be used for the insulator 571. The insulator 571 preferably has a function of capturing impurities such as hydrogen. In that case, for the insulator 571, a metal oxide having an amorphous structure, for example, an insulator such as aluminum oxide or magnesium oxide, may be used. It is particularly preferable to use aluminum oxide having an amorphous structure or aluminum oxide having an amorphous structure for the insulator 571 in which case hydrogen can sometimes be captured or fixed more effectively. Accordingly, the transistor 500 and a semiconductor device, which have favorable characteristics and high reliability, can be manufactured.

The insulator 544 is provided to cover the insulator 524, the oxide 530a, the oxide 530b, the conductor 542, and the insulator 571. The insulator 544 preferably has a function of capturing and fixing hydrogen. In that case, the insulator 544 preferably includes silicon nitride, or a metal oxide having an amorphous structure, for example, an insulator such as aluminum oxide or magnesium oxide. Alternatively, for example, a stacked film of aluminum oxide and silicon nitride over the aluminum oxide may be used for the insulator 544.

When the above insulator 571 and the insulator 544 are provided, the conductor 542 can be surrounded by the insulators having a barrier property against oxygen. That is, oxygen contained in the insulator 524 and the insulator 580 can be prevented from diffusing into the conductor 542. As a result, the conductor 542 can be inhibited from being directly oxidized by oxygen contained in the insulator 524 and the insulator 580, so that an increase in resistivity and a reduction in on-state current can be inhibited.

The insulator 552 functions as part of the gate insulator. As the insulator 552, a barrier insulating film against oxygen is preferably used. As the insulator 552, an insulator that can be used as the insulator 574 described above may be used. An insulator containing an oxide of one or both of aluminum and hafnium is preferably used as the insulator 552. For the insulator, aluminum oxide, hafnium oxide, an oxide containing aluminum and hafnium (hafnium aluminate), an oxide containing hafnium and silicon (hafnium silicate), or the like can be used. In this embodiment, aluminum oxide is used for the insulator 552. In this case, the insulator 552 is an insulator containing at least oxygen and aluminum.

As illustrated in FIG. 15B, the insulator 552 is provided in contact with the top surface and the side surface of the oxide 530b, the side surface of the oxide 530a, the side surface of the insulator 524, and the top surface of the insulator 522. That is, the regions of the oxide 530a, the oxide 530b, and the insulator 524 that overlap with the conductor 560 are covered with the insulator 552 in the cross section in the channel width direction. With this structure, the insulator 552 having a barrier property against oxygen can prevent release of oxygen from the oxide 530a and the oxide 530b at the time of heat treatment or the like. This can inhibit formation of oxygen vacancies ($V_O$) in the oxide 530a and the oxide 530b. Therefore, oxygen vacancies ($V_O$) and $V_OH$ formed in the region 530bc can be reduced. Thus, the transistor 500 can have favorable electrical characteristics and improved reliability.

Even when an excess amount of oxygen is contained in the insulator 580, the insulator 550, and the like, oxygen can be inhibited from being excessively supplied to the oxide 530a and the oxide 530b. Thus, the region 530ba and the region 530bb are prevented from being excessively oxidized by oxygen through the region 530bc, and a reduction in on-state current or field-effect mobility of the transistor 500 can be inhibited.

As illustrated in FIG. 15A, the insulator 552 is provided in contact with the side surfaces of the conductor 542, the insulator 544, the insulator 571, and the insulator 580. This can inhibit formation of an oxide film on the side surface of the conductor 542 by oxidization of the side surface. Accordingly, a reduction in the on-state current or field-effect mobility of the transistor 500 can be inhibited.

Furthermore, the insulator 552 needs to be provided in an opening formed in the insulator 580 and the like, together with the insulator 554, the insulator 550, and the conductor 560. The thickness of the insulator 552 is preferably small for miniaturization of the transistor 500. The thickness of the insulator 552 is preferably greater than or equal to 0.1 nm, greater than or equal to 0.5 nm, or greater than or equal to 1.0 nm, and less than or equal to 1.0 nm, less than or equal to 3.0 nm, or less than or equal to 5.0 nm. Note that the above-described lower limits and upper limits can be combined with each other. In that case, at least part of the insulator 552 includes a region having the above-described thickness. The thickness of the insulator 552 is preferably smaller than that of the insulator 550. In that case, at least part of the insulator 552 includes a region having a thickness smaller than that of the insulator 550.

To form the insulator 552 having a small thickness as described above, an ALD method is preferably used for deposition. Examples of an ALD method include a thermal ALD method, in which a precursor and a reactant react with each other only by thermal energy, and a PEALD (Plasma Enhanced ALD) method, in which a reactant excited by plasma is used. The PECVD method is sometimes preferable because deposition at lower temperatures is possible due to the use of plasma.

An ALD method, which enables atomic layers to be deposited one by one using self-regulating characteristics of atoms, has advantages such as deposition of an extremely thin film, deposition on a component with a high aspect ratio, deposition of a film with a small number of defects such as pinholes, deposition with excellent coverage, and low-temperature deposition. Therefore, the insulator 552 can be formed on the side surface of the opening formed in the insulator 580 and the like to have a small thickness as described above and to have favorable coverage.

Note that some of precursors used in an ALD method contain carbon or the like. Thus, in some cases, a film provided by an ALD method contains impurities such as carbon in a larger amount than a film provided by another deposition method. Note that impurities can be quantified by secondary ion mass spectrometry (SIMS) or X-ray photo-electron spectroscopy (XPS).

The insulator 550 functions as part of the gate insulator. The insulator 550 is preferably placed in contact with a top surface of the insulator 552. The insulator 550 can be formed using silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable. In this case, the insulator 550 is an insulator containing at least oxygen and silicon.

As in the insulator 524, the concentration of an impurity such as water or hydrogen in the insulator 550 is preferably reduced. The thickness of the insulator 550 is preferably greater than or equal to 1 nm or greater than or equal to 0.5 nm and less than or equal to 15 nm or less than or equal to 20 nm. Note that the above-described lower limits and upper limits can be combined with each other. In that case, at least part of the insulator 550 includes a region having the above-described thickness.

Although FIG. 15A, FIG. 15B, or the like illustrates the insulator 550 as a single layer, the present invention is not limited to this structure, and a stacked-layer structure of two or more layers may be employed. For example, as illustrated in FIG. 17B, the insulator 550 may have a stacked-layer structure including two layers of an insulator 550a and an insulator 550b over the insulator 550a.

Figure 17B:
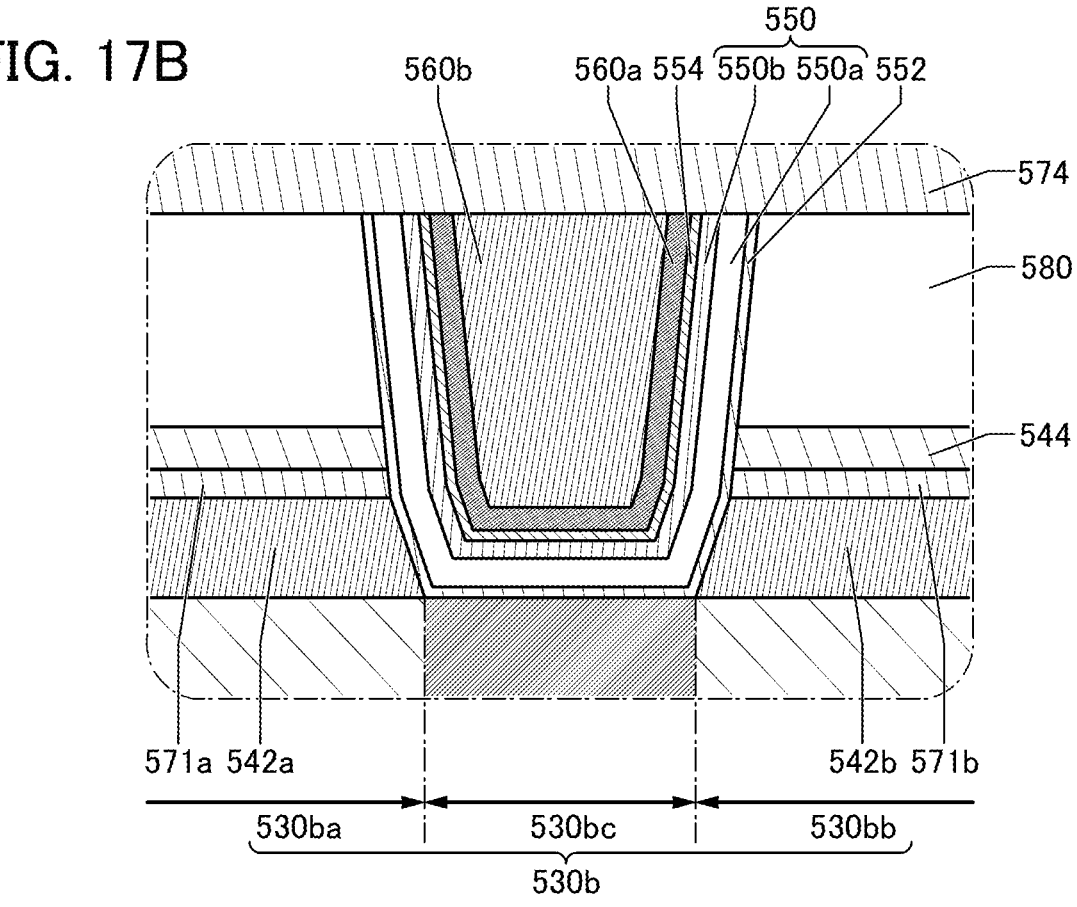

In the case where the insulator 550 has a stacked-layer structure of two layers as illustrated in FIG. 17B, it is preferable that the insulator 550a in a lower layer be formed using an insulator that is likely to transmit oxygen and the insulator 550b in an upper layer be formed using an insulator having a function of inhibiting oxygen diffusion. With such a structure, oxygen contained in the insulator 550a can be inhibited from diffusing into the conductor 560. That is, a reduction in the amount of oxygen supplied to the oxide 530 can be inhibited. In addition, oxidation of the conductor 560 due to oxygen contained in the insulator 550a can be inhibited. For example, it is preferable that the insulator 550a be provided using any of the above-described materials that can be used for the insulator 550 and the insulator 550b be provided using an insulator containing an oxide of one or both of aluminum and hafnium. For the insulator, aluminum oxide, hafnium oxide, an oxide containing aluminum and hafnium (hafnium aluminate), an oxide containing hafnium and silicon (hafnium silicate), or the like can be used. In this embodiment, hafnium oxide is used for the insulator 550b. In this case, the insulator 550b is an insulator containing at least oxygen and hafnium. The thickness of the insulator 550b is preferably greater than or equal to 0.5 nm or greater than or equal to 1.0 nm, and less than or equal to 3.0 nm or less than or equal to 5.0 nm. Note that the above-described lower limits and upper limits can be combined with each other. In that case, at least part of the insulator 550b includes a region having the above-described thickness.

In the case where silicon oxide, silicon oxynitride, or the like is used for the insulator 550a, an insulating material that is a high-k material having a high relative permittivity may be used for the insulator 550b. The gate insulator having a stacked-layer structure of the insulator 550a and the insulator 550b can be thermally stable and can have a high relative permittivity. Thus, a gate potential that is applied during the operation of the transistor can be reduced while the physical thickness of the gate insulator is maintained. In addition, the equivalent oxide thickness (EOT) of the insulator functioning as the gate insulator can be reduced. Therefore, the withstand voltage of the insulator 550 can be increased.

The insulator 554 functions as part of a gate insulator. As the insulator 554, a barrier insulating film against hydrogen is preferably used. This can prevent diffusion of impurities such as hydrogen contained in the conductor 560 into the insulator 550 and the oxide 530b. As the insulator 554, an insulator that can be used as the insulator 576 described above may be used. For example, silicon nitride deposited by a PEALD method is used as the insulator 554. In this case, the insulator 554 is an insulator containing at least nitrogen and silicon.

Furthermore, the insulator 554 may have a barrier property against oxygen. Thus, oxygen contained in the insulator 550 can be inhibited from diffusing into the conductor 560.

Furthermore, the insulator 554 needs to be provided in an opening formed in the insulator 580 and the like, together with the insulator 552, the insulator 550, and the conductor 560. The thickness of the insulator 554 is preferably small for miniaturization of the transistor 500. The thickness of the insulator 554 is preferably greater than or equal to 0.1 nm, greater than or equal to 0.5 nm, or greater than or equal to 1.0 nm, and less than or equal to 3.0 nm or less than or equal to 5.0 nm. Note that the above-described lower limits and upper limits can be combined with each other. In that case, at least part of the insulator 554 includes a region having the above-described thickness. The thickness of the insulator 554 is preferably smaller than that of the insulator 550. In that case, at least part of the insulator 554 includes a region having a thickness smaller than that of the insulator 550.

The conductor 560 functions as the first gate electrode of the transistor 500. The conductor 560 preferably includes the conductor 560a and the conductor 560b placed over the conductor 560a. For example, the conductor 560a is preferably placed to cover the bottom surface and the side surface of the conductor 560b. As illustrated in FIG. 15A and FIG. 15B, the upper portion of the conductor 560 is substantially level with the upper portion of the insulator 550. Note that although the conductor 560 has a two-layer structure of the conductor 560a and the conductor 560b in FIG. 15A and FIG. 15B, the conductor 560 can have, instead of the two-layer structure, a single-layer structure or a stacked-layer structure of three or more layers.

For the conductor 560a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., at least one of an oxygen atom, an oxygen molecule, and the like).

In addition, when the conductor 560a has a function of inhibiting diffusion of oxygen, the conductivity of the conductor 560b can be inhibited from being lowered because of oxidation due to oxygen contained in the insulator 550. As the conductive material having a function of inhibiting diffusion of oxygen, for example, titanium, titanium nitride, tantalum, tantalum nitride, ruthenium, or ruthenium oxide is preferably used.

Furthermore, the conductor 560 also functions as a wiring and thus a conductor having high conductivity is preferably used as the conductor 560. For example, a conductive material containing tungsten, copper, or aluminum as its main component can be used for the conductor 560b. The conductor 560b can have a stacked-layer structure. Specifically, for example, the conductor 560b can have a stacked-layer structure of titanium or titanium nitride and the above conductive material.

In the transistor 500, the conductor 560 is formed in a self-aligned manner to fill the opening formed in the insulator 580 and the like. The formation of the conductor 560 in this manner allows the conductor 560 to be placed properly in a region between the conductor 542a and the conductor 542b without positional alignment.

As illustrated in FIG. 15B, in the channel width direction of the transistor 500, with reference to a bottom surface of the insulator 522, the level of the bottom surface of the conductor 560 in a region where the conductor 560 and the oxide 530b do not overlap with each other is preferably lower than the level of a bottom surface of the oxide 530b. When the conductor 560 functioning as the gate electrode covers the side surface and the top surface of the channel formation region of the oxide 530b with the insulator 550 and the like therebetween, the electric field of the conductor 560 can easily act on the entire channel formation region of the oxide 530b. Thus, the on-state current of the transistor 500 can be increased and the frequency characteristics of the transistor 500 can be improved. The difference between the level of the bottom surface of the conductor 560 in a region where neither the oxide 530a nor the oxide 530b overlaps with the conductor 560 and the level of the bottom surface of the oxide 530b, with reference to the bottom surface of the insulator 522, is preferably greater than or equal to 0 nm, greater than or equal to 3 nm, or greater than or equal to 5 nm, and less than or equal to 20 nm, less than or equal to 50 nm, or less than or equal to 100 nm. Note that the above-described lower limits and upper limits can be combined with each other.

The insulator 580 is provided over the insulator 544, and the opening is formed in a region where the insulator 550 and the conductor 560 are to be provided. In addition, the top surface of the insulator 580 may be planarized.

The insulator 580 functioning as an interlayer film preferably has a low permittivity. When a material with a low permittivity is used for an interlayer film, parasitic capacitance generated between wirings can be reduced. The insulator 580 is preferably provided using a material similar to that for the insulator 516, for example. In particular, silicon oxide and silicon oxynitride, which have thermal stability, are preferable. Materials such as silicon oxide, silicon oxynitride, and porous silicon oxide are particularly preferable because they can easily form a region containing oxygen to be released by heating.

The concentration of impurities such as water and hydrogen in the insulator 580 is preferably reduced. An oxide containing silicon, such as silicon oxide or silicon oxynitride, is used as appropriate for the insulator 580, for example.

The insulator 574 preferably functions as a barrier insulating film that inhibits impurities such as water and hydrogen from diffusing into the insulator 580 from above and preferably has a function of capturing impurities such as hydrogen. The insulator 574 preferably functions as a barrier insulating film that inhibits a passage of oxygen. For the insulator 574, a metal oxide having an amorphous structure, for example, an insulator such as aluminum oxide, is used. In this case, the insulator 574 is an insulator containing at least oxygen and aluminum. The insulator 574, which has a function of capturing impurities such as hydrogen, is provided in contact with the insulator 580 in a region sandwiched between the insulator 512 and the insulator 581, whereby impurities such as hydrogen contained in the insulator 580 and the like can be captured and the amount of hydrogen in the region can be constant. It is particularly preferable to use aluminum oxide having an amorphous structure for the insulator 574, in which case hydrogen can sometimes be captured or fixed more effectively. Accordingly, the transistor 500 and a semiconductor device, which have favorable characteristics and high reliability, can be manufactured.

The insulator 576 functions as a barrier insulating film that inhibits impurities such as water and hydrogen from diffusing into the insulator 580 from above. The insulator 576 is placed over the insulator 574. The insulator 576 is preferably formed using a nitride containing silicon, such as silicon nitride or silicon nitride oxide. For example, silicon nitride deposited by a sputtering method may be used for the insulator 576. When the insulator 576 is deposited by a sputtering method, a high-density silicon nitride film can be formed. To obtain the insulator 576, silicon nitride deposited by a PEALD method or a CVD method may be stacked over silicon nitride deposited by a sputtering method.

One of a first terminal and a second terminal of the transistor 500 is electrically connected to a conductor 540a serving as a plug, and the other of the first terminal and the second terminal of the transistor 500 is electrically connected to a conductor 540*b*. Note that in this specification and the like, the conductor 540*a* and the conductor 540*b* are collectively referred to as the conductor 540.

The conductor 540*a* is provided in a region overlapping with the conductor 542*a*, for example. Specifically, an opening portion is formed in the insulator 571, the insulator 544, the insulator 580, the insulator 574, the insulator 576, and the insulator 581 illustrated in FIG. 15A and in an insulator 582 and an insulator 586 illustrated in FIG. 14 in the region overlapping with the conductor 542*a*, and the conductor 540*a* is provided inside the opening portion. The conductor 540*b* is provided in a region overlapping with the conductor 542*b*, for example. Specifically, an opening portion is formed in the insulator 571, the insulator 544, the insulator 580, the insulator 574, the insulator 576, and the insulator 581 illustrated in FIG. 15A and in the insulator 582 and the insulator 586 illustrated in FIG. 14 in the region overlapping with the conductor 542*b*, and the conductor 540*b* is provided inside the opening portion. Note that the insulator 582 and the insulator 586 will be described later.

As illustrated in FIG. 15A, an insulator 541*a* as an insulator having an impurity barrier property may be provided between the conductor 540*a* and the side surface of the opening portion in the region overlapping with the conductor 542*a*. Similarly, an insulator 541*b* as an insulator having an impurity barrier property may be provided between the conductor 540*b* and the side surface of the opening portion in the region overlapping with the conductor 542*b*. Note that in this specification and the like, the insulator 541*a* and the insulator 541*b* are collectively referred to as the insulator 541.

For the conductor 540*a* and the conductor 540*b*, a conductive material containing tungsten, copper, or aluminum as its main component is preferably used. The conductor 540*a* and the conductor 540*b* may each have a stacked-layer structure.

In the case where the conductor 540 has a stacked-layer structure, a conductive material having a function of inhibiting a passage of impurities such as water and hydrogen is preferably used for a first conductor placed in the vicinity of the insulator 574, the insulator 576, the insulator 581, the insulator 580, the insulator 544, and the insulator 571. For example, tantalum, tantalum nitride, titanium, titanium nitride, ruthenium, ruthenium oxide, or the like is preferably used. The conductive material having a function of inhibiting a passage of impurities such as water and hydrogen may be used as a single layer or stacked layers. Moreover, impurities such as water and hydrogen contained in layers above the insulator 576 can be inhibited from entering the oxide 530 through the conductor 540*a* and the conductor 540*b*.

For the insulator 541*a* and the insulator 541*b*, a barrier insulating film that can be used for the insulator 544 or the like may be used. For the insulator 541*a* and the insulator 541*b*, for example, an insulator such as silicon nitride, aluminum oxide, or silicon nitride oxide may be used. Since the insulator 541*a* and the insulator 541*b* are provided in contact with the insulator 574, the insulator 576, and the insulator 571, impurities such as water and hydrogen contained in the insulator 580 or the like can be inhibited from entering the oxide 530 through the conductor 540*a* and the conductor 540*b*. In particular, silicon nitride is suitable because of its high blocking property against hydrogen. Furthermore, oxygen contained in the insulator 580 can be prevented from being absorbed by the conductor 540*a* and the conductor 540*b*.

When the insulator 541*a* and the insulator 541*b* each have a stacked-layer structure as illustrated in FIG. 15A, a first insulator in contact with an inner wall of the opening in the insulator 580 and the like and a second insulator on the inner side of the first insulator are preferably formed using a combination of a barrier insulating film against oxygen and a barrier insulating film against hydrogen.

For example, aluminum oxide deposited by an ALD method may be used as the first insulator and silicon nitride deposited by a PEALD method may be used as the second insulator. With this structure, oxidation of the conductor 540 can be inhibited, and hydrogen can be inhibited from entering the conductor 540.

Although the first insulator of the insulator 541 and a second conductor of the insulator 541 are stacked in the transistor 500, the present invention is not limited thereto. For example, the insulator 541 may have a single-layer structure or a stacked-layer structure of three or more layers. Although the first conductor of the conductor 540 and the second conductor of the conductor 540 are stacked in the transistor 500, the present invention is not limited thereto. For example, the conductor 540 may have a single-layer structure or a stacked-layer structure of three or more layers.

As illustrated in FIG. 14, a conductor 610, a conductor 612, and the like serving as wirings may be placed in contact with the upper portion of the conductor 540*a* and the upper portion of the conductor 540*b*. For the conductor 610 and the conductor 612, a conductive material containing tungsten, copper, or aluminum as its main component is preferably used. The conductors can each have a stacked-layer structure. Specifically, the conductors may each be a stack of titanium or a titanium nitride and any of the above conductive materials, for example. Note that the conductors may each be formed to be embedded in an opening provided in an insulator.

The structure of the transistor included in the semiconductor device of one embodiment of the present invention is not limited to that of the transistor 500 illustrated in FIG. 14, FIG. 15A, FIG. 15B, and FIG. 16. The structure of the transistor included in the semiconductor device of one embodiment of the present invention may be changed in accordance with circumstances.

Figure 18:
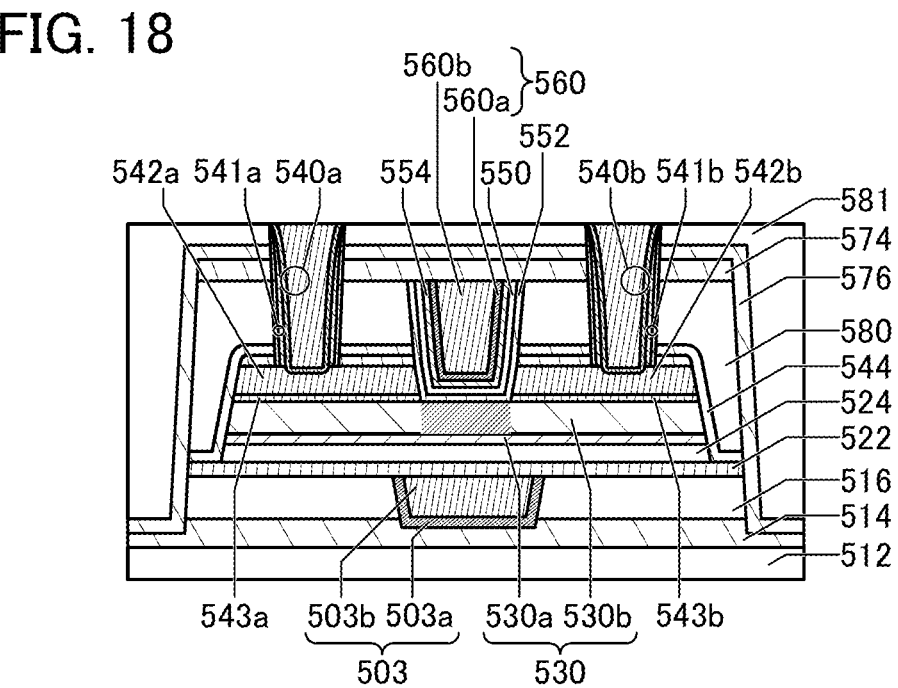
FIG. 18 is a schematic cross-sectional view illustrating a structure example of a transistor.

For example, the transistor 500 illustrated in FIG. 14, FIG. 15A, FIG. 15B, and FIG. 16 may have a structure illustrated in FIG. 18. The transistor in FIG. 18 is different from the transistor 500 illustrated in FIG. 14, FIG. 15A, FIG. 15B, and FIG. 16 in including an oxide 543*a* and an oxide 543*b*. Note that in this specification and the like, the oxide 543*a* and the oxide 543*b* are collectively referred to as an oxide 543. The cross section in the channel width direction of the transistor in FIG. 18 can have a structure similar to that of the cross section of the transistor 500 illustrated in FIG. 15B.

The oxide 543*a* is provided between the oxide 530*b* and the conductor 542*a*, and the oxide 543*b* is provided between the oxide 530*b* and the conductor 542*b*. Here, the oxide 543*a* is preferably in contact with the top surface of the oxide 530*b* and a bottom surface of the conductor 542*a*. The oxide 543*b* is preferably in contact with the top surface of the oxide 530*b* and a bottom surface of the conductor 542*b*.

The oxide 543 preferably has a function of inhibiting a passage of oxygen. The oxide 543 having a function of inhibiting a passage of oxygen is preferably placed between the oxide 530*b* and the conductor 542 functioning as the source electrode or the drain electrode, in which case the electrical resistance between the conductor 542 and the oxide 530*b* can be reduced. Such a structure can improve the electrical characteristics, field-effect mobility, and reliability of the transistor 500 in some cases.

A metal oxide containing the element M may be used as the oxide 543. In particular, aluminum, gallium, yttrium, or tin is preferably used as the element M. The concentration of the element M in the oxide 543 is preferably higher than that in the oxide 530b. Furthermore, gallium oxide may be used for the oxide 543. A metal oxide such as an In-M-Zn oxide may be used for the oxide 543. Specifically, the atomic ratio of the element M to In in the metal oxide used for the oxide is preferably greater than the atomic ratio of the element M to In in the metal oxide used for the oxide 530b. The thickness of the oxide 543 is preferably greater than or equal to 0.5 nm or greater than or equal to 1 nm, and less than or equal to 2 nm, less than or equal to 3 nm, or less than or equal to 5 nm. Note that the above-described lower limits and upper limits can be combined with each other. The oxide 543 preferably has crystallinity. In the case where the oxide 543 has crystallinity, release of oxygen from the oxide 530 can be suitably inhibited. When the oxide 543 has a hexagonal crystal structure, for example, release of oxygen from the oxide 530 can sometimes be inhibited.

The insulator 582 is provided over the insulator 581, and the insulator 586 is provided over the insulator 582.

A substance having a barrier property against oxygen and hydrogen is preferably used for the insulator 582. Thus, a material similar to that for the insulator 514 can be used for the insulator 582. For the insulator 582, a metal oxide such as aluminum oxide, hafnium oxide, or tantalum oxide is preferably used, for example.

For the insulator 586, a material similar to that for the insulator 320 can be used. Furthermore, when a material with a comparatively low permittivity is used for these insulators, parasitic capacitance generated between wirings can be reduced. A silicon oxide film, a silicon oxynitride film, or the like can be used as the insulator 586, for example.

Next, the capacitor 600 and peripheral wirings or plugs included in the semiconductor devices illustrated in FIG. 14 and FIG. 16 will be described. Note that the capacitor 600 and the wiring and/or the plug are provided above the transistor 500 illustrated in FIG. 14 and FIG. 16.

The capacitor 600 includes the conductor 610, a conductor 620, and an insulator 630, for example.

The conductor 610 is provided over one of the conductor 540a and the conductor 540b, the conductor 546, and the insulator 586. The conductor 610 has a function of one of a pair of electrodes of the capacitor 600.

The conductor 612 is provided over the other of the conductor 540a and the conductor 540b and the insulator 586. The conductor 612 has a function of a plug, a wiring, a terminal, or the like for electrically connecting a circuit element, a wiring, or the like placed above to the transistor 500.

Note that the conductor 612 and the conductor 610 may be formed at the same time.

As the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in FIG. 14; however, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The insulator 630 is provided over the insulator 586 and the conductor 610. The insulator 630 functions as a dielectric sandwiched between the pair of electrodes of the capacitor 600.

As the insulator 630, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or zirconium oxide can be used. The insulator 630 can be provided to have a stacked-layer structure or a single-layer structure using any of the above materials.

For another example, the insulator 630 may have a stacked-layer structure using a material with high dielectric strength, such as silicon oxynitride, and a high-permittivity (high-k) material. In the capacitor 600 having such a structure, a sufficient capacitance can be ensured owing to the high-permittivity (high-k) insulator, and the dielectric strength can be increased owing to the insulator with high dielectric strength; hence, the electrostatic breakdown of the capacitor 600 can be inhibited.

Examples of an insulator that is the high-permittivity (high-k) material (a material having a high relative permittivity) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Alternatively, for example, a single layer or stacked layers of an insulator containing a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST) may be used for the insulator 630. For the insulator 630, a compound containing hafnium and zirconium may be used, for example. As miniaturization and high integration of semiconductor devices progress, a problem such as leakage current from a transistor, a capacitor, or the like might arise because of a thinner gate insulator and a thinner dielectric used in the capacitor. When a high-k material is used for an insulator functioning as the gate insulator and the dielectric used in the capacitor, a gate potential during the operation of the transistor can be lowered and the capacitance of the capacitor can be ensured while the physical thicknesses of the gate insulator and the dielectric are maintained.

The conductor 620 is provided to overlap with the conductor 610 with the insulator 630 therebetween. The conductor 610 has a function of one of the pair of electrodes of the capacitor 600.

For the conductor 620, a conductive material such as a metal material, an alloy material, or a metal oxide material can be used. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, is used. For example, a material that can be used for the conductor 610 can be used for the conductor 620. The conductor 620 may have a stacked-layer structure of two or more layers instead of a single-layer structure.

An insulator 640 is provided over the conductor 620 and the insulator 630. a film having a barrier property that prevents hydrogen, impurities, or the like from diffusing into the region where the transistor 500 is provided, for example, is preferably used for the insulator 640. Thus, a material similar to that for the insulator 324 can be used.

An insulator 650 is provided over the insulator 640. The insulator 650 can be provided using a material similar to that for the insulator 320. The insulator 650 may function as a planarization film that covers an uneven shape thereunder. Thus, any of the materials that can be used for the insulator 324, for example, can be used for the insulator 650.

Although the capacitor 600 illustrated in FIG. 14 and FIG. 16 is a planar capacitor, the shape of the capacitor is not limited thereto. For example, the capacitor 600 may be a cylindrical capacitor instead of a planar capacitor.

A wiring layer may be provided above the capacitor 600. For example, in FIG. 14, an insulator 411, an insulator 412, an insulator 413, and an insulator 414 are provided in this order above the insulator 650. In addition, a conductor 416 serving as a plug or a wiring is provided in the insulator 411, the insulator 412, and the insulator 413. The conductor 416 can be provided, for example, in a region overlapping with a conductor 660 to be described later.

In addition, in the insulator 630, the insulator 640, and the insulator 650, an opening portion is provided in a region overlapping with the conductor 612, and the conductor 660 is provided to fill the opening portion. The conductor 660 serves as a plug or a wiring that is electrically connected to the conductor 416 included in the above-described wiring layer.

Like the insulator 324 or the like, an insulator having a barrier property against impurities such as water and hydrogen, for example, is preferably used for the insulator 411 and the insulator 414. Thus, any of the materials that can be used for the insulator 324 or the like, for example, can be used for the insulator 411 and the insulator 414.

Like the insulator 326, an insulator having a comparatively low relative permittivity is preferably used for the insulator 412 and the insulator 413, for example, to reduce parasitic capacitance generated between wirings.

The conductor 612 and the conductor 416 can be provided using materials similar to those for the conductor 328 and the conductor 330, for example.

Structure Examples of Transistor and Ferroelectric Capacitor

Next, a structure in which a ferroelectric capacitor is provided in and around the transistor 500 including a metal oxide in its channel formation region will be described.

Figure 19:
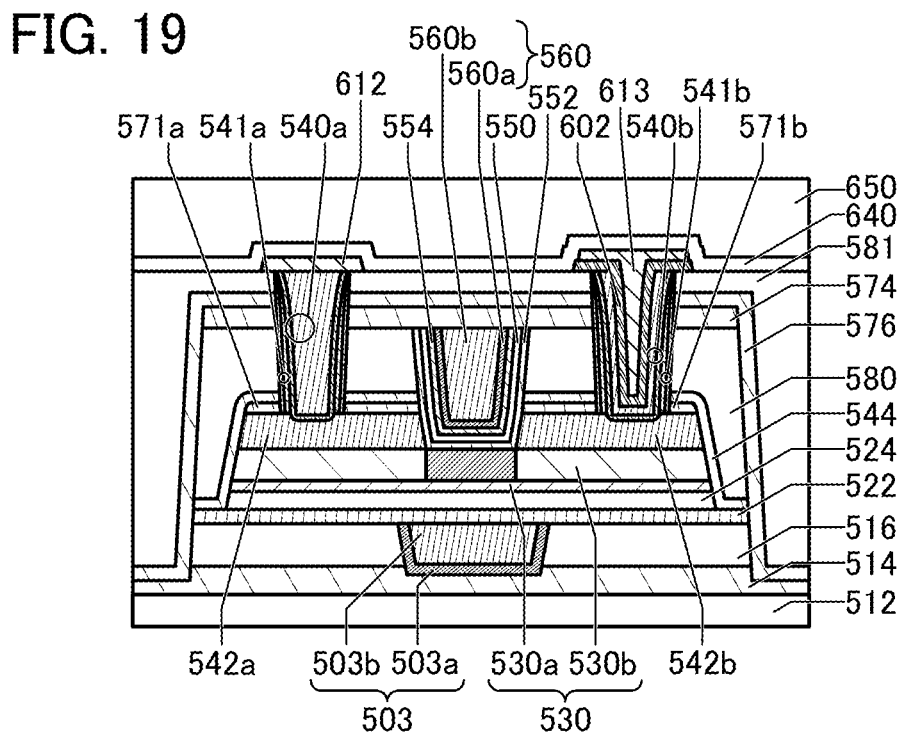
FIG. 19 is a schematic cross-sectional view illustrating a structure example of a transistor.

FIG. 19 illustrates a structure example of a transistor in which a dielectric that can have ferroelectricity is provided in the transistor 500 in FIG. 14, FIG. 15A, or the like.

In the transistor illustrated in FIG. 19, an insulator 602 is provided in the opening portion provided in the insulator 544, the insulator 571b, the insulator 580, the insulator 574, the insulator 576, and the insulator 581 in a region overlapping with the conductor 542b. Specifically, in the opening portion, the insulator 541b is provided on a side surface of the opening portion, the conductor 540b is provided over the insulator 541b and the conductor 542b that is a bottom portion of the opening portion, the insulator 602 is provided in part of a region of the insulator 581 and over the conductor 540b, and a conductor 613 is provided over the insulator 602 to fill the rest of the opening portion.

As another specific example, in the opening portion, the insulator 541b may be provided on the side surface of the opening portion; the conductor 540b may be provided over the insulator 541b; the insulator 602 may be provided in part of the region of the insulator 581, over the conductor 540b, and over the conductor 542b that is the bottom portion of the opening portion; and the conductor 613 may be provided over the insulator 602 to fill the rest of the opening portion.

For the insulator 602, a dielectric that can have ferroelectricity can be used, for example. A structure including conductors provided over and below the dielectric functions as a ferroelectric capacitor.

As the dielectric that can have ferroelectricity, hafnium oxide or a material containing hafnium oxide and zirconium oxide is preferable because it can have ferroelectricity even when being processed into a thin film of several nanometers. Here, the thickness of the insulator 602 can be less than or equal to 100 nm, preferably less than or equal to 50 nm, further preferably less than or equal to 10 nm. When the insulator 602 is made thin, a semiconductor device can be formed by combining the insulator 602 with a miniaturized transistor.

In the case where a material containing hafnium oxide and zirconium oxide ($HfZrO_x$) is used as the insulator 602, a thermal ALD method is preferably used for the deposition.

Furthermore, in the case where the insulator 602 is deposited by a thermal ALD method, a material that does not contain hydrocarbon is suitably used as a precursor. When any one or both of hydrogen and carbon are contained in the insulator 602, crystallization of the insulator 602 is hindered in some cases. Therefore, as described above, the concentration of any one or both of hydrogen and carbon in the insulator 602 is preferably reduced by using a precursor not containing hydrocarbon. Examples of the precursor not containing hydrocarbon include chlorine-based materials. Note that in the case where a material containing hafnium oxide and zirconium oxide ($HfZrO_x$) is used as the insulator 602, $HfCl_4$ and/or $ZrCl_4$ is used as the precursor.

In the case where the insulator 602 is deposited by a thermal ALD method, $H_2O$ or $O_3$ can be used as an oxidizer. Note that as the oxidizer in the thermal ALD method, $O_3$ is more suitably used than $H_2O$ because it can reduce the hydrogen concentration in the film. However, the oxidizer in the thermal ALD method is not limited thereto. For example, the oxidizer in the thermal ALD method may contain any one or more selected from $O_2$, $O_3$, $N_2O$, $NO_2$, $H_2O$, and $H_2O_2$.

The conductor 613 can be provided using a material similar to those for the conductor 328 and the conductor 330, for example.

The conductor 613 can be deposited by an ALD method, a CVD method, or the like. For example, titanium nitride may be deposited by a thermal ALD method. Here, the conductor 613 is preferably deposited by a method in which deposition is performed while a substrate is heated, like a thermal ALD method. For example, deposition is performed at a substrate temperature of higher than or equal to room temperature, preferably higher than or equal to 300° C., further preferably higher than or equal to 325° C., still further preferably higher than or equal to 350° C. Furthermore, for example, deposition is performed at a substrate temperature of lower than or equal to 500° C., preferably lower than or equal to 450° C. For example, the substrate temperature is approximately 400° C.

When the conductor 613 is deposited within the above temperature range, the insulator 602 can have ferroelectricity even without a bake treatment at a high temperature (e.g., bake treatment with the heat treatment temperature of higher than or equal to 400° C. or higher than or equal to 500° C.) after the formation of the conductor 613. Furthermore, when the conductor 613 is deposited by an ALD method causing relatively less damage to a base as described above, the crystal structure of the insulator 602 is inhibited from being excessively destroyed; thus, the ferroelectricity of the insulator 602 can be increased.

In the case where the conductor 613 is deposited by a sputtering method, for example, a base film, i.e., the insulator 602 here might be damaged. For example, in the case where a material containing hafnium oxide and zirconium oxide ($HfZrO_X$) is used as the insulator 602 and the conductor 613 is deposited by a sputtering method, $HfZrO_X$ that is the base film might be damaged by the sputtering method and the crystal structure of $HfZrO_X$ (typically, a crystal structure such as an orthorhombic system) might be broken. There is a method in which heat treatment is performed after the sputtering method to recover the damage to the crystal structure of $HfZrO_X$; however, in some cases, the damage in $HfZrO_X$ deposited by the sputtering method, for example, a dangling bond (e.g., O*) in $HfZrO_X$, is bonded to hydrogen contained in $HfZrO_X$, which makes it impossible to recover the damage to the crystal structure of $HfZrO_X$.

Thus, a material that does not contain hydrogen or contains an extremely small amount of hydrogen is suitably used as $HfZrO_X$ used for the insulator 602. The use of the material that does not contain hydrogen or contains an extremely small amount of hydrogen for the insulator 602 can improve the crystallinity of the insulator 602, leading to a structure having a high ferroelectricity.

As described above, in one embodiment of the present invention, as the insulator 602, a ferroelectric material is deposited by a thermal ALD method using a precursor that does not contain hydrocarbon (typified by a chlorine-based precursor) and an oxidizer (typified by $O_3$), for example. After that, the conductor 613 is formed by a deposition performed by a thermal ALD method (typically, deposition at higher than or equal to 400° C.), whereby the crystallinity or ferroelectricity of the insulator 602 can be improved without annealing after the deposition, in other words, with the use of the temperature in the deposition of the conductor 613. Note that improving the crystallinity or ferroelectricity of the insulator 602 without annealing after the deposition of the conductor 613 and with the use of the temperature in the deposition of the conductor 613 is referred to as self-annealing, in some cases.

With the transistor structure in FIG. 19, a ferroelectric capacitor can be provided between the conductor 540b and the conductor 613 in the opening portion included in the region overlapping with the conductor 542b.

Note that the insulator 602 may have a stacked-layer structure of two or more layers.

The structures of the transistor and the ferroelectric capacitor illustrated in FIG. 19 can be applied to the transistor M1, the ferroelectric capacitor C1, and the like described in Embodiment 1, for example.

Figure 20A:
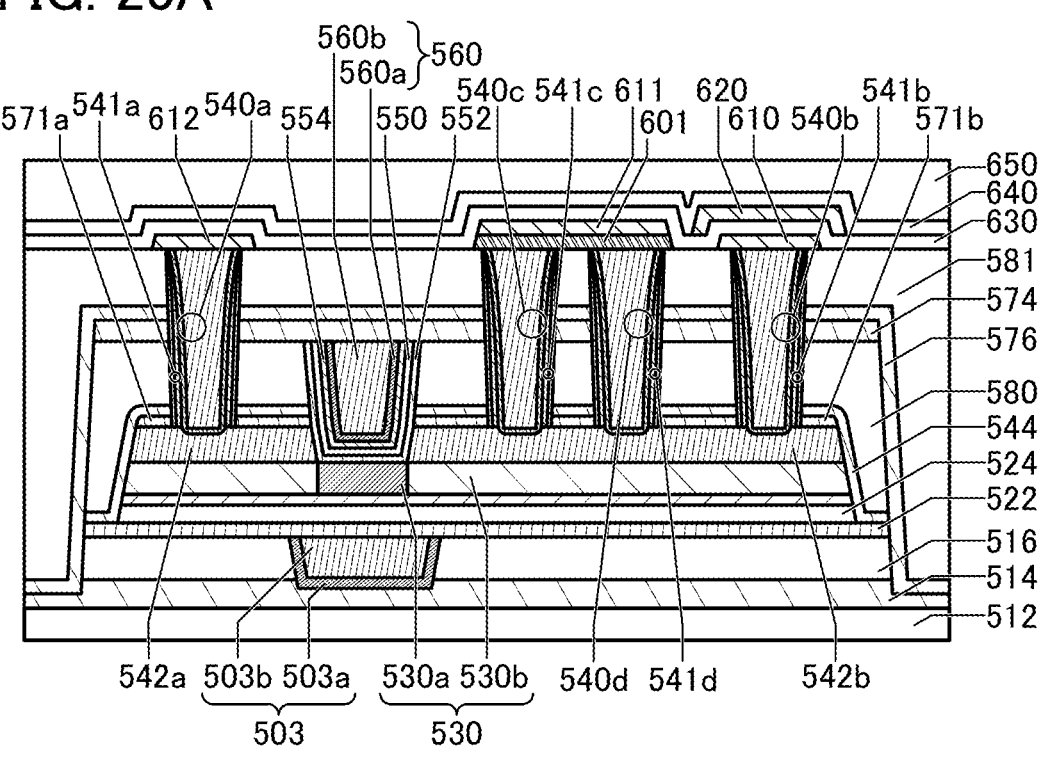
FIG. 20A and FIG. 20B are schematic cross-sectional views each illustrating a structure example of a transistor.

FIG. 20A illustrates a structure example of the transistor 500 and a capacitor which is provided with a dielectric that can have ferroelectricity around the transistor 500.

In the transistor illustrated in FIG. 20A, for example, a plurality of opening portions are formed in the insulator 544, the insulator 571b, the insulator 580, the insulator 574, the insulator 576, and the insulator 581 in a region overlapping with the conductor 542b. A conductor 540c functioning as a plug is provided inside one of the opening portions, and an insulator 541c is provided between a side surface of the opening portion and the conductor 540c, as an insulator having a barrier property against impurities. Furthermore, a conductor 540d functioning as a plug is provided inside another of the opening portions, and an insulator 541d is provided between a side surface of the opening portion and the conductor 540d, as an insulator having a barrier property against impurities. Note that the material applicable to the conductor 540a and the conductor 540b can be used for the conductor 540c and the conductor 540d, for example, and the material applicable to the insulator 541a and the insulator 541b can be used for the insulator 541c and the insulator 541d, for example.

An insulator 601 is provided on and in contact with the conductor 540c and the conductor 540d. For the insulator 601, a dielectric that can have ferroelectricity applicable to the insulator 602 in FIG. 19 can be used for example.

A conductor 611 is provided on and in contact with the insulator 601. The conductor 611 can be provided using a material similar to those for the conductor 328 and the conductor 330, for example.

Therefore, with the structure illustrated in FIG. 20A, a ferroelectric capacitor can be provided between the conductor 611 and each of the conductor 540c and the conductor 540d that function as plugs.

Note that the insulator 601 may have a stacked-layer structure of two or more layers.

Although two plugs (the conductor 540c and the conductor 540d) are in contact with the insulator 601 in FIG. 20A, one or three or more plugs may be in contact with the insulator 601. In other words, although FIG. 20A illustrates an example where, in a region overlapping with the insulator 601, two opening portions including conductors are provided as plugs, one or three or more opening portions may be provided in the region overlapping with the insulator 601.

Figure 20B:
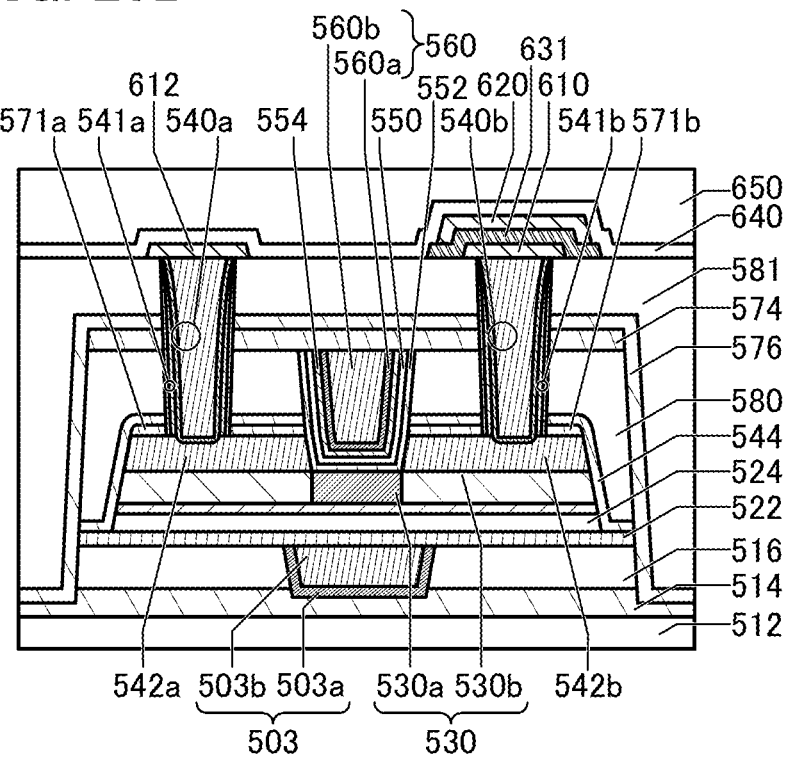

FIG. 20B illustrates a structure example of the transistor 500 and a capacitor which is provided with a dielectric that can have ferroelectricity around the transistor 500, which is different from the structure example in FIG. 20A.

In the transistor illustrated in FIG. 20B, an insulator 631 is provided on a top surface of the conductor 610 placed over the conductor 540b functioning as a plug and on a top surface of part of a region of the insulator 581. For the insulator 631, the dielectric that can have ferroelectricity applicable to the insulator 602 in FIG. 19 can be used, for example.

The conductor 620 is provided on a top surface of the insulator 631, and the insulator 640 and the insulator 650 are provided in this order on top surfaces of the insulator 581, the conductor 612, the conductor 620, and part of a region of the insulator 631.

Therefore, with the structure illustrated in FIG. 20B, a ferroelectric capacitor can be provided between the conductor 610 and the conductor 620.

Note that the insulator 631 may have a stacked-layer structure of two or more layers.

The structures of the transistors and the ferroelectric capacitors illustrated in FIG. 20A and FIG. 20B can be applied to the transistor M1, the ferroelectric capacitor C1, and the like described in Embodiment 1, for example.

When a semiconductor device using a transistor including an oxide semiconductor has the structure described in this embodiment, a change in electrical characteristics of the transistor can be inhibited and the reliability can be improved. Alternatively, a semiconductor device using a transistor including an oxide semiconductor can be miniaturized or highly integrated.

Note that this embodiment can be combined with the other embodiments described in this specification as appropriate.

Embodiment 3

Described in this embodiment is a metal oxide (hereinafter also referred to as an oxide semiconductor) that can be used in the OS transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of the crystal structures of oxide semiconductor will be explained with FIG. 21A. FIG. 21A is a diagram showing the classification of crystal structures of an oxide semiconductor, typically IGZO (a metal oxide containing In, Ga, and Zn).

As shown in FIG. 21A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite) (excluding single crystal and poly crystal). Note that the term "Crystalline" excludes single crystal, poly crystal, and completely amorphous. The term "Crystal" includes single crystal and poly crystal.

Note that the structures in the thick frame in FIG. 21A are in an intermediate state between "Amorphous" and "Crystal", and belong to a new boundary region (new crystalline phase). That is, these structures are completely different from "Amorphous", which is energetically unstable, and "Crystal".

Note that a crystal structure of a film or a substrate can be evaluated with an X-ray diffraction (XRD) spectrum. FIG. 21B shows an XRD spectrum, which is obtained by GIXD (Grazing-Incidence XRD) measurement, of a CAAC-IGZO film classified into "Crystalline" (the vertical axis represents intensity in arbitrary unit (a. u.)). Note that a GIXD method is also referred to as a thin film method or a Seemann-Bohlin method. The XRD spectrum that is shown in FIG. 21B and obtained by GIXD measurement is hereinafter simply referred to as an XRD spectrum. The CAAC-IGZO film in FIG. 21B has a composition in the vicinity of In:Ga:Zn=4:2:3 [atomic ratio]. The CAAC-IGZO film in FIG. 21B has a thickness of 500 nm.

As shown in FIG. 21B, a clear peak indicating crystallinity is detected in the XRD spectrum of the CAAC-IGZO film. Specifically, a peak indicating c-axis alignment is detected at $2\theta$ of around 31° in the XRD spectrum of the CAAC-IGZO film. As shown in FIG. 21B, the peak at $2\theta$ of around 31° is asymmetric with respect to the axis of the angle at which the peak intensity is detected.

A crystal structure of a film or a substrate can also be evaluated with a diffraction pattern observed by a nanobeam electron diffraction (NBED) method (such a pattern is also referred to as a nanobeam electron diffraction pattern). FIG. 21C shows a diffraction pattern of the CAAC-IGZO film. FIG. 21C shows a diffraction pattern observed by the NBED method in which an electron beam is incident in the direction parallel to the substrate. The composition of the CAAC-IGZO film in FIG. 21C is In:Ga:Zn=4:2:3 [atomic ratio] or the vicinity thereof. In the nanobeam electron diffraction method, electron diffraction is performed with a probe diameter of 1 nm.

As shown in FIG. 21C, a plurality of spots indicating c-axis alignment are observed in the diffraction pattern of the CAAC-IGZO film.

<<Structure of Oxide Semiconductor>>

Oxide semiconductors may be classified in a manner different from one shown in FIG. 21A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS and an amorphous oxide semiconductor by some analysis methods. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., greater than or equal to 1 nm and less than or equal to 30 nm).

[a-like OS]

The a-like OS is an oxide semiconductor having a structure between those of the nc-OS and the amorphous oxide semiconductor. The a-like OS contains a void or a low-density region. That is, the a-like OS has low crystallinity as compared with the nc-OS and the CAAC-OS. Moreover, the hydrogen concentration in the film of the a-like OS is higher than those of the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be rephrased with a region containing In as its main component. The second region can be rephrased with a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus also has a low density of trap states in some cases.

Electric charge captured by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

Note that this embodiment can be combined with the other embodiments described in this specification as appropriate.

Embodiment 4

In this embodiment, examples of a semiconductor wafer where the semiconductor device or the like described in the above embodiment is formed and electronic components incorporating the semiconductor device will be described.
<Semiconductor Wafer>

First, an example of a semiconductor wafer where a semiconductor device or the like is formed is described using FIG. 22A.

A semiconductor wafer 4800 illustrated in FIG. 22A includes a wafer 4801 and a plurality of circuit portions 4802 provided on a top surface of the wafer 4801. Note that a portion without the circuit portion 4802 on the top surface of the wafer 4801 is a spacing 4803 that is a region for dicing.

The semiconductor wafer 4800 can be manufactured by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as a next step. Dicing is performed along scribe lines SCL1 and scribe lines SCL2 (referred to as dicing lines or cutting lines in some cases) indicated by dashed-dotted lines. Note that to perform the dicing step easily, it is preferable that the spacing 4803 be provided so that the plurality of scribe lines SCL1 are parallel to each other, the plurality of scribe lines SCL2 are parallel to each other, and the scribe lines SCL1 are perpendicular to the scribe lines SCL2.

With the dicing step, a chip 4800a as illustrated in FIG. 22B can be cut out from the semiconductor wafer 4800. The chip 4800a includes a wafer 4801a, the circuit portion 4802, and a spacing 4803a. Note that it is preferable to make the spacing 4803a small as much as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate of one embodiment of the present invention is not limited to the shape of the semiconductor wafer 4800 illustrated in FIG. 22A. The element substrate may be a rectangular semiconductor wafer, for example. The shape of the element substrate can be changed as appropriate, depending on a manufacturing process of an element and an apparatus for manufacturing the element.
<Electronic Component>

FIG. 22C illustrates a perspective view of an electronic component 4700 and a substrate (a mounting board 4704) on which the electronic component 4700 is mounted. The electronic component 4700 illustrated in FIG. 22C includes a chip 4800a in a mold 4711. As the chip 4800a, the memory device or the like of one embodiment of the present invention can be used.

To illustrate the inside of the electronic component 4700, some portions are omitted in FIG. 22C. The electronic component 4700 includes a land 4712 outside the mold 4711. The land 4712 is electrically connected to an electrode pad 4713, and the electrode pad 4713 is electrically connected to the chip 4800a through a wire 4714. The electronic component 4700 is mounted on a printed circuit board 4702, for example. A plurality of such electronic components are combined and electrically connected to each other on the printed circuit board 4702, so that the mounting board 4704 is completed.

FIG. 22D illustrates a perspective view of an electronic component 4730. The electronic component 4730 is an example of a SiP (System in package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

Examples of the semiconductor device 4710 include the chip 4800a, the semiconductor device described in the above embodiment, and a high bandwidth memory (HBM). In addition, an integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings are provided in a single layer or multiple layers. In addition, the interposer 4731 has a function of electrically connecting an integrated circuit provided on the interposer 4731 to an electrode provided on the package substrate 4732. Accordingly, the interposer is referred to as a "redistribution substrate" or an "intermediate substrate" in some cases. Furthermore, a through electrode is provided in the interposer 4731 and the through electrode is used to electrically connect an integrated circuit and the package substrate 4732 in some cases. Moreover, in the case of using a silicon interposer, a TSV (Through Silicon Via) can also be used as the through electrode.

A silicon interposer is preferably used as the interposer 4731. The silicon interposer can be manufactured at lower cost than an integrated circuit because it is not necessary to provide an active element. Moreover, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In addition, in a SiP, an MCM, or the like using a silicon interposer, a decrease in reliability due to a difference in the coefficient of expansion between an integrated circuit and the interposer is less likely to occur. Furthermore, a surface of a silicon interposer has high planarity; thus, poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on the interposer.

In addition, a heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on a bottom portion of the package substrate 4732. FIG. 22D illustrates an example in which the electrode 4733 is formed of a solder ball. Solder balls are provided in a matrix on the bottom portion of the package substrate 4732, so that BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

The structure described in this embodiment can be combined with the structure described in the other embodiments as appropriate.

Embodiment 5

In this embodiment, application examples of a semiconductor device of one embodiment of the present invention will be described.

The semiconductor device of one embodiment of the present invention can be applied to, for example, memory devices of a variety of electronic devices (e.g., information terminals, computers, smartphones, e-book readers, digital still cameras, video cameras, video recording/reproducing devices, navigation systems, game machines, and the like). In addition, the semiconductor device can also be used for image sensors, IoT (Internet of Things), healthcare-related devices, and the like. Note that here, the computers refer not only to tablet computers, laptop computers, and desktop computers, but also to large computers such as server systems.

An example of an electronic device including a semiconductor device of one embodiment of the present invention is described. Note that FIG. 23A to FIG. 23J and FIG. 24A to FIG. 24E each illustrate a state where the electronic component 4700 or the electronic component 4730, each of which includes the semiconductor device, is included in an electronic device.

[Mobile Phone]

Figure 23A:
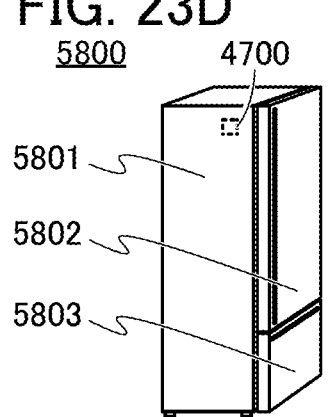
FIG. 23A to FIG. 23J are diagrams each illustrating an example of an electronic device.

An information terminal 5500 illustrated in FIG. 23A is a mobile phone (smartphone), which is a type of information terminal. The information terminal 5500 includes a housing 5510 and a display portion 5511, and as input interfaces, a touch panel is provided in the display portion 5511 and a button is provided in the housing 5510.

By applying the semiconductor device of one embodiment of the present invention to the information terminal 5500, the information terminal 5500 can retain a temporary file generated at the time of executing an application (e.g., a web browser's cache).

[Wearable Terminal]

Figure 23B:
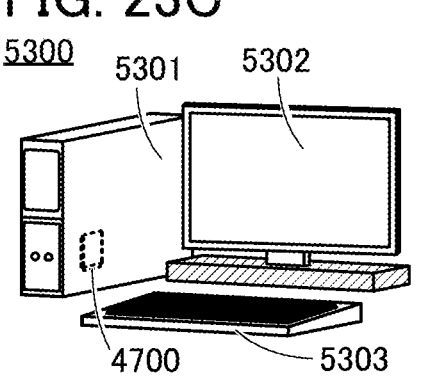

In addition, FIG. 23B illustrates an information terminal 5900 that is an example of a wearable terminal. The information terminal 5900 includes a housing 5901, a display portion 5902, an operation switch 5903, an operation switch 5904, a band 5905, and the like.

Like the information terminal 5500 described above, the wearable terminal can retain a temporary file generated at the time of executing an application by applying the semiconductor device of one embodiment of the present invention.

[Information Terminal]

Figure 23C:
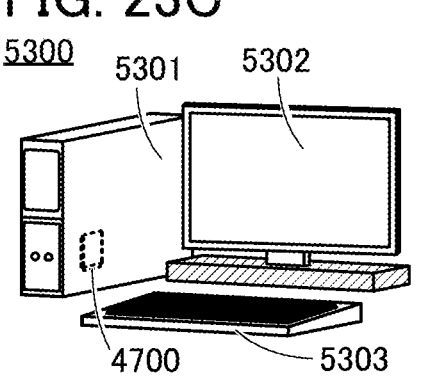

In addition, FIG. 23C illustrates a desktop information terminal 5300. The desktop information terminal 5300 includes a main body 5301 of the information terminal, a display portion 5302, and a keyboard 5303.

Like the information terminal 5500 described above, the desktop information terminal 5300 can retain a temporary file generated at the time of executing an application applying the semiconductor device of one embodiment of the present invention.

Note that although the smartphone, the wearable terminal, and the desktop information terminal are respectively illustrated in FIG. 23A to FIG. 23C as examples of the electronic device, one embodiment of the present invention can be applied to an information terminal other than a smartphone, a wearable terminal, and a desktop information terminal. Examples of information terminals other than a smartphone, a wearable terminal, and a desktop information terminal include a PDA (Personal Digital Assistant), a laptop information terminal, and a workstation.

[Household Appliance]

Figure 23D:
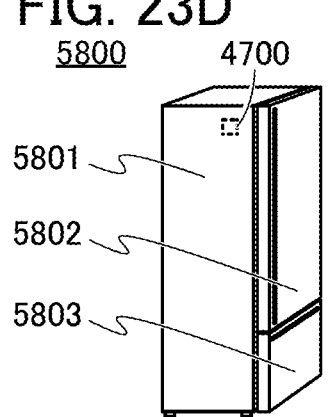

In addition, FIG. 23D illustrates an electric refrigerator-freezer 5800 as an example of a household appliance. The electric refrigerator-freezer 5800 includes a housing 5801, a refrigerator door 5802, a freezer door 5803, and the like. For example, the electric refrigerator-freezer 5800 is an electric refrigerator-freezer that is compatible with IoT (Internet of Things).

The semiconductor device of one embodiment of the present invention can be applied to the electric refrigerator-freezer 5800. The electric refrigerator-freezer 5800 can transmit and receive information on food stored in the electric refrigerator-freezer 5800 and food expiration dates, for example, to and from an information terminal or the like via the Internet. In the electric refrigerator-freezer 5800, the semiconductor device can retain a temporary file generated at the time of transmitting the information.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audiovisual appliance.

[Game Machine]

Figure 23E:
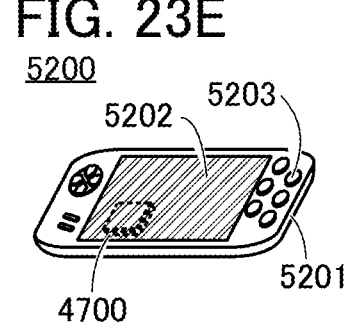

In addition, FIG. 23E illustrates a portable game machine 5200 as an example of a game machine. The portable game machine 5200 includes a housing 5201, a display portion 5202, a button 5203, and the like.

Figure 23F:
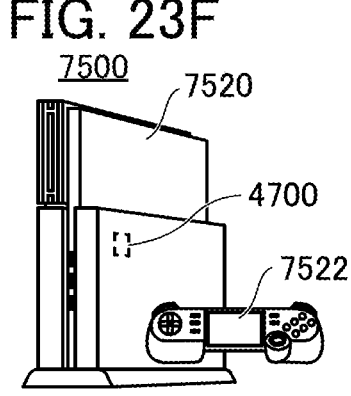

In addition, FIG. 23F illustrates a stationary game machine 7500 as another example of a game machine. The stationary game machine 7500 includes a main body 7520 and a controller 7522. Note that the controller 7522 can be connected to the main body 7520 with or without a wire. Furthermore, although not illustrated in FIG. 23F, the controller 7522 can include a display portion that displays a game image, and an input interface besides a button, such as a touch panel, a stick, a rotating knob, and a sliding knob, for example. Moreover, the shape of the controller 7522 is not limited to that illustrated in FIG. 23F, and the shape of the controller 7522 may be changed in various ways in accordance with the genres of games. For example, for a shooting game such as an FPS (First Person Shooter) game, a gun-shaped controller having a trigger button can be used. As another example, for a music game or the like, a controller having a shape of a musical instrument, audio equipment, or the like can be used. Furthermore, the stationary game machine may include a camera, a depth sensor, a microphone, and the like so that the game player can play a game using a gesture and/or a voice instead of a controller.

In addition, images displayed on the game machine can be output with a display device such as a television device, a personal computer display, a game display, or a head-mounted display.

The semiconductor device described in the above embodiment is employed for the portable game machine 5200 or the stationary game machine 7500, so that the portable game machine 5200 with low power consumption or the stationary game machine 7500 with low power consumption can be achieved. Moreover, heat generation from a circuit can be reduced owing to low power consumption; thus, the influence of heat generation on the circuit itself, a peripheral circuit, and a module can be reduced.

Moreover, the semiconductor device described in the above embodiment is employed for the portable game machine 5200 or the stationary game machine 7500, so that it is possible to retain a temporary file necessary for arithmetic operation that occurs during game play.

As an example of a game machine, FIG. 23E illustrates a portable game machine. In addition, FIG. 23F illustrates a home-use stationary game machine. Note that an electronic device of one embodiment of the present invention is not limited thereto. Examples of the electronic device of one embodiment of the present invention include an arcade game machine installed in entertainment facilities (a game center, an amusement park, and the like), a throwing machine for batting practice installed in sports facilities, and the like.

[Moving Vehicle]

The semiconductor device described in the above embodiment can be employed for an automobile, which is a moving vehicle, and around the driver's seat in an automobile.

Figure 23G:
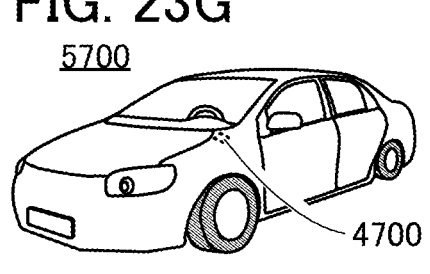

FIG. 23G illustrates an automobile 5700 as an example of a moving vehicle.

An instrument panel that provides various kinds of information by displaying a speedometer, a tachometer, a mileage, a fuel meter, a gearshift state, air-conditioning settings, and the like is provided around the driver's seat in the automobile 5700. In addition, a display device showing the above information may be provided around the driver's seat.

In particular, the display device can compensate for the view obstructed by a pillar or the like, blind areas for the driver's seat, and the like by displaying an image taken by an imaging device (not illustrated) provided for the automobile 5700, which can increase safety. That is, display of an image from an imaging device provided on the outside of the automobile 5700 can fill in blind areas and increase safety.

The semiconductor device described in the above embodiment can temporarily retain data. Thus, the semiconductor device can be used to retain temporary data necessary in an automatic driving system for the automobile 5700 or a system for navigation and risk prediction, for example. The display device may be configured to display temporary information regarding navigation, risk prediction, or the like. Moreover, the semiconductor device may be configured to retain an image of a driving recorder provided in the automobile 5700.

Note that although an automobile is described above as an example of a moving vehicle, the moving vehicle is not limited to an automobile. Examples of moving vehicles include a train, a monorail train, a ship, and a flying object (a helicopter, an unmanned aircraft (a drone), an airplane, and a rocket).

[Camera]

The semiconductor device described in the above embodiment can be employed for a camera.

Figure 23H:
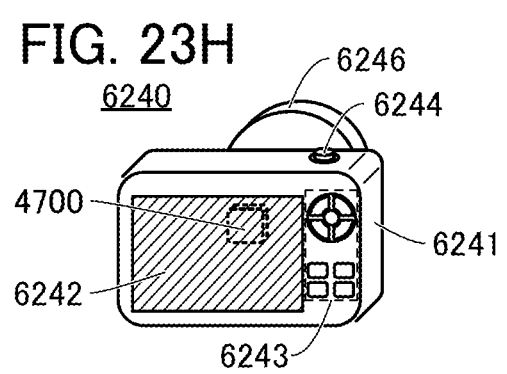

FIG. 23H illustrates a digital camera 6240 as an example of an imaging device. The digital camera 6240 includes a housing 6241, a display portion 6242, operation switches 6243, a shutter button 6244, and the like, and a detachable lens 6246 is attached to the digital camera 6240. Note that here, although the digital camera 6240 is configured such that the lens 6246 is detachable from the housing 6241 for replacement, the lens 6246 may be integrated with the housing 6241. In addition, the digital camera 6240 can be additionally equipped with a stroboscope, a viewfinder, or the like.

When the semiconductor device described in the above embodiment is employed for the digital camera 6240, the digital camera 6240 with low power consumption can be achieved. Moreover, heat generation from a circuit can be reduced owing to low power consumption; thus, the influence of heat generation on the circuit itself, a peripheral circuit, and a module can be reduced.

[Video Camera]

The semiconductor device described in the above embodiment can be employed for a video camera.

Figure 23I:
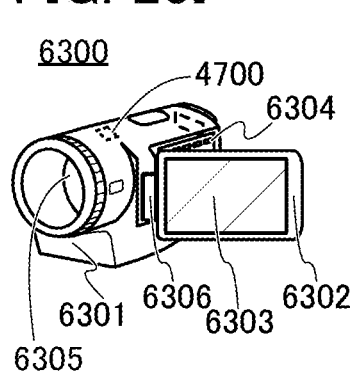

FIG. 23I illustrates a video camera 6300 as an example of an imaging device. The video camera 6300 includes a first housing 6301, a second housing 6302, a display portion 6303, operation switches 6304, a lens 6305, a joint 6306, and the like. The operation switches 6304 and the lens 6305 are provided in the first housing 6301, and the display portion 6303 is provided in the second housing 6302. The first housing 6301 and the second housing 6302 are connected to each other with the joint 6306, and an angle between the first housing 6301 and the second housing 6302 can be changed with the joint 6306. Images displayed on the display portion 6303 may be changed in accordance with the angle at the joint 6306 between the first housing 6301 and the second housing 6302.

When images taken by the video camera 6300 are recorded, the images need to be encoded in accordance with a data recording format. With the use of the above semiconductor device, the video camera 6300 can retain a temporary file generated in encoding.

[ICD]

The semiconductor device described in the above embodiment can be employed for an implantable cardioverter-defibrillator (ICD).

Figure 23J:
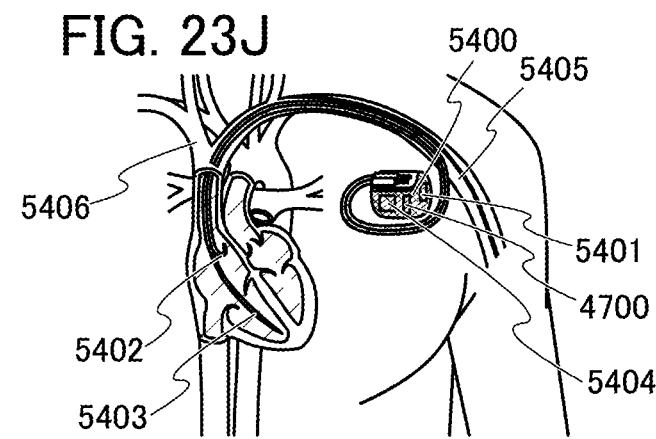

FIG. 23J is a schematic cross-sectional view illustrating an example of an ICD. An ICD main unit 5400 includes at least a battery 5401, the electronic component 4700, a regulator, a control circuit, an antenna 5404, a wire 5402 reaching a right atrium, and a wire 5403 reaching a right ventricle.

The ICD main unit 5400 is implanted in the body by surgery, and the two wires pass through a subclavian vein 5405 and a superior vena cava 5406 of the human body, with an end of one of the wires placed in the right ventricle and an end of the other wire placed in the right atrium.

The ICD main unit 5400 functions as a pacemaker and paces the heart when the heart rate is not within a predetermined range. In addition, when the heart rate is not recovered by pacing and ventricular tachycardia, ventricular fibrillation, or the like keeps occurring, treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In addition, in the ICD main unit 5400, data on the heart rate obtained by the sensor or the like, the number of times the treatment with pacing is performed, and the time taken for the treatment, for example, can be stored in the electronic component 4700.

In addition, the antenna 5404 can receive electric power, and the battery 5401 is charged with the electric power. Furthermore, when the ICD main unit 5400 includes a plurality of batteries, safety can be increased. Specifically, even when one of the batteries in the ICD main unit 5400 is dead, the other batteries can function properly; thus, the batteries also function as an auxiliary power source.

In addition to the antenna 5404 capable of receiving electric power, an antenna that can transmit physiological signals may be included to construct, for example, a system that monitors cardiac activity by checking physiological signals such as a pulse, a respiratory rate, a heart rate, and body temperature with an external monitoring device.

[Expansion Device for PC]

The semiconductor device described in the above embodiment can be employed for a calculator such as a PC (Personal Computer) and an expansion device for an information terminal.

Figure 24A:
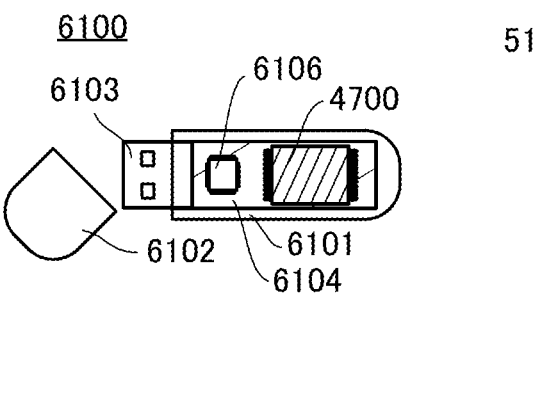
FIG. 24A to FIG. 24E are diagrams each illustrating an example of an electronic device.

FIG. 24A illustrates, as an example of the expansion device, a portable expansion device 6100 that includes a chip capable of holding information and is externally provided on a PC. The expansion device 6100 can store information using the chip when connected to a PC with a USB (Universal Serial Bus) or the like, for example. Note that FIG. 24A illustrates the portable expansion device 6100; however, the expansion device of one embodiment of the present invention is not limited thereto and may be a comparatively large expansion device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the semiconductor device or the like described in the above embodiment. For example, the substrate 6104 is provided with the electronic component 4700 and a controller chip 6106. The USB connector 6103 functions as an interface for connection to an external device.

[SD Card]

The semiconductor device described in the above embodiment can be employed for an SD card that can be attached to an electronic device such as an information terminal or a digital camera.

Figure 24B:
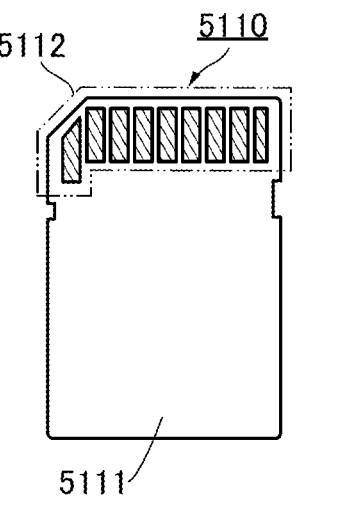
Figure 24C:
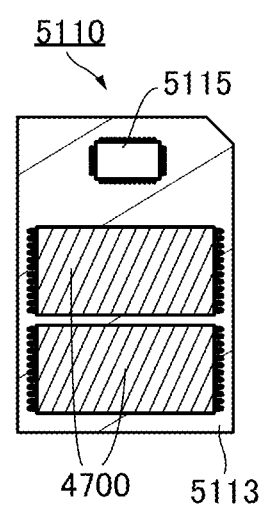

FIG. 24B is a schematic external view of an SD card, and FIG. 24C is a schematic view of the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a semiconductor device and a circuit for driving the semiconductor device. For example, electronic components 4700 and a controller chip 5115 are attached to the substrate 5113. Note that the circuit structures of the electronic components 4700 and the controller chip 5115 are not limited to those described above, and can be changed as appropriate according to circumstances. For example, a write circuit, a row driver, a read circuit, and the like that are provided in an electronic component may be incorporated into the controller chip 5115 instead of the electronic component 4700.

When the electronic components 4700 are provided also on a rear surface side of the substrate 5113, the capacitance of the SD card 5110 can be increased. In addition, a wireless chip with a wireless communication function may be provided on the substrate 5113. This allows wireless communication between an external device and the SD card 5110 and enables data reading and writing from and to the electronic components 4700.

[SSD]

The semiconductor device described in the above embodiment can be employed for an SSD (Solid State Drive) that can be attached to an electronic device such as an information terminal.

Figure 24D:
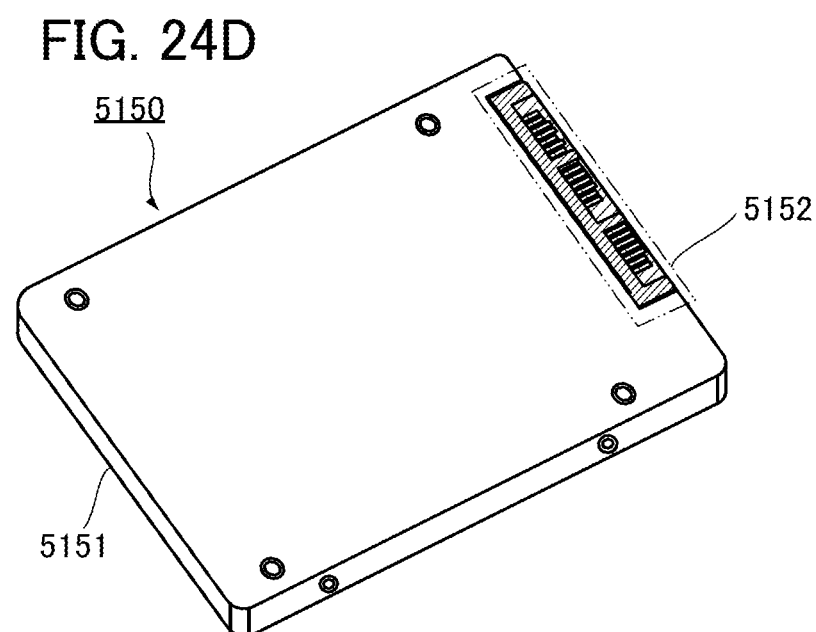
Figure 24E:
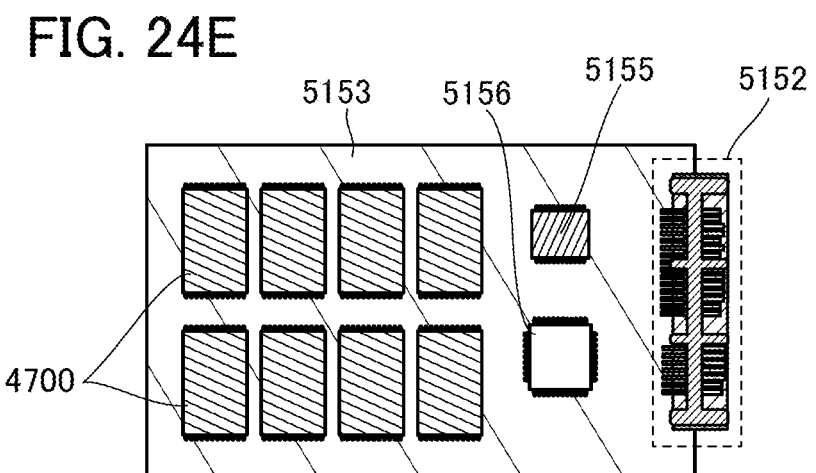

FIG. 24D is a schematic external view of an SSD, and FIG. 24E is a schematic view of the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a semiconductor device and a circuit for driving the semiconductor device. For example, the electronic components 4700, a memory chip 5155, and a controller chip 5156 are attached to the substrate 5153. When the electronic components 4700 are also provided on a rear surface side of the substrate 5153, the capacity of the SSD 5150 can be increased. A work memory is incorporated in the memory chip 5155. For example, a DRAM chip can be used as the memory chip 5155. A processor, an ECC circuit, and the like are incorporated in the controller chip 5156. Note that the circuit structures of the electronic components 4700, the memory chip 5155, and the controller chip 5115 are not limited to those described above, and the circuit structures can be changed as appropriate according to circumstances. For example, a memory functioning as a work memory may also be provided in the controller chip 5156.

[Computer]

Figure 25A:
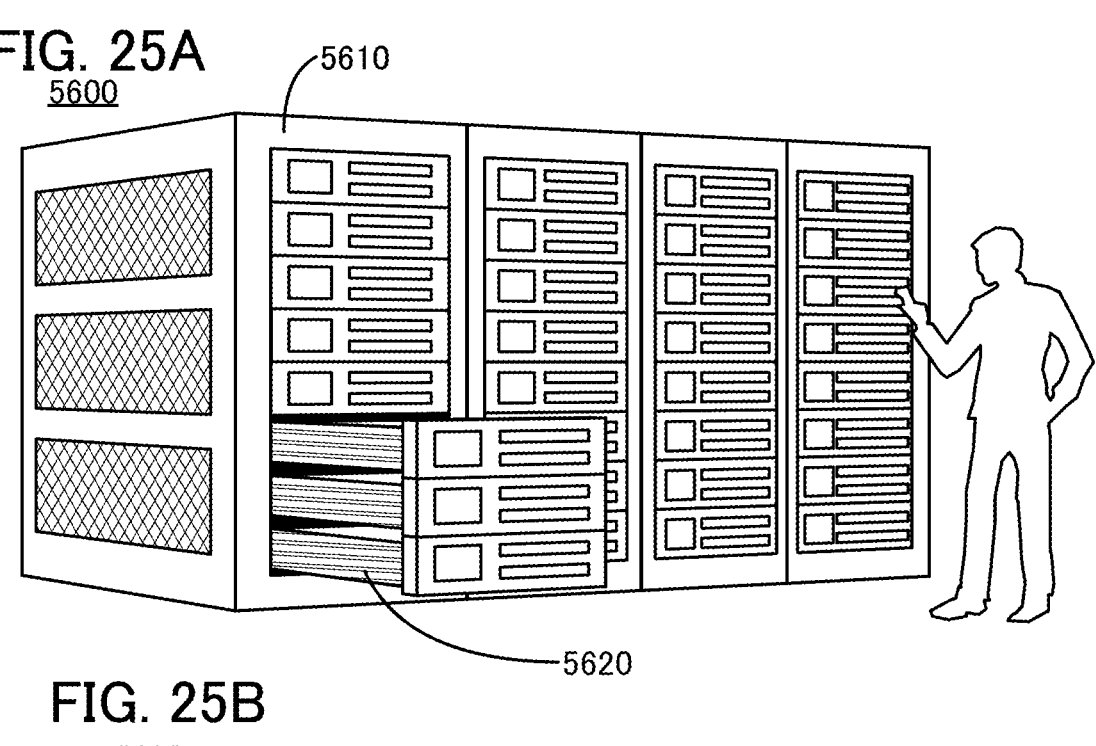
FIG. 25A to FIG. 25C are diagrams each illustrating an example of an electronic device.

A computer 5600 illustrated in FIG. 25A is an example of a large computer. In the computer 5600, a plurality of rack mount computers 5620 are stored in a rack 5610.

Figure 25B:
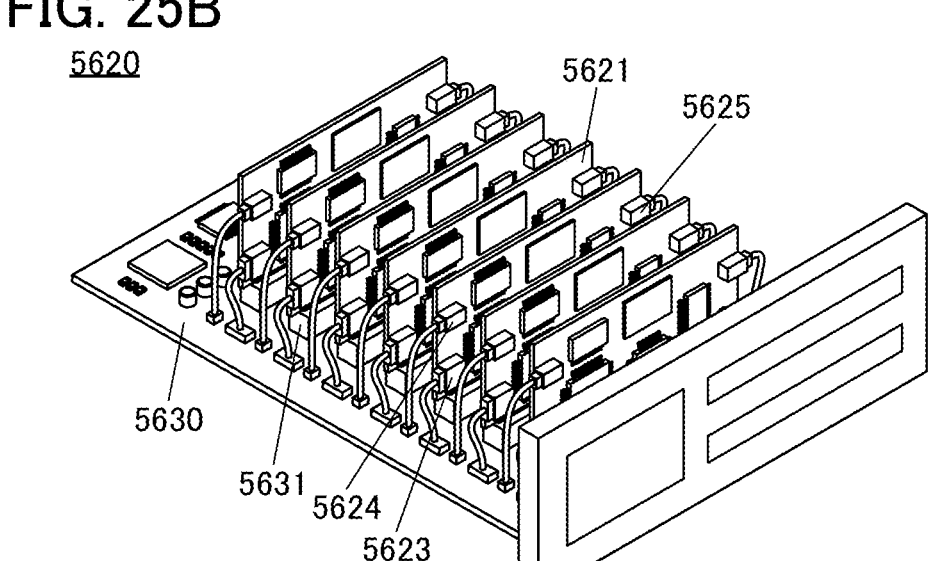

The computer 5620 can have a structure in a perspective view illustrated in FIG. 25B, for example. In FIG. 25B, the computer 5620 includes a motherboard 5630, and the motherboard 5630 includes a plurality of slots 5631 and a plurality of connection terminals. A PC card 5621 is inserted in the slot 5631. In addition, the PC card 5621 includes a connection terminal 5623, a connection terminal 5624, and a connection terminal 5625, each of which is connected to the motherboard 5630.

Figure 25C:
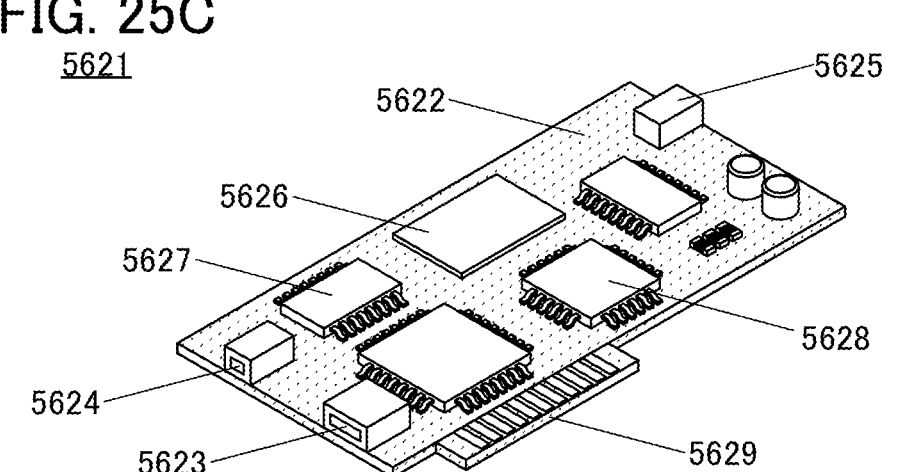

The PC card 5621 illustrated in FIG. 25C is an example of a processing board provided with a CPU, a GPU, a semiconductor device, and the like. The PC card 5621 includes a board 5622. In addition, the board 5622 includes a connection terminal 5623, a connection terminal 5624, a connection terminal 5625, a semiconductor device 5626, a semiconductor device 5627, a semiconductor device 5628, and a connection terminal 5629. Note that FIG. 25C also illustrates semiconductor devices other than the semiconductor device 5626, the semiconductor device 5627, and the semiconductor device 5628, the following description of the semiconductor device 5626, the semiconductor device 5627, and the semiconductor device 5628 is referred to for these semiconductor devices.

The connection terminal 5629 has a shape with which the connection terminal 5629 can be inserted in the slot 5631 of the motherboard 5630, and the connection terminal 5629 functions as an interface for connecting the PC card 5621 and the motherboard 5630. An example of the standard for the connection terminal 5629 is PCIe or the like.

The connection terminal 5623, the connection terminal 5624, and the connection terminal 5625 can serve as, for example, an interface for performing power supply, signal input, or the like to the PC card 5621. As another example, they can serve as an interface for outputting a signal calculated by the PC card 5621. Examples of the standard for each of the connection terminal 5623, the connection terminal 5624, and the connection terminal 5625 include USB (Universal Serial Bus), SATA (Serial ATA), SCSI (Small Computer System Interface), and the like. In the case where video signals are output from the connection terminal 5623, the connection terminal 5624, and the connection terminal 5625, an example of the standard therefor is HDMI (registered trademark) or the like.

The semiconductor device 5626 includes a terminal (not illustrated) for inputting and outputting signals, and when the terminal is inserted in a socket (not illustrated) of the board 5622, the semiconductor device 5626 and the board 5622 can be electrically connected to each other.

The semiconductor device 5627 includes a plurality of terminals, and when the terminals are reflow-soldered, for example, to wirings of the board 5622, the semiconductor device 5627 and the board 5622 can be electrically connected to each other. Examples of the semiconductor device 5627 include an FPGA (Field Programmable Gate Array), a GPU, a CPU, and the like. As the semiconductor device 5627, the electronic component 4730 can be used, for example.

The semiconductor device 5628 includes a plurality of terminals, and when the terminals are reflow-soldered, for example, to wirings of the board 5622, the semiconductor device 5628 and the board 5622 can be electrically connected to each other. An example of the semiconductor device 5628 is a semiconductor device or the like. As the semiconductor device 5628, the electronic component 4700 can be used, for example.

The computer 5600 can also function as a parallel computer. When the computer 5600 is used as a parallel computer, large-scale computation necessary for artificial intelligence learning and inference can be performed, for example.

When the semiconductor device of one embodiment of the present invention is used in a variety of electronic devices or the like described above, power consumption of the electronic device can be reduced.

The structure described in this embodiment can be combined with the structure described in the other embodiments as appropriate.

Example 1

Hereinafter, the evaluation results indicating that reading operation can be performed a plurality of times without data write-back operation performed by voltage application to the ferroelectric capacitor C1 in the memory cell MC2 described with reference to FIG. 11 in Embodiment 1 are described.

Figure 26A:
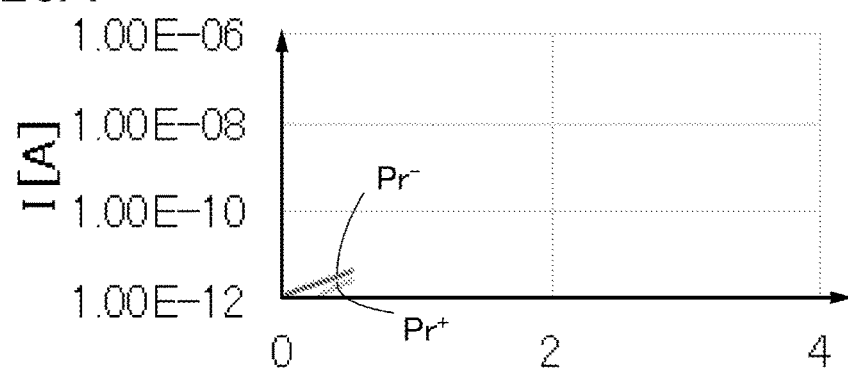
FIG. 26A to FIG. 26D are diagrams each showing a measurement data set.

In FIG. 26A to FIG. 26D, it was confirmed that, in the memory cell MC2, the potential of the node SN was changed by application of voltage for the reading operation to the wiring PL and the amount of current flowing through the transistor M2 was changed. In FIG. 26A, the horizontal axis represents the change in voltage of the wiring PL (Vc) from 0 V to 0.5 V and the vertical axis represents the amount of current (I) flowing through the transistor M2. FIG. 26A is a graph showing comparison of the current change with respect to the voltage change between the case where a ferroelectric in the ferroelectric capacitor C1 is polarized to the state "0" (Pr⁻) and the case where the ferroelectric is polarized to the state "1" (Pr⁺).

In FIG. 26A, the horizontal axis represents the change in voltage of the wiring PL (Vc) from 0 V to 0.5 V and the vertical axis represents the amount of current (I) flowing through the transistor M2. FIG. 26A is the graph showing comparison of the current change with respect to the voltage change between the case where the ferroelectric in the ferroelectric capacitor C1 is polarized to the state "0" (Pr⁻) and the case where the ferroelectric is polarized to the state "1" (Pr⁺).

Figure 26B:
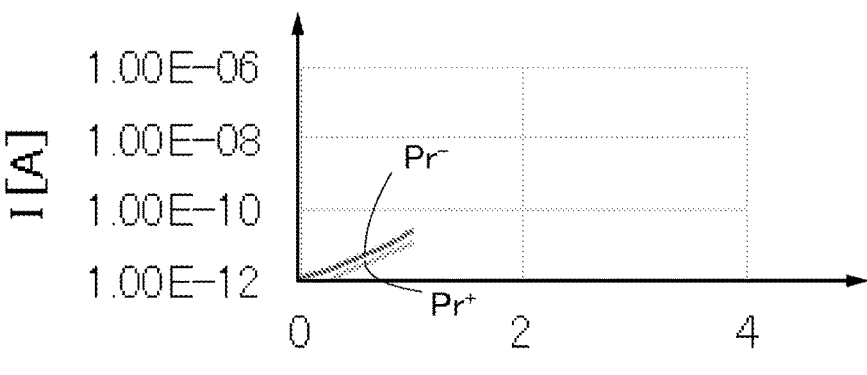

In FIG. 26B, the horizontal axis represents the change in voltage of the wiring PL (Vc) from 0 V to 1.0 V and the vertical axis represents the amount of current (I) flowing through the transistor M2. FIG. 26B is a graph showing comparison of the current change with respect to the voltage change between the case where the ferroelectric in the ferroelectric capacitor C1 is polarized to the state "0" (Pr⁻) and the case where the ferroelectric is polarized to the state "1" (Pr⁺) after the reading operation in FIG. 26A.

Figure 26C:
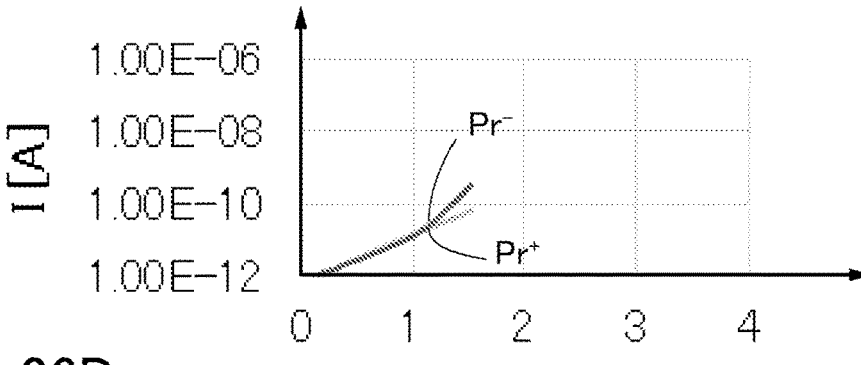

In FIG. 26C, the horizontal axis represents the change in voltage of the wiring PL (Vc) from 0 V to 1.5 V and the vertical axis represents the amount of current (I) flowing through the transistor M2. FIG. 26C is a graph showing comparison of the current change with respect to the voltage change between the case where the ferroelectric in the ferroelectric capacitor C1 is polarized to the state "0" (Pr⁻) and the case where the ferroelectric is polarized to the state "1" (Pr⁺) after the reading operation in FIG. 26B.

Figure 26D:
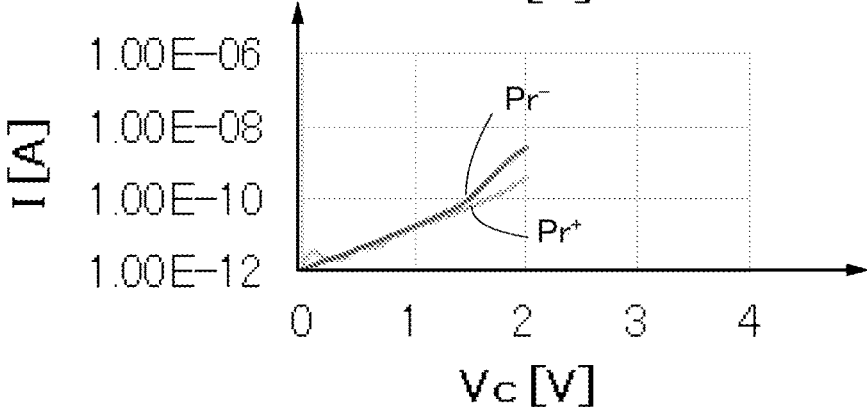

In FIG. 26D, the horizontal axis represents the change in voltage of the wiring PL (Vc) from 0 V to 2.0 V and the vertical axis represents the amount of current (I) flowing through the transistor M2. FIG. 26D is a graph showing comparison of the current change with respect to the voltage change between the case where the ferroelectric in the ferroelectric capacitor C1 is polarized to the state "0" (Pr⁻) and the case where the ferroelectric is polarized to the state "1" (Pr⁺) after the reading operation in FIG. 26C.

In FIG. 26A and FIG. 26B, a difference in reading current was not observed even when the voltage of the wiring PL was changed. On the other hand, in FIG. 26C, a difference in reading current was observed in accordance with the difference in polarization when the voltage of the wiring PL was changed. Next, in FIG. 26D, the difference in reading current was not observed until when the voltage of the wiring PL was changed to 1.5 V because the polarization was broken in the reading operation in FIG. 26C; however, the difference in reading current was observed in accordance with the difference in polarization when the voltage was changed from 1.5 V to 2.0 V.

From the above results, a difference in current corresponding to the difference in polarization was observed through the reading operation performed a plurality of times.

Example 2

Hereinafter, analysis results of the relationship between the channel area of the transistor M1 and a withstand voltage of the transistor in the memory cell MC described with reference to FIG. 1A or the like in Embodiment 1 will be described. Note that the channel area is an area based on the product of the channel length (L) and the channel width (W).

Figure 27A:
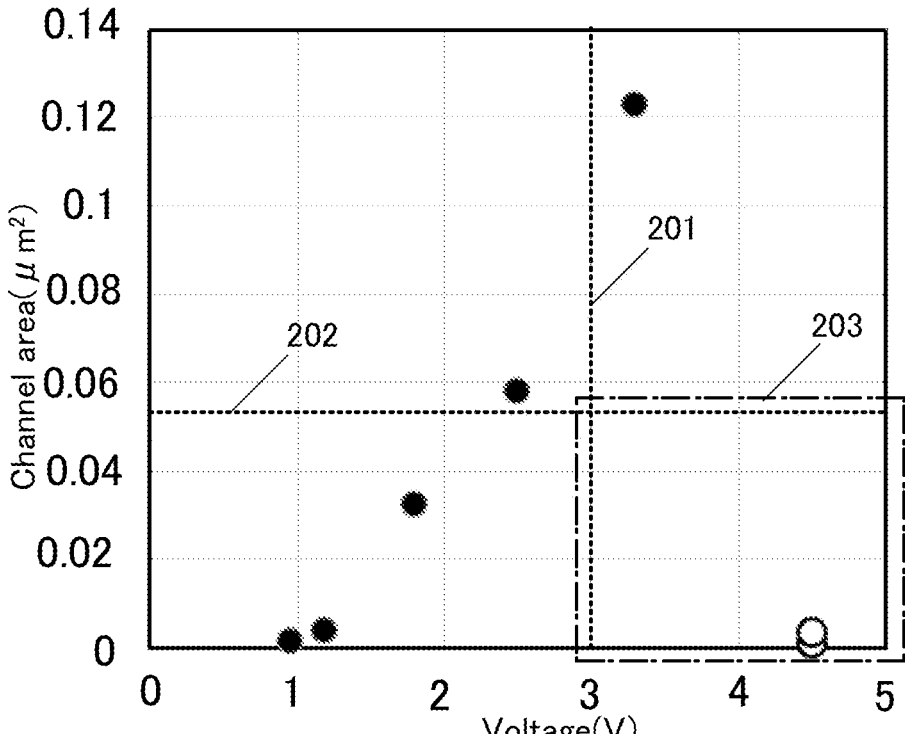
FIG. 27A and FIG. 27B are graphs each showing a configuration example of a semiconductor device.

A graph shown in FIG. 27A is created on the basis of a graph indicating the relationship between the channel area and the voltage shown in Non-Patent Document 3 above. Note that the channel area is estimated assuming that the channel length (L) and the channel width (W) are equivalent to each other. For example, a channel area of 0.01 $\mu m^2$ corresponds to a channel length of 100 nm. Black circles in FIG. 27A correspond to a withstand voltage of a Si transistor. In addition, white circles correspond to a withstand voltage of an OS transistor.

The withstand voltage of the Si transistor decreases as the miniaturization owing to a reduction in the channel area proceeds. In the case where $HfZrO_X$ (HZO) is used as the material of the ferroelectric layer in the ferroelectric capacitor C1, approximately 3 V is needed as a voltage for rewriting data when the polarization of HZO ($2P_r$) at an electric field of 0 is 40 $\mu C/cm^2$. Thus, the transistor is required to have a withstand voltage of 3 V (a dotted line 201 in the figure) or higher.

In the case where the area of HZO is set to smaller or equal to 0.05 $\mu m^2$ to reduce the area of the ferroelectric capacitor C1, the channel area of the transistor is also preferably set to 0.05 $\mu m^2$ (a dotted line 202 in the figure). However, the withstand voltage of the Si transistor is lower than or equal to 3 V in the case where the channel area is set to 0.05 $\mu m^2$; therefore, it is difficult to apply, to the ferroelectric capacitor C1, voltage higher than or equal to 3 V for rewriting data.

On the other hand, the withstand voltage of the OS transistor is higher than that of the Si transistor even when the miniaturization owing to the reduction in the channel area proceeds. In FIG. 27A, transistors with channel lengths (L) of 30 nm and 60 nm are indicated as examples, and the withstand voltages of both the transistors can be higher than or equal to 3 V. In addition, channel lengths (L) of 30 nm and 60 nm are converted into channel areas of 0.0009 $\mu m^2$ and 0.0036 $\mu m^2$, respectively, which means that the area of HZO is 0.05 $\mu m^2$ or smaller, whereby the requirement that enables high integration and miniaturization can be satisfied. In other words, the OS transistor can be located in a region 203 which satisfies the miniaturization of the area of HZO and higher withstand voltage of the transistor. The OS transistor can satisfy both conditions of the high withstand voltage and the miniaturization.

Figure 27B:
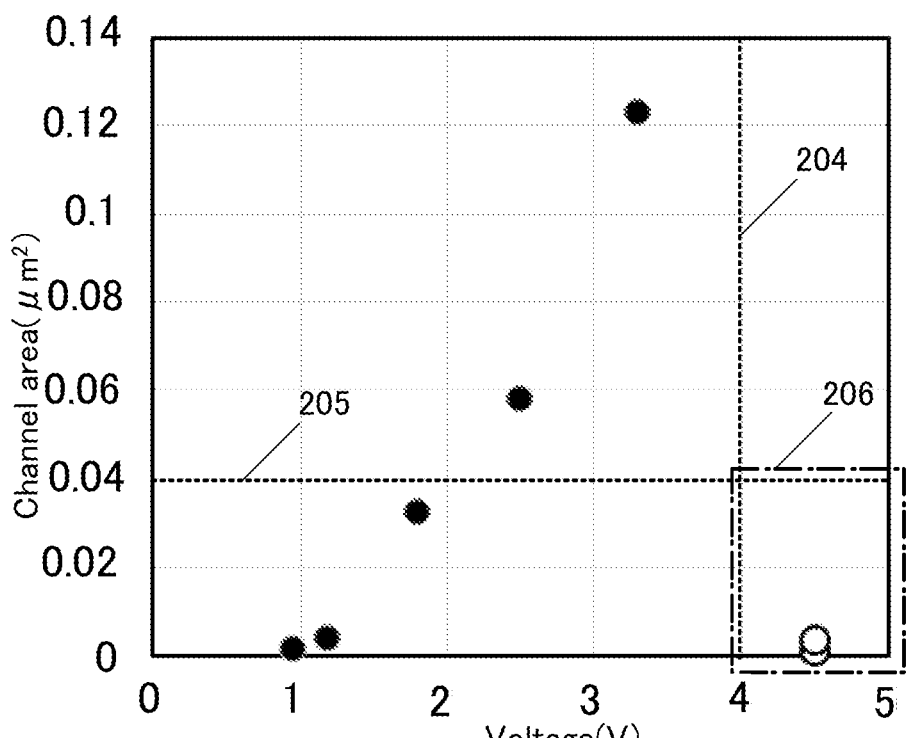

Similarly, FIG. 27B is a graph showing a relationship between the channel area and the voltage in the case where the polarization of HZO ($2P_r$) at an electric field of 0 is 50 $\mu C/cm^2$. In the case where the polarization of HZO is 50 $\mu C/cm^2$, 4 V (a dotted line 204 in the figure) is needed as a voltage for driving HZO, and the area of HZO should be set to smaller or equal to 0.04 $\mu m^2$ (a dotted line 205 in the figure) to reduce the area of the ferroelectric capacitor C1.

The OS transistor can satisfy both the conditions of the high withstand voltage and the miniaturization also under conditions in FIG. 27B.

Figure 28:
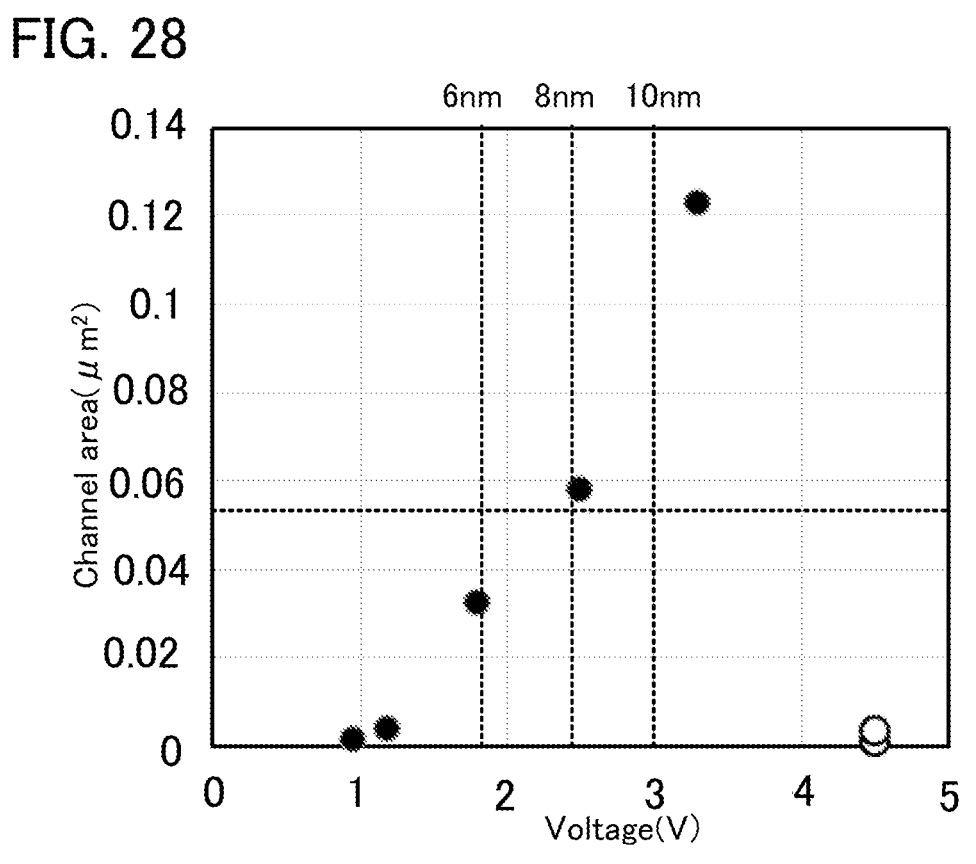

A graph shown in FIG. 28 is obtained by superimposing, on the graph shown in FIG. 27A, a graph showing the voltage required for rewriting data at the time when the withstand voltage of HZO is 3 MV/cm and the thicknesses of HZO are 10 nm, 8 nm, and 6 nm. A combination of the OS transistor having excellent withstand voltage with HZO having a standard thickness of approximately 10 nm is effective, which is also effective in increasing the degree of integration of the transistors and the ferroelectric capacitors.
(Notes on Description of this Specification and the Like)

The description of the above embodiments and each structure in the embodiments are noted below.

One embodiment of the present invention can be constituted by combining, as appropriate, the structure described in each embodiment with the structures described in the other embodiments. In addition, in the case where a plurality of structure examples are described in one embodiment, the structure examples can be combined as appropriate.

Note that content (or part of the content) described in one embodiment can be applied to, combined with, or replaced with another content (or part of the content) described in the embodiment and/or content (or part of the content) described in another embodiment or other embodiments.

Note that in each embodiment, content described in the embodiment is content described using a variety of diagrams or content described with text disclosed in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

In addition, in this specification and the like, components are classified on the basis of the functions, and shown as blocks independent of one another in block diagrams. However, in an actual circuit or the like, it is difficult to separate components on the basis of the functions, and there may be a case where one circuit is associated with a plurality of functions or a case where a plurality of circuits are associated with one function. Therefore, blocks in the block diagrams are not limited by the components described in the specification, and the description can be changed appropriately depending on the situation.

In the drawings, the size, the layer thickness, or the region is shown with given magnitude for description convenience. Therefore, they are not limited to the illustrated scale. Note that the drawings are schematically shown for clarity, and embodiments of the present invention are not limited to shapes, values, or the like shown in the drawings. For example, variations in signal, voltage, or current due to noise, variations in signal, voltage, or current due to difference in timing, or the like can be included.

In this specification and the like, expressions "one of a source and a drain" (or a first electrode or a first terminal) and "the other of the source and the drain" (or a second electrode or a second terminal) for the other of the source and the drain are used in the description of the connection relation of a transistor. This is because the source and the drain of the transistor change depending on the structure, operating conditions, or the like of the transistor. Note that the source or the drain of the transistor can also be referred to as a source (drain) terminal, a source (drain) electrode, or the like as appropriate depending on the situation.

In addition, in this specification and the like, the term "electrode" or "wiring" does not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, voltage and potential can be replaced with each other as appropriate. The voltage refers to a potential difference from a reference potential, and when the reference potential is a ground voltage, for example, the voltage can be rephrased into the potential. The ground potential does not necessarily mean 0 V. Note that potentials are relative, and the potential supplied to a wiring or the like is changed depending on the reference potential, in some cases.

Note that in this specification and the like, the terms "film", "layer", and the like can be interchanged with each other depending on the case or according to circumstances. For example, the term "conductive layer" can be changed into the term "conductive film" in some cases. As another example, the term "insulating film" can be changed into the term "insulating layer" in some cases.

In this specification and the like, a switch has a function of controlling whether current flows or not by being in a conduction state (an on state) or a non-conduction state (an off state). Alternatively, a switch has a function of selecting and changing a current path.

In this specification and the like, channel length refers to, for example, the distance between a source and a drain in a region where a semiconductor (or a portion where current flows in a semiconductor when a transistor is in an on state) and a gate overlap with each other or a region where a channel is formed in a top view of the transistor.

In this specification and the like, channel width refers to, for example, the length of a portion where a source and a drain face each other in a region where a semiconductor (or a portion where current flows in a semiconductor when a transistor is in an on state) and a gate electrode overlap with each other or a region where a channel is formed.

In this specification and the like, the expression "A and B are connected" includes the case where A and B are electrically connected as well as the case where A and B are directly connected. Here, the expression "A and B are electrically connected" means the case where electrical signals can be transmitted and received between A and B when an object having any electric action exists between A and B.

REFERENCE NUMERALS

BL: wiring, FE: ferroelectric layer, LE: electrode, MC: memory cell, M1: transistor, PL: wiring, UE: electrode, WL: wiring This application is based on Japanese Patent Application Serial No. 2020-176315 filed on Oct. 20, 2020, the entire contents are hereby incorporated herein by reference.

The invention claimed is:

1. A driving method of a semiconductor device comprising a memory cell comprising a capacitor comprising a ferroelectric layer between a first electrode and a second electrode, comprising the steps of:

reading data from the capacitor in the memory cell by applying a first voltage that does not cause polarization inversion of the ferroelectric layer to the capacitor in a first reading operation; and reading the data from the capacitor in the memory cell by applying a second voltage that does not cause polarization inversion of the ferroelectric layer to the capacitor in a second reading operation, wherein the second voltage is higher than the first voltage, and wherein a data write-back operation to the capacitor is not performed between the first reading operation and the second reading operation.

2. The driving method of the semiconductor device according to claim 1, wherein the memory cell includes a transistor, wherein a first read voltage which is read to a bit line through the transistor in the first reading operation is compared with a first reference voltage, wherein a second read voltage which is read to the bit line through the transistor in the second reading operation is compared with a second reference voltage, and wherein the second reference voltage is higher than the first reference voltage.

3. The driving method of the semiconductor device according to claim 1, comprising a reference memory cell, wherein a first read voltage which is read to a bit line in the first reading operation and a second read voltage which is read to the bit line in the second reading operation are compared with a read voltage which is read from the reference memory cell.

4. The driving method of the semiconductor device according to claim 2, wherein the transistor includes an oxide semiconductor in its channel.

5. The driving method of the semiconductor device according to claim 1, wherein the ferroelectric layer includes hafnium zirconium oxide or a metal nitride belonging to Group 13 to Group 15.

6. A driving method of a semiconductor device comprising a memory cell comprising a capacitor comprising a ferroelectric layer between a first electrode and a second electrode, comprising the steps of:

reading data from the capacitor in the memory cell by applying a first voltage that does not cause polarization inversion of the ferroelectric layer to the capacitor in a first reading operation; and reading the data from the capacitor in the memory cell by applying a second voltage that does not cause polarization inversion of the ferroelectric layer to the capacitor in a second reading operation, wherein the second voltage is higher than the first voltage, wherein the first voltage is higher than a voltage that sets polarization of the ferroelectric layer to 0, and wherein a data write-back operation to the capacitor is not performed between the first reading operation and the second reading operation.

7. The driving method of the semiconductor device according to claim 2, wherein the memory cell includes a transistor, wherein a first read voltage which is read to a bit line through the transistor in the first reading operation is compared with a first reference voltage, wherein a second read voltage which is read to the bit line through the transistor in the second reading operation is compared with a second reference voltage, and wherein the second reference voltage is higher than the first reference voltage.

8. The driving method of the semiconductor device according to claim 6, comprising a reference memory cell, wherein a first read voltage which is read to a bit line in the first reading operation and a second read voltage which is read to the bit line in the second reading operation are compared with a read voltage which is read from the reference memory cell.

9. The driving method of the semiconductor device according to claim 8, wherein the transistor includes an oxide semiconductor in its channel.

10. The driving method of the semiconductor device according to claim 6, 69
70 wherein the ferroelectric layer includes hafnium zirco-
nium oxide or a metal nitride belonging to Group 13 to
Group 15.

11. A semiconductor device comprising:

a memory cell comprising:

a capacitor comprising a ferroelectric layer between a
first electrode and a second electrode; and a transistor, wherein one of a source and a drain of the transistor is
electrically connected to one of the first electrode and
the second electrode of the capacitor, wherein data is read from the capacitor in a first reading
operation, wherein the data is read from the capacitor in a second
reading operation, and wherein a data write-back operation to the capacitor is not
performed between the first reading operation and the
second reading operation.

\* \* \* \* \*